US012631964B2

(12) United States Patent
Tokunaga et al.

(10) Patent No.: US 12,631,964 B2
(45) Date of Patent: May 19, 2026

(54) RESIST UNDERLAYER FILM-FORMING COMPOSITION

(71) Applicant: NISSAN CHEMICAL CORPORATION, Tokyo (JP)

(72) Inventors: Hikaru Tokunaga, Toyama (JP); Hiroto Ogata, Toyama (JP); Tomotada Hirohara, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 601 days.

(21) Appl. No.: 17/437,783

(22) PCT Filed: Mar. 12, 2020

(86) PCT No.: PCT/JP2020/010686

§ 371 (c)(1),
(2) Date: Sep. 13, 2021

(87) PCT Pub. No.: WO2020/184642

PCT Pub. Date: Sep. 17, 2020

(65) Prior Publication Data

US 2022/0155686 A1 May 19, 2022

(30) Foreign Application Priority Data

Mar. 13, 2019 (JP) ................................ 2019-045939
Jul. 12, 2019 (JP) ................................ 2019-129814

(51) Int. Cl.

| | |
|---|---|
| ***G03F 7/11*** | (2006.01) |
| ***G03F 7/004*** | (2006.01) |
| ***G03F 7/039*** | (2006.01) |
| ***G03F 7/20*** | (2006.01) |
| ***G03F 7/38*** | (2006.01) |
| *G03F 7/26* | (2006.01) |

(52) U.S. Cl.

CPC .......... *G03F 7/0392* (2013.01); *G03F 7/0045* (2013.01); *G03F 7/2004* (2013.01); *G03F 7/38* (2013.01); *G03F 7/11* (2013.01); *G03F 7/26* (2013.01)

(58) Field of Classification Search

CPC .... G03F 7/0392; G03F 7/0045; G03F 7/2004; G03F 7/38; G03F 7/26; G03F 7/11; G03F 7/094; G03F 7/40; G03F 7/0397; G03F 7/091

See application file for complete search history.

(56) References Cited

U.S. PATENT DOCUMENTS

| | | | | |
|---|---|---|---|---|
| 4,640,849 | A | 2/1987 | Woods et al. | |
| 4,789,704 | A | 12/1988 | Stenzenberger et al. | |
| 6,020,508 | A | 2/2000 | Nikolic et al. | |
| 7,060,425 | B1 | 6/2006 | Jeganathan et al. | |
| 2007/0148586 | A1 | 6/2007 | Uh et al. | |
| 2007/0275325 | A1* | 11/2007 | Hatakeyama ......... | G03F 7/0397 430/270.1 |
| 2015/0184018 | A1* | 7/2015 | Endo ....................... | G03F 7/038 524/594 |
| 2015/0185613 | A1* | 7/2015 | Toyokawa ................ | G03F 7/40 438/704 |
| 2015/0212418 | A1 | 7/2015 | Nishimaki et al. | |

FOREIGN PATENT DOCUMENTS

| | | | |
|---|---|---|---|
| EP | 0230741 | A2 | 8/1987 |
| JP | S62-201916 | A | 9/1987 |
| JP | H01-210454 | A | 8/1989 |
| JP | H01-221343 | A | 9/1989 |
| JP | 2000-095773 | A | 4/2000 |
| JP | 2002-528748 | A | 9/2002 |
| JP | 2006-259249 | A | 9/2006 |
| JP | 2007-178974 | A | 7/2007 |
| JP | 2007-316282 | A | 12/2007 |
| JP | 2010-528334 | A | 8/2010 |
| JP | 2021-015205 | A | 2/2021 |
| KR | 2011-0120845 | A | 11/2011 |

(Continued)

OTHER PUBLICATIONS

Angew. Chem. Int. Ed. 2016, 55, 8324; Xiangbing Zeng; Published: Jul. 8, 2016 (Year: 2016).*
English translation of WO 2015/046009 A1; Tajiri Yusuke; Published: Apr. 2, 2015 (Year: 2015).*
Mar. 7, 2023 Office Action Issued in Japanese Patent Application No. 2019-129814.
May 26, 2020 International Search Report issued in International Patent Application No. PCT/JP2020/010686.
Aug. 25, 2021 International Preliminary Report on Patentability issued in International Patent Application No. PCT/JP2020/010686.
Xi et al., "Synthesis and self-assembly of poly(hydroquinone ether) containing propanetriol units," Chinese Journal of Applied Chemistry, vol. 25, No. 7, Jul. 2008, pp. 768-772.
Pala et al., New phenyl ethers. I. Synthesis and pharmacology of α-glyceryl ethers of methylenediphenols, Farmaco, Edizione Scientifica, vol. 18, No. 9, 1963, pp. 619-642.

(Continued)

*Primary Examiner* — Mark F. Huff
*Assistant Examiner* — Richard David Champion
(74) *Attorney, Agent, or Firm* — Oliff PLC

(57) ABSTRACT

A composition for forming a resist underlayer film includes: (A) a cross-linking compound that is represented by formula (I); and (D) a solvent. [In formula (I), m is an integer from 1 to 30, T is a single bond, a saturated hydrocarbon group, an aromatic group, or an unsaturated cyclic hydrocarbon group, $G^1$, $G^2$, $G^3$, $G^4$, $G^5$, and $G^6$ are each independently (i) or (ii), the n's are each independently an integer from 1 to 8, the n R's are each independently a hydrogen atom, an aliphatic hydrocarbon group, or an alicyclic hydrocarbon group, the A's are each independently an aryl group that may be interrupted by an alkylene group, and $Z^1$, $Z^2$, $Z^3$, $Z^4$, $Z^5$, and $Z^6$ are each independently an alkyl group, an aryl group, a hydroxy group, an epoxy group, or a hydrogen atom.]

10 Claims, No Drawings

(56) References Cited

FOREIGN PATENT DOCUMENTS

| | | | | |
|---|---|---|---|---|
| WO | 2008/142546 | A2 | 11/2008 | |
| WO | 2014/024836 | A1 | 2/2014 | |
| WO | 2014/038680 | A1 | 3/2014 | |
| WO | WO-2015046009 | A1 * | 4/2015 | ....... G02F 1/133528 |

OTHER PUBLICATIONS

Prehm et al., "Axial-New Modes of 2D, 3D, and Helical Columnar Self Assembly in Liquid Crystalline Phases of Bolaamphiphiles with Swallow Tail Lateral Chains," Journal of the American Chemical Society, vol. 133, No. 13, 2011, pp. 4906-4916.

Aug. 13, 2024 Office Action issued in Japanese Patent Application No. 2023-126971.

Mar. 11, 2025 Office Action issued in Japanese Patent Application No. 2023-126971.

* cited by examiner

RESIST UNDERLAYER FILM-FORMING COMPOSITION

TECHNICAL FIELD

The present invention relates to a resist underlayer film-forming composition suitable for lithography in semiconductor substrate processing, a resist underlayer film obtained from the resist underlayer film-forming composition, a method of manufacturing a patterned substrate using the resist underlayer film-forming composition, and a method of manufacturing a semiconductor device.

BACKGROUND ART

Conventionally, in manufacturing of a semiconductor device, fine processing by lithography using a photoresist composition has been performed. The fine processing is a processing method of forming a thin film of a photoresist composition on a substrate to be processed such as a silicon wafer, irradiating the thin film with active rays such as ultraviolet rays through a mask pattern in which a pattern of a semiconductor device is formed, developing the thin film, and etching the substrate to be processed such as a silicon wafer using the obtained photoresist pattern as a protective film. In recent years, in accordance with high integration of a semiconductor device, the active rays to be used tend to have a shorter wavelength from a KrF excimer laser (248 nm) to an ArF excimer laser (193 nm). In addition, in order to achieve further fine processing, a lithography technique using extreme ultraviolet rays (EUV, 13.5 nm) or electron beams (EB) as the active rays has been developed.

It is known that in a lithography process, when a resist layer formed on a substrate is exposed to an ultraviolet laser such as a KrF excimer laser or an ArF excimer laser, a resist pattern having a desired shape is not formed due to the influence of a standing wave generated caused by the reflection of the ultraviolet laser on a surface of the substrate. In order to solve the problem, it is adopted to provide a resist underlayer film (anti-reflective film) between the substrate and the resist layer.

The resist underlayer film formed between the photoresist and the substrate to be processed is generally formed as a thermally curable crosslinking film that does not generate mixing with the resist by performing a baking process after the application of a resist underlayer film onto the substrate to be processed in order to suppress mixing with the resist stacked as an upper layer.

It is known that various resins are used as a composition for forming a resist underlayer film. For example, Patent Literatures 1 and 2 disclose a photoresist underlayer film forming material containing a resin having a repeating unit obtained by converting a compound having a bisphenol group into novolac. In addition, Patent Literature 3 discloses a spin-coatable anti-reflective film composition containing a polymer having three or more fused aromatic rings in a main chain of the polymer.

In a case where a substrate to be processed used as a base has steps or in a case where a pattern-dense portion and a pattern-free region exist on the same wafer, it is required to perform planarization of the film surface by the underlayer film. A resin suitable for such a purpose has been proposed (Patent Literature 4).

On the other hand, in order to form such a thermally curable film, a crosslinkable compound (a crosslinking agent) and a catalyst (a crosslinking catalyst) for promoting crosslinking reaction are blended with the resist underlayer film-forming composition in addition to a polymer resin as a main component. Regarding the problem of the planarization of the film surface by the underlayer film, examination of these components has been still insufficient.

CITATION LIST

Patent Literature

Patent Literature 1: JP 2006-259249 A
Patent Literature 2: JP 2007-316282 A
Patent Literature 3: JP 2010-528334 A
Patent Literature 4: WO 2014/024836 A1

SUMMARY OF INVENTION

Technical Problem

An object of the present invention is to provide a composition for forming a resist underlayer film that is insoluble in a resist solvent, has an excellent optical constant, and has a high etching rate, the composition having excellent embeddability and planarity in a stepped substrate.

Solution to Problem

The present invention encompasses the followings.

[1] A resist underlayer film-forming composition containing a crosslinkable compound (A) represented by the following formula (I) and a solvent (D), Formula (I)

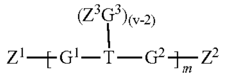

wherein, m is an integer of 1 to 30, v is the valence of T, when m=1,

T is a single bond; a divalent to hexavalent saturated hydrocarbon group which may be interrupted by an aromatic ring; or a divalent to hexavalent aromatic or unsaturated cyclic hydrocarbon group which may be interrupted by an oxygen atom, a carbonyl group, or an alkylene group and may be substituted with an alkyl group or an alkenyl group;

each of $G^1$ and $G^2$, and each $G^3$ present, is independently (i)

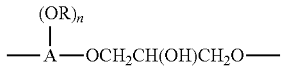

or (ii)

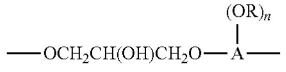

each of n is independently an integer of 1 to 8, each of n quantity of R is independently a hydrogen atom; a saturated or unsaturated and linear or branched aliphatic hydrocarbon group which may be substituted with a phenyl group, a naphthyl group, or an anthracenyl group and may be interrupted by an oxygen atom, a nitrogen atom, or a carbonyl group; or an alicyclic hydrocarbon group;

each of A is independently a $C_6$-$C_{18}$ aryl group which may be interrupted by an alkylene group, each of $Z^1$ and $Z^2$, and each $Z^3$ present, independently represents an alkyl group which may be interrupted by an oxygen atom, a nitrogen atom, or a carbonyl group; or an aryl group which may be interrupted by an oxygen atom, a nitrogen atom, or a carbonyl group and may be substituted with a hydroxy group, a halogen atom, a carboxyl group, a nitro group, a cyano group, a methylenedioxy group, an acetoxy group, a methylthio group, an amino group, a $C_1$-$C_9$ alkoxy group, an alkyl group, an alkenyl group, or an alkynyl group; and when m>1, each of m quantity of T is a single bond; a divalent saturated hydrocarbon group which may be interrupted by an aromatic ring; or a divalent aromatic or unsaturated cyclic hydrocarbon group which may be interrupted by an oxygen atom, a carbonyl group, or an alkylene group and may be substituted with an alkyl group or an alkenyl group;

v is 2 and $G^3Z^3$ is absent, each of m quantity of $G^1$ and $G^2$ is independently (i)

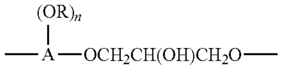

or (ii)

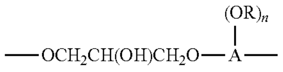

n, R, and A are as defined above, and each of $Z^1$ and $Z^2$ independently represents a hydroxy group, an epoxy group, or a hydrogen atom.

[2] The resist underlayer film-forming composition according to [1], wherein each of A is independently a $C_6$ aryl group which may be interrupted by an alkylene group.

[3] The resist underlayer film-forming composition according to [1] or [2], further comprising a film material (B) capable of crosslinking reaction with the crosslinkable compound (A).

[4] The resist underlayer film-forming composition according to [3], wherein the film material (B) capable of crosslinking reaction includes at least one member selected from the group consisting of a resin containing an aliphatic ring, a novolac resin, a polyether resin, a polyester resin, an acrylic resin, a methacrylic resin, and a compound different from the crosslinkable compound (A).

[5] The resist underlayer film-forming composition according to [4], wherein the novolac resin is represented by one or two or more repeating structural units represented by the following formulas (1a), (1b), and (1c):

(1a)

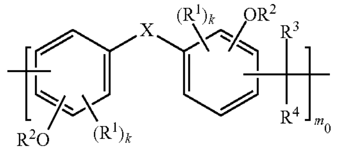

-continued (1b)

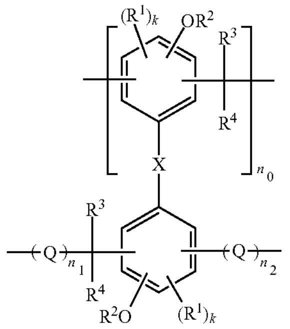

(1c)

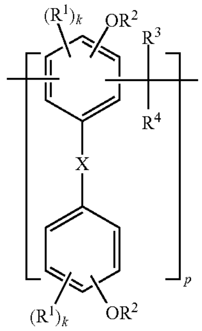

wherein, two $R^1$s each independently represent an alkyl group having 1 to 10 carbon atoms, an alkenyl group having 2 to 6 carbon atoms, an aromatic hydrocarbon group, a halogen atom, a nitro group, or an amino group; two $R^2$s each independently represent a hydrogen atom, an alkyl group having 1 to 10 carbon atoms, an alkenyl group having 2 to 6 carbon atoms, an acetal group, an acyl group, or a glycidyl group; $R^3$ represents an aromatic hydrocarbon group which may have a substituent; $R^4$ represents a hydrogen atom, a phenyl group, or a naphthyl group; when $R^3$ and $R^4$ bonded to the same carbon atom each represent a phenyl group, $R^3$ and $R^4$ may be bonded to each other to form a fluorene ring;

and in formula (1b), groups represented by two $R^1$s and atoms or groups represented by two $R^4$s may be different from each other; two ks each independently represent 0 or 1; $m_0$ represents an integer of 3 to 500; each of $n_0$, $n_1$, and $n_2$ represents an integer of 2 to 500; p represents an integer of 3 to 500; X represents a single bond or a heteroatom; and two Qs each independently represent a structural unit represented by the following formula (2):

(2)

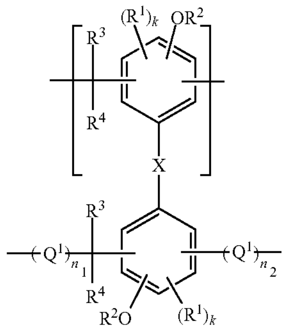

wherein, two $R^1$s, two $R^2$s, two $R^3$s, two $R^4$s, two ks, $n_1$, $n_2$, and X are as defined in formula (1b); and two Q's each independently represent a structural unit represented by formula (2).

[6] The resist underlayer film-forming composition according to [4], wherein the compound different from the crosslinkable compound (A) is represented by $$Ar—Q—Ar$$

wherein, two Ars each independently represent an aryl group; the aryl group has at least one hydroxy group as a substituent; and Q represents a divalent linking group having at least one benzene ring or naphthalene ring, a methylene group, or a single bond.

[7] The resist underlayer film-forming composition according to [1] or [2], further comprising an acid catalyst (C).

[8] The resist underlayer film-forming composition according to any one of [3] to [6], further comprising an acid catalyst (C).

[9] The resist underlayer film-forming composition according to [8], wherein the crosslinkable compound (A) is represented by the following formula (3), $$T\text{-}V_i \qquad \text{Formula (3)}$$

wherein,

V is represented by $$—\underset{}{\overset{(OR)_n}{\overset{|}{A}}}—OCH_2CH(OH)CH_2O—Z \quad \text{or} \qquad (i)$$

$$—OCH_2CH(OH)CH_2O—\overset{(OR)_n}{\overset{|}{A}}—Z \qquad (ii)$$

i is an integer of 2 to 6, each of i quantity of R is independently a hydrogen atom; or an alkyl group which may be interrupted by an oxygen atom, a nitrogen atom, or a carbonyl group;

each of i quantity of n is independently an integer of 1 to 8, each of i quantity of A is independently a $C_6$-$C_{18}$ aryl group which may be interrupted by an alkylene group, each of i quantity of Z is independently an alkyl group which may be interrupted by an oxygen atom, a nitrogen atom, or a carbonyl group; or an aryl group which may be interrupted by an oxygen atom, a nitrogen atom, or a carbonyl group and may be substituted with a hydroxy group, a halogen atom, a carboxyl group, a nitro group, a cyano group, a methylenedioxy group, an acetoxy group, a methylthio group, an amino group, a $C_1$-$C_9$ alkoxy group, an alkyl group, an alkenyl group, or an alkynyl group; and T is a single bond; an i-valent saturated hydrocarbon group which may be interrupted by an aromatic ring; or an i-valent aromatic group which may be interrupted by an oxygen atom or an alkylene group and may be substituted with an alkyl group or an alkenyl group.

[10] The resist underlayer film-forming composition according to [9], wherein Zs are each independently an aryl group which may be interrupted by an alkyl group, an oxygen atom, a nitrogen atom, or a carbonyl group and may be substituted with a hydroxy group, a halogen atom, a carboxyl group, a nitro group, a cyano group, a methylenedioxy group, an acetoxy group, a methylthio group, an amino group, a $C_1$-$C_9$ alkoxy group, an alkyl group, an alkenyl group, or an alkynyl group.

[11] A resist underlayer film, which is a cured product of a coating film formed of the resist underlayer film-forming composition according to any one of [1] to [10].

[12] A method of manufacturing a patterned substrate, comprising:

applying and curing the resist underlayer film-forming composition according to any one of [1] to [10] on a semiconductor substrate to form a resist underlayer film;

applying and baking a resist on the resist underlayer film to form a resist film;

exposing the resist underlayer film and the semiconductor substrate coated with the resist; and developing the exposed resist film to perform patterning.

[13] The method of manufacturing a patterned substrate according to [12], wherein the curing is performed by baking.

[14] The method of manufacturing a patterned substrate according to [12], wherein the curing is performed by baking followed by irradiation with ultraviolet rays.

[15] A method of manufacturing a semiconductor device, comprising:

forming a resist underlayer film using the resist underlayer film-forming composition according to any one of [1] to [10] on a semiconductor substrate;

forming a resist film on the resist underlayer film;

forming a resist pattern by irradiation with light or an electron beam and development;

etching the underlayer film through the resist pattern; and processing the semiconductor substrate using the patterned underlayer film.

[16] A compound represented by the following formula (II), $$Z^1\text{—}\left[G^1—T—G^2\right]_m\text{—}Z^2 \qquad \text{Formula (II)}$$

wherein, m is an integer of 1 to 30, each of m quantity of T is a single bond; a divalent saturated hydrocarbon group which may be interrupted by an aromatic ring; or a divalent aromatic or unsaturated cyclic hydrocarbon group which may be interrupted by an oxygen atom, a carbonyl group, or an alkylene group and may be substituted with an alkyl group or an alkenyl group;

each of m quantity of $G^1$ and $G^2$ is independently $$—\overset{(OR)_n}{\overset{|}{A}}—OCH_2CH(OH)CH_2O— \quad \text{or} \qquad (i)$$

$$—OCH_2CH(OH)CH_2O—\overset{(OR)_n}{\overset{|}{A}}— \qquad (ii)$$

each of n is independently an integer of 1 to 8, each of n quantity of R is independently a saturated or unsaturated and linear or branched aliphatic hydrocarbon group which may be substituted with a hydrogen atom, a phenyl group, a naphthyl group, or an anthracenyl group and may be interrupted by an oxygen atom, a nitrogen atom, or a carbonyl group; or an alicyclic hydrocarbon group, each of A is independently a $C_6$-$C_{18}$ aryl group which may be interrupted by an alkylene group, and each of $Z^1$ and $Z^2$ is independently a hydroxy group, an epoxy group, or a hydrogen atom.

[17] A compound represented by each of the following formulas (1-21) to (1-25),

Formula (1-21)

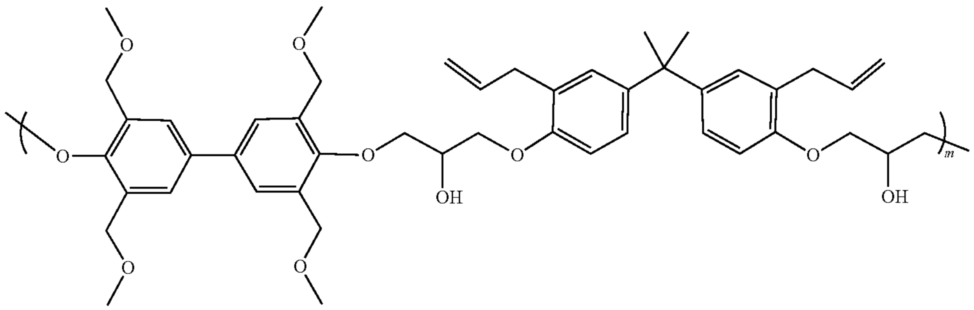

Formula (1-22)

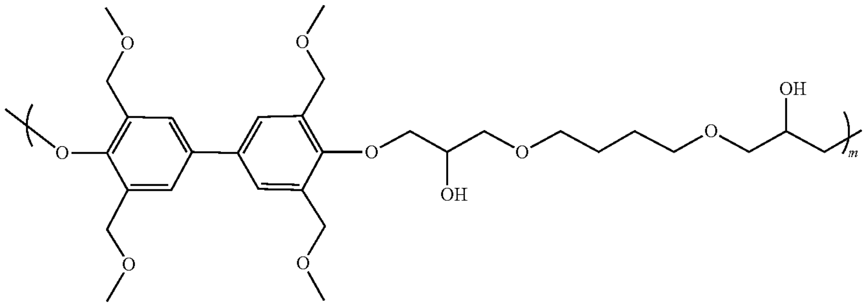

Formula (1-23)

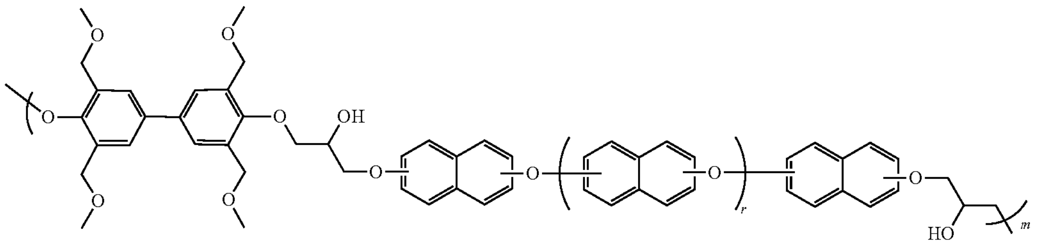

Formula (1-24)

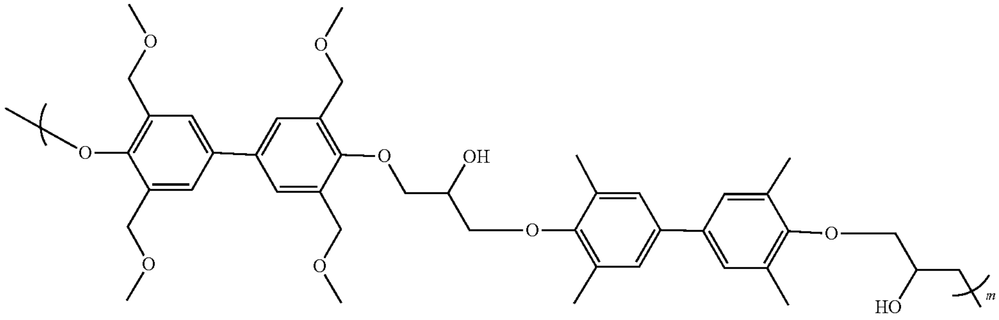

-continued

Formula (1-25)

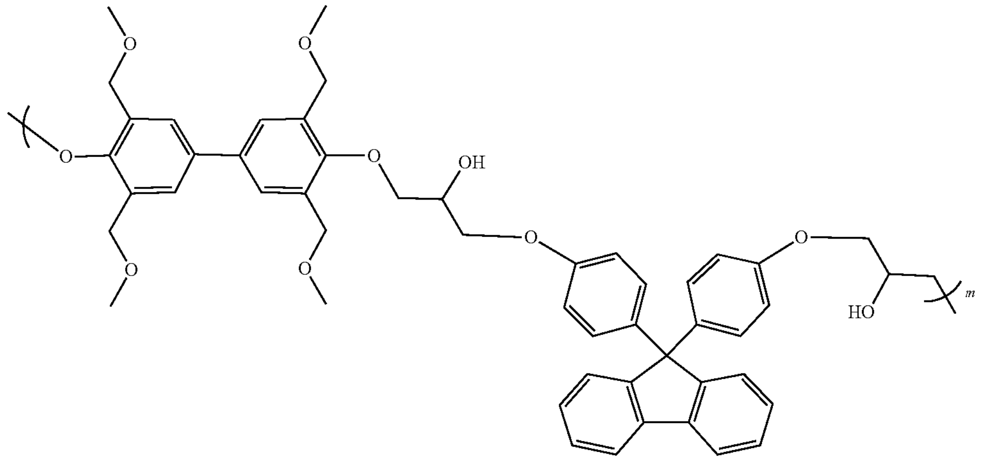

wherein, each of m is independently an integer of 1 to 20, and each of r is independently an integer of 0 to 5.

Advantageous Effects of Invention

In the case of the crosslinkable compound having a specific chemical structure according to the present invention, the crosslinking reaction with the film material slowly proceeds. Therefore, in a case where the resist underlayer film-forming composition containing the crosslinkable compound according to the present invention is applied to a fine pattern of a substrate, the fluidity of the composition is maintained for a predetermined time until three-dimensionalization by crosslinking proceeds. As a result, the resist underlayer film-forming composition according to the present invention can be sufficiently filled in the fine pattern of the stepped substrate without a gap. In addition, in the resist underlayer film formed by applying and baking the resist underlayer film-forming composition according to the present invention onto the stepped substrate, a film thickness difference (Iso-dense bias) between a portion where the pattern exists (dense area (pattern portion)) and a portion where the pattern does not exist (open area (no pattern portion)) in the coated product formed on the resist underlayer film can be suppressed to be small.

DESCRIPTION OF EMBODIMENTS

[Resist Underlayer Film-Forming Composition]

A resist underlayer film-forming composition according to the present invention contains a crosslinkable compound (A) represented by the following formula (I) and a solvent (D).

Optionally, the resist underlayer film-forming composition according to the present invention can further contain a film material (B) capable of crosslinking reaction with the crosslinkable compound (A) and/or an acid catalyst (C).

Further, the resist underlayer film-forming composition according to the present invention can contain additives such as an acid generator and a surfactant, if necessary.

[Crosslinkable Compound (A)]

The crosslinkable compound (A) used in the present invention is represented by the following formula (I).

Formula (I)

$$Z^1 - \left[ G^1 - \underset{}{\overset{(Z^3G^3)_{(v-2)}}{\underset{|}{T}}} - G^2 \right]_m - Z^2$$

wherein, m is an integer of 1 to 30, v is the valence of T, when m=1,

T is a single bond, a divalent to hexavalent saturated hydrocarbon group which may be interrupted by an aromatic ring; or a divalent to hexavalent aromatic or unsaturated cyclic hydrocarbon group which may be interrupted by an oxygen atom, a carbonyl group, or an alkylene group and may be substituted with an alkyl group or an alkenyl group;

each $G^1$ and $G^2$, and each $G^3$ present, is independently $$-\overset{(OR)_n}{\overset{|}{A}}-OCH_2CH(OH)CH_2O- \quad \text{(i)}$$

or $$-OCH_2CH(OH)CH_2O-\overset{(OR)_n}{\overset{|}{A}}- \quad \text{(ii)}$$

each of n is independently an integer of 1 to 8, each of n quantity of R is independently a hydrogen atom; a saturated or unsaturated and linear or branched aliphatic hydrocarbon group which may be substituted with a phenyl group, a naphthyl group, or an anthracenyl group and may be interrupted by an oxygen atom, a nitrogen atom, or a carbonyl group; or an alicyclic hydrocarbon group; and preferably, each of n quantity of R is independently a hydrogen atom or an alkyl group which may be interrupted by an oxygen atom, a nitrogen atom, or a carbonyl group;

each of A is independently a $C_6$-$C_{18}$ aryl group which may be interrupted by an alkylene group, each $Z^1$ and $Z^2$, and each $Z^3$ present, independently represents an alkyl group which may be interrupted by an oxygen atom, a nitrogen atom, or a carbonyl group; or an aryl group which may be interrupted by an oxygen atom, a nitrogen atom, or a carbonyl group and may be substituted with a hydroxy group, a halogen atom, a carboxyl group, a nitro group, a cyano group, a methylenedioxy group, an acetoxy group, a methylthio group, an amino group, a $C_1$-$C_9$ alkoxy group, an alkyl group, an alkenyl group, or an alkynyl group; and when m>1, each of m quantity of T is a single bond; a divalent saturated hydrocarbon group which may be interrupted by an aromatic ring; or a divalent aromatic or unsaturated cyclic hydrocarbon group which may be interrupted by an oxygen atom, a carbonyl group, or an alkylene group and may be substituted with an alkyl group or an alkenyl group;

v is 2 and $G^3Z^3$ is absent, each of m quantity of $G^1$ and $G^2$ is independently (i)

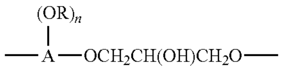

or (ii)

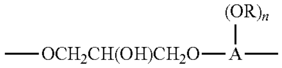

n, R, and A are as defined above, and each of $Z^1$ and $Z^2$ independently represents a hydroxy group, an epoxy group, or a hydrogen atom.

Note that the expression "may be interrupted" as used in the present specification also includes a case where an interrupting group is present at a terminal of the group to be interrupted.

Preferably, the crosslinkable compound (A) used in the present invention is represented by the following formula (II).

Formula (II)

$$Z^1\text{—}[G^1\text{—}T\text{—}G^2]_m\text{—}Z^2$$

wherein, m is an integer of 1 to 30, each of m quantity of T is a single bond; a divalent saturated hydrocarbon group which may be interrupted by an aromatic ring; or a divalent aromatic or unsaturated cyclic hydrocarbon group which may be interrupted by an oxygen atom, a carbonyl group, or an alkylene group and may be substituted with an alkyl group or an alkenyl group;

each of m quantity of $G^1$ and $G^2$ is independently (i)

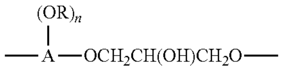

or (ii)

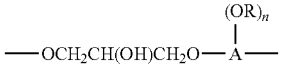

ns are each independently an integer of 1 to 8, each of n quantity of R is independently a saturated or unsaturated and linear or branched aliphatic hydrocarbon group which may be substituted with a hydrogen atom, a phenyl group, a naphthyl group, or an anthracenyl group and may be interrupted by an oxygen atom, a nitrogen atom, or a carbonyl group; or an alicyclic hydrocarbon group; and preferably, each of n quantity of R is independently a hydrogen atom or an alkyl group which may be interrupted by an oxygen atom, a nitrogen atom, or a carbonyl group;

each of A is independently a $C_6$-$C_{18}$ aryl group which may be interrupted by an alkylene group, and each of $Z^1$ and $Z^2$ is independently a hydroxy group, an epoxy group, or a hydrogen atom.

Preferably, the crosslinkable compound (A) used in the present invention is represented by the following formula (3).

Formula (1)

$T\text{—}V_i$ wherein, V is represented by (i)

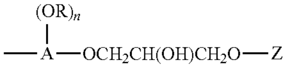

or (ii)

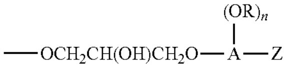

i is an integer of 2 to 6, each of i quantity of R is independently a hydrogen atom; or an alkyl group which may be interrupted by an oxygen atom, a nitrogen atom, or a carbonyl group;

each of i quantity of n is independently an integer of 1 to 8, each of i quantity of A is independently a $C_6$-$C_{18}$ aryl group which may be interrupted by an alkylene group, each of i quantity of Z is independently an alkyl group which may be interrupted by an oxygen atom, a nitrogen atom, or a carbonyl group; or an aryl group which may be interrupted by an oxygen atom, a nitrogen atom, or a carbonyl group and may be substituted with a hydroxy group, a halogen atom, a carboxyl group, a nitro group, a cyano group, a methylenedioxy group, an acetoxy group, a methylthio group, an amino group, a $C_1$-$C_9$ alkoxy group, an alkyl group, an alkenyl group, or an alkynyl group; and T is a single bond; an i-valent saturated hydrocarbon group which may be interrupted by an aromatic ring; or an i-valent aromatic group which may be interrupted by an oxygen atom or an alkylene group and may be substituted with an alkyl group or an alkenyl group.

The alkyl group is preferably an alkyl group having 1 to 10 carbon atoms. Examples thereof include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the aryl group include a phenyl group, a naphthyl group, an anthryl group, and a pyrenyl group. The aryl group is preferably a $C_6$-$C_{18}$ aryl group, more preferably a $C_6$-$C_{14}$ aryl group, still more preferably a $C_6$-$C_{10}$ aryl group, and most preferably a $C_6$ aryl group.

The aryl group which may be interrupted by an alkylene group or the like and may be substituted with a hydroxy group or the like is preferably an aryl group which may be interrupted by an alkylene group, an oxygen atom, a nitrogen atom, or a carbonyl group, and more preferably an aryl group which may be interrupted by a carbonyl group and may be substituted with an alkyl group. Examples thereof include $C_1$-$C_{10}$ alkylphenylcarbonyl groups.

Examples of the alkoxy group include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group. The alkoxy group is preferably a $C_1$-$C_9$ alkoxy group, more preferably a $C_1$-$C_6$ alkoxy group, and still more preferably a $C_1$-$C_3$ alkoxy group.

Examples of the halogen atom include a fluorine atom, a chlorine atom, a bromine atom, and an iodine atom.

Examples of the alkenyl group include an ethenyl group (a vinyl group), a 1-propenyl group, a 2-propenyl group (an allyl group), a butenyl group, a butadienyl group, a pentenyl group, a pentadienyl group, a cyclopentenyl group, a hexenyl group, a hexadienyl group, a hexatrienyl group, and a cyclohexenyl group. The alkenyl group is preferably a $C_2$-$C_{10}$ alkenyl group, more preferably a $C_2$-$C_8$ alkenyl group, and still more preferably a $C_2$-$C_6$ alkenyl group.

Examples of the alkynyl group include an ethynyl group (an acetynyl group), a 1-propynyl group, a 2-propynyl group (a propargyl group), a butynyl group, a pentynyl group, a pent-3-en-1-ynyl group, a hexynyl group, and a hex-2-en-4-ynyl group. The alkynyl group is preferably a $C_2$-$C_{10}$ alkynyl group, more preferably a $C_2$-$C_8$ alkynyl group, and still more preferably a $C_2$-$C_6$ alkynyl group.

The saturated hydrocarbon group refers to a group resulting from eliminating any number of hydrogens from a saturated hydrocarbon compound.

In general, the aromatic group refers to a group derived from an organic compound having $4n+2\pi$ electron systems. Examples of such organic compounds include substituted or unsubstituted benzene, naphthalene, biphenyl, furan, thiophene, pyrrole, pyridine, indole, quinoline, and carbazole.

An example of the saturated hydrocarbon group which may be interrupted by an aromatic ring includes an alkylene group interrupted by phenylene and alkoxyphenylene.

The alkylene group refers to a group resulting from eliminating any one hydrogen of the alkyl group. Examples thereof include a methylene group, an ethylene group, a propylene group, a cyclopropylene group, a butylene group, a cyclobutylene group, a pentylene group, a cyclopentylene group, a hexylene group, and a cyclohexylene group.

The aromatic group which may be interrupted by an oxygen atom or the like and may be substituted with an alkyl group or the like is preferably an arylene group interrupted by an alkylene group and substituted with an alkenyl group; an arylene group substituted with an alkyl group; an arylene group interrupted by an oxygen atom; or an arylene group interrupted by an alkylene group and substituted with an alkyl group. Examples thereof include an allylphenylene group interrupted by a propylene group, a methyl group-substituted biphenylene group, a naphthylene group interrupted by an oxygen atom, a tolylene group interrupted by a methylene group, and a naphthylene group.

The unsaturated cyclic hydrocarbon group which may be interrupted by an oxygen atom or the like and may be substituted with an alkyl group or the like is preferably a non-aromatic unsaturated cyclic hydrocarbon group, and more preferably a divalent non-aromatic unsaturated cyclic hydrocarbon group. Examples thereof include a cyclopentenediyl group, a cyclohexenediyl group, etc., which may be substituted with an alkyl group or an alkenyl group (for example, a vinyl group). These are preferably interrupted by an oxygen atom, a carbonyl group, or an alkylene group, and more preferably interrupted by a carbonyl group.

Specific examples of the crosslinkable compound represented by formula (I) used in the present invention are as follows.

Formula (1-1)
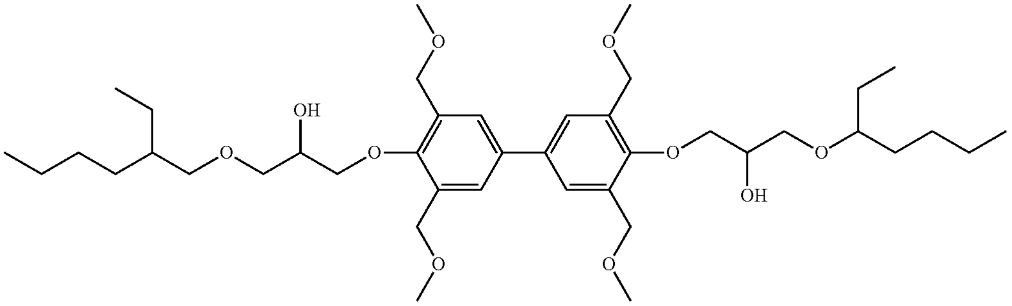
Formula (1-2)
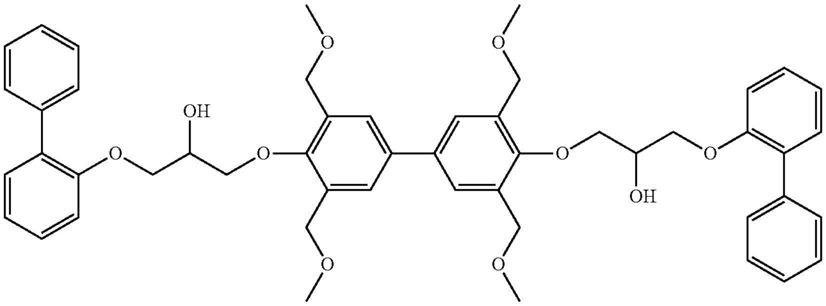
Formula (1-3)
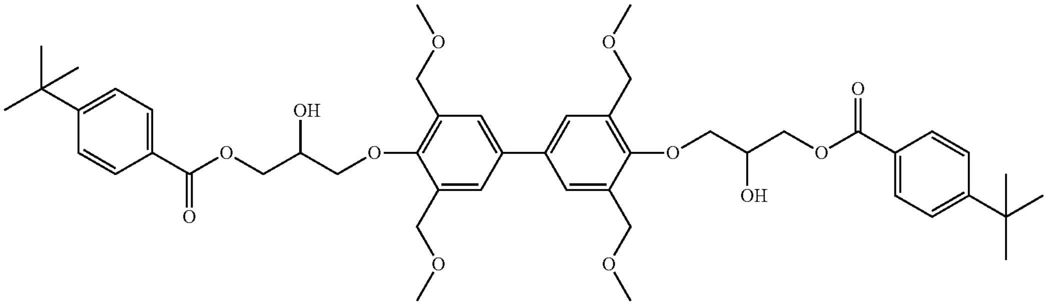
Formula (1-4)
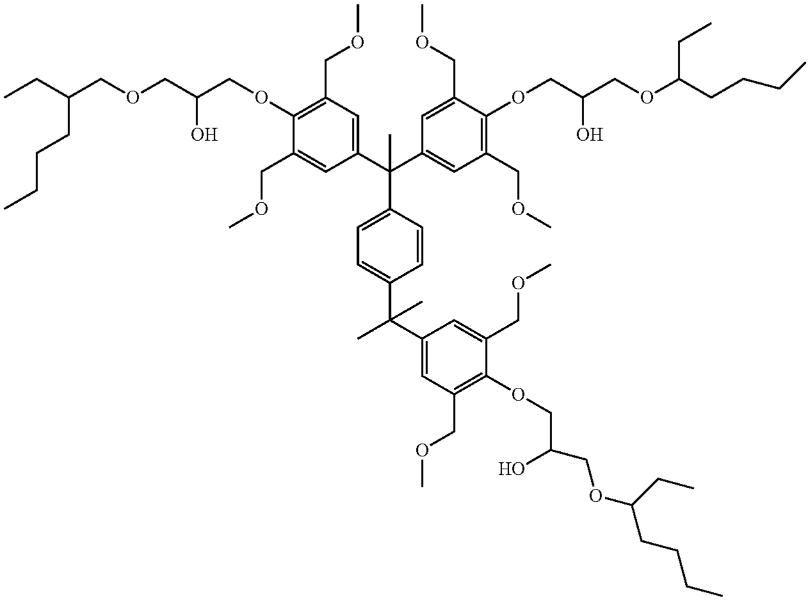

-continued
Formula (1-5)
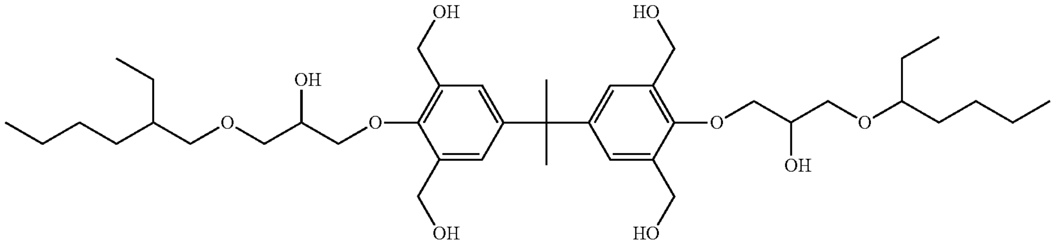
Formula (1-6)
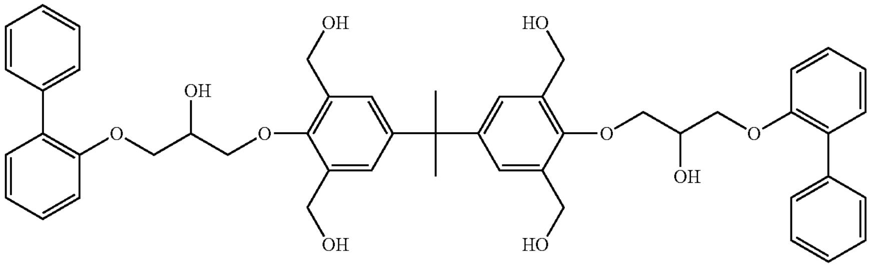
Formula (1-7)
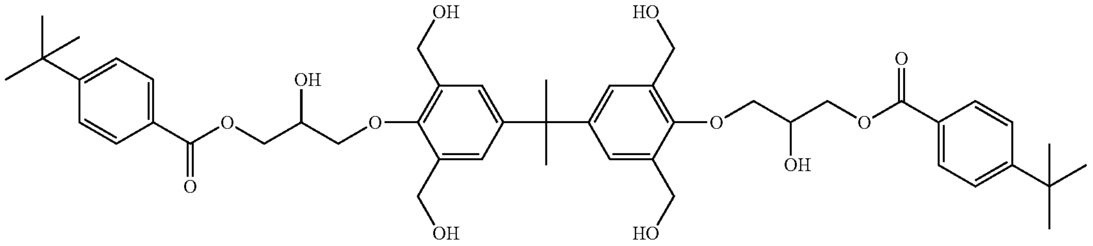
Formula (1-8)
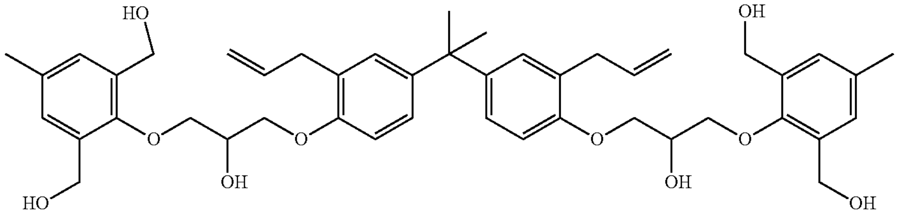
Formula (1-9)
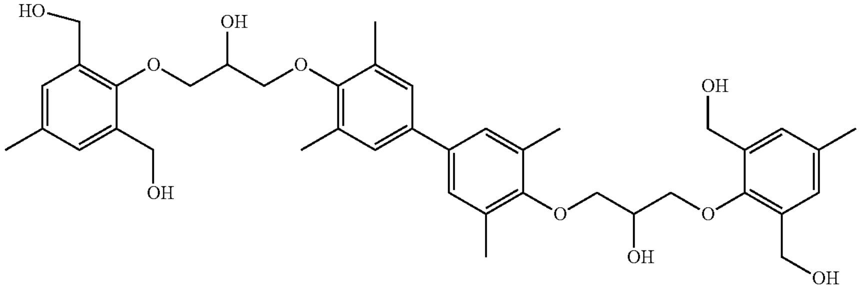
Formula (1-10)
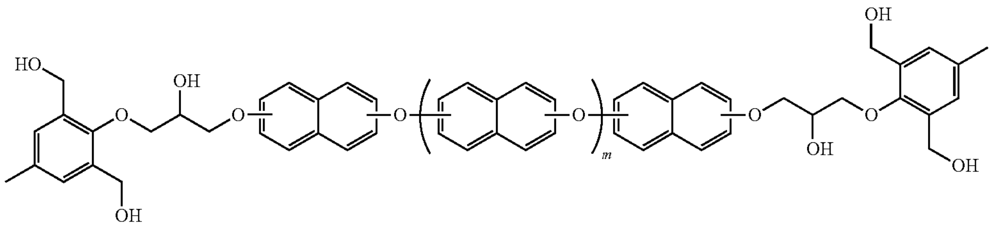
wherein, m represents an integer of 0 to 3.

-continued
Formula (1-11)
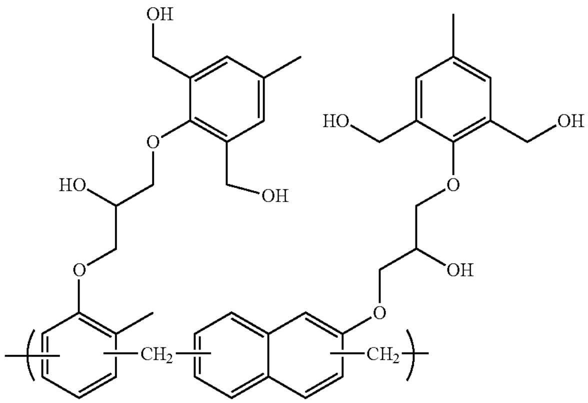
Formula (1-21)
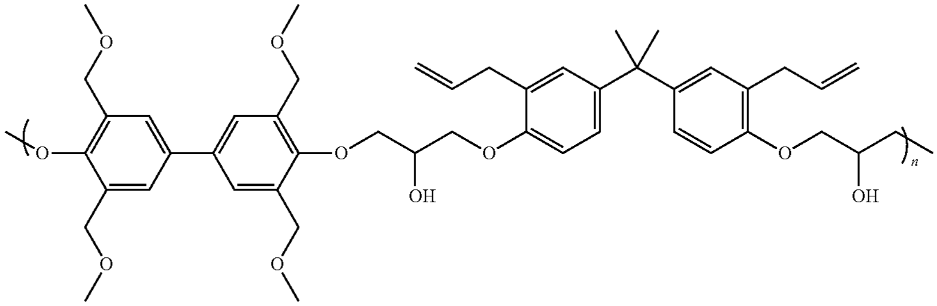
Formula (1-22)
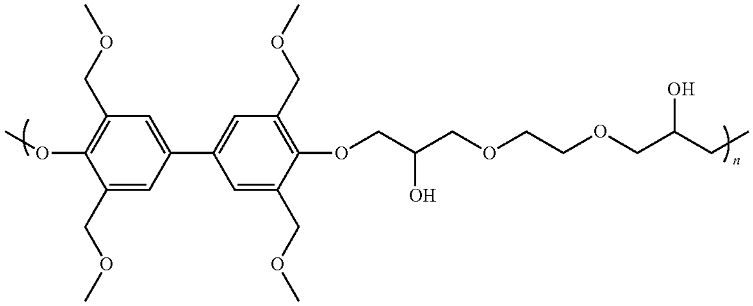
Formula (1-23)
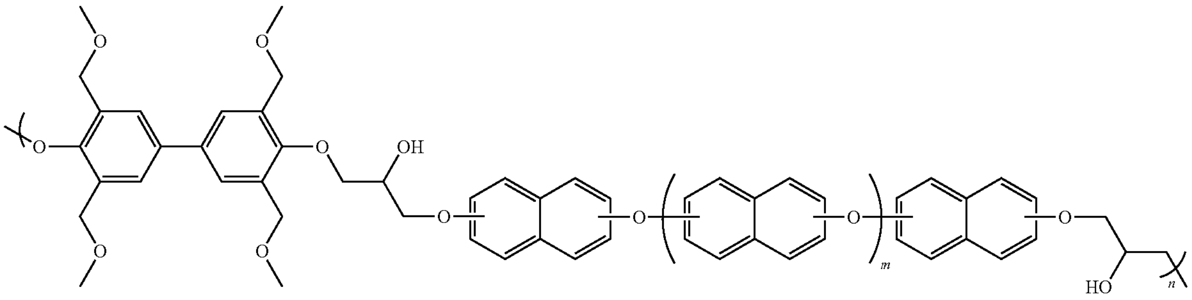

-continued

Formula (1-24)

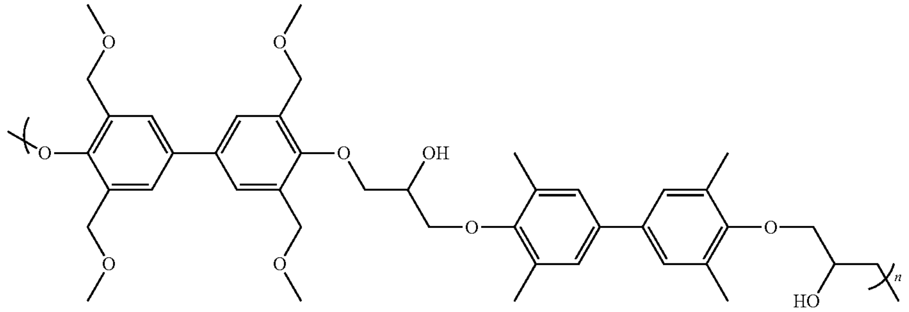

Formula (1-25)

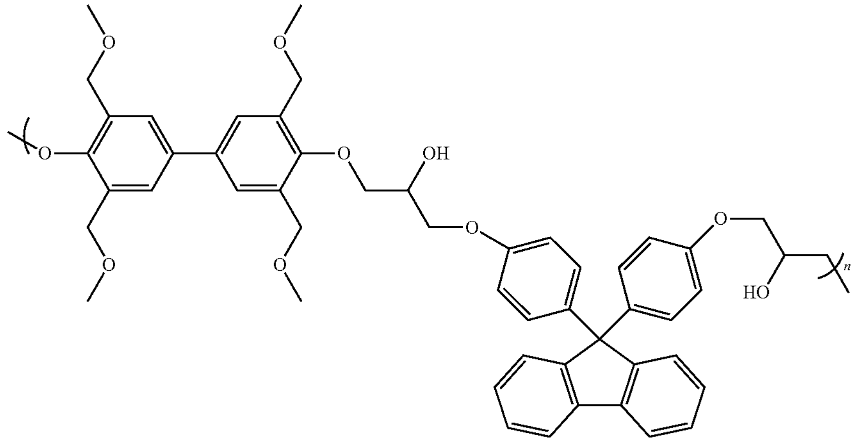

wherein, each of m is independently an integer of 1 to 20, and each of r is independently an integer of 0 to 5.

Specific examples of the crosslinkable compound represented by formula (1) used in the present invention also include formulas (1-1) to (1-11). In addition, specific examples of the crosslinkable compound represented by formula (II) used in the present invention also include formulas (1-21) to (1-25).

A content of the crosslinkable compound (A) in the resist underlayer film-forming composition according to the present invention is generally within the range of 0.01 to 50% by mass, preferably 0.01 to 40% by mass, and more preferably 0.1 to 30% by mass, relative to the total solid content.

The compound (A) represented by formula (I) when m is 1, that is, the crosslinkable compound (A) represented by formula (1) may be obtained by reacting a compound having i quantity of hydroxy groups represented by the following formula (101) with a glycidyl ether compound represented by the following formula (102).

Formula (101)

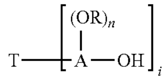

Formula (102)

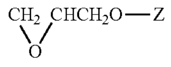

wherein, V, i, R, n, A, Z, and T are as defined above.

The crosslinkable compound (A) represented by formula (1) may be obtained by reacting a compound having i quantity of glycidyl ether groups represented by the following formula (103) with a hydroxy compound represented by the following formula (104).

Formula (103)

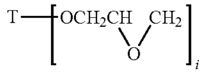

Formula (104)

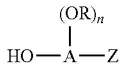

wherein, V, i, R, n, A, Z, and T are as defined above.

The compound (A) represented by formula (I) when m is greater than 1, that is, the crosslinkable compound (A) represented by formula (II) may be obtained by reacting a diglycidyl ether compound represented by the following formula (105) with a dihydroxy compound represented by the following formula (106).

Formula (105)

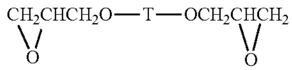

Formula (106)

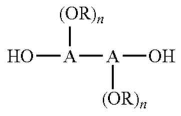

wherein, R, n, A, and T are as defined above.

The crosslinkable compound (A) represented by formula (II) may be obtained by reacting a dihydroxy compound represented by the following formula (107) with a diglycidyl ether compound represented by the following formula (108).

Formula (107)

HO—T—OH

Formula (108)

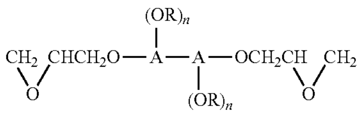

wherein, R, n, A, and T are as defined above.

Any reaction may be performed in an appropriate solvent in the presence of an appropriate catalyst.

Such a solvent is not particularly limited as long as it is a solvent that can uniformly dissolve the compound having i quantity of hydroxy groups represented by formula (101) and the glycidyl ether compound represented by formula (102), the compound having i quantity of glycidyl ether groups represented by formula (103) and the hydroxy compound represented by formula (104), the compound represented by formula (105) and the compound represented by formula (106), or the compound represented by formula (107) and the compound represented by formula (108) and does not inhibit the reaction or does not induce a side reaction.

Examples thereof include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monoethyl ether, propylene glycol monomethyl ether, propylene glycol monomethyl ether acetate, propropylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more thereof. Of these solvents, propylene glycol monomethyl ether, propylene glycol monomethyl ether acetate, ethyl lactate, butyl lactate, and cyclohexanone are preferred.

Examples of the catalyst include a quaternary ammonium salt such as tetrabutylammonium bromide, a quaternary phosphonium salt such as ethyltriphenylphosphonium bromide, and a phosphine-based compound such as triphenylphosphine. Ethyltriphenylphosphonium bromide is preferred.

In addition, an unreacted acid or catalyst, a cation exchange resin for a catalyst to prevent a residue of an inactivated catalyst or the like, and an anion exchange resin may be used for a reaction system.

[Film Material (B) Capable of Crosslinking Reaction with Crosslinkable Compound (A)]

The film material optionally used in the present invention may be used without particular limitation as long as it is a material capable of crosslinking reaction with the crosslinkable compound (A). The film material may be a polymer, an oligomer, or a low-molecular-weight compound having a molecular weight of 1,000 or less. Examples of a crosslink forming group present in the film material include a hydroxy group, a carboxyl group, an amino group, and an alkoxy group, but are not limited thereto.

An example of a film material (a) capable of crosslinking reaction includes an alicyclic epoxy polymer having a repeating structural unit represented by the following formula (1) as disclosed in WO 2011/021555 A1.

Formula (1)

in WO 2011/021555

T represents a repeating unit structure having an aliphatic ring in a main chain of the polymer, and E represents an epoxy group or an organic group having an epoxy group.

E is a substituent for the aliphatic ring, and an epoxy group may be directly bonded to an aliphatic group or an organic group (for example, a glycidyl group) having an epoxy group may be bonded to an aliphatic group.

The aliphatic ring is formed by, for example, linking 4 to 10 carbon atoms in a cyclic form, and particularly, by linking 6 carbon atoms in a cyclic form. The aliphatic ring may have a substituent other than the substituent E (an epoxy group or an organic group having an epoxy group). Examples of such a substituent include an alkyl group having 1 to 10 carbon atoms, an aryl group having 6 to 20 carbon atoms, a halogen atom, a nitro group, and an amino group.

The weight average molecular weight of the alicyclic epoxy polymer represented by formula (1) in WO 2011/021555 is within the range of 600 to 1,000,000 and preferably 1,000 to 200,000. The number of repeating units of the alicyclic epoxy polymer (A) represented by formula (1) in WO 2011/021555 is 2 to 3,000 or 3 to 600.

Examples thereof include the following polymers of formulas (1-1) to (1-3) in WO 2011/021555.

Formula (1-1)

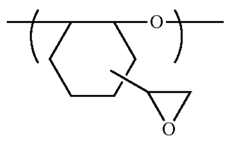

Formula (1-2)

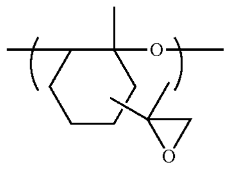

-continued

Formula (1-3)

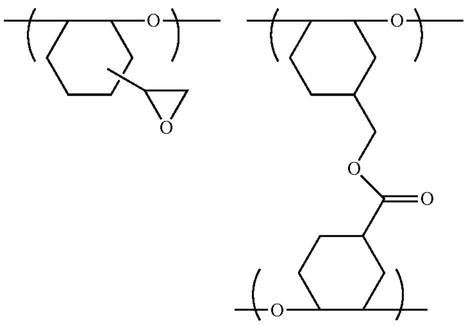

An example of a film material (b) capable of crosslinking reaction includes a polymer having one or two or more repeating structural units represented by the following formulas (1a), (1b), and (1c) as disclosed in WO 2014/024836 A1:

(1a)

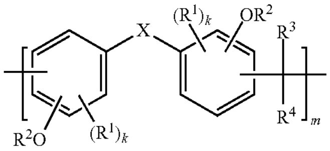

(1b)

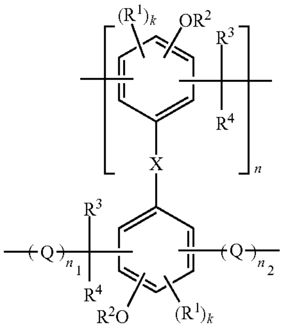

(1c)

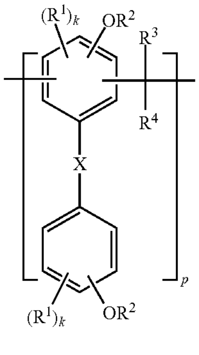

wherein, two $R^1$s each independently represent an alkyl group having 1 to 10 carbon atoms, an alkenyl group having 2 to 6 carbon atoms, an aromatic hydrocarbon group, a halogen atom, a nitro group, or an amino group; two $R^2$s each independently represent a hydrogen atom, an alkyl group having 1 to 10 carbon atoms, an alkenyl group having 2 to 6 carbon atoms, an acetal group, an acyl group, or a glycidyl group; $R^3$ represents an aromatic hydrocarbon group which may have a substituent; $R^4$ represents a hydrogen atom, a phenyl group, or a naphthyl group; when $R^3$ and $R^4$ bonded to the same carbon atom each represent a phenyl group, $R^3$ and $R^4$ may be bonded to each other to form a fluorene ring; and in formula (1b) in WO 2014/024836, groups represented by two $R^1$s and atoms or groups represented by two $R^4$s may be different from each other; two ks each independently represent 0 or 1; m represents an integer of 3 to 500; each of n, $n_1$, and $n_2$ represents an integer of 2 to 500; p represents an integer of 3 to 500; X represents a single bond or a heteroatom; and two Qs each independently represent a structural unit represented by the following formula (2) in WO 2014/024836:

(2)

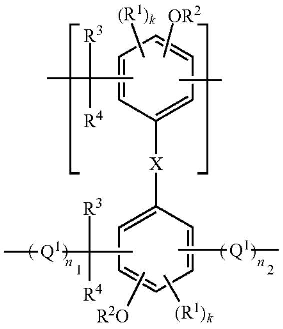

in WO 2014/024836 wherein, two $R^1$s, two $R^2$s, two $R^3$s, two $R^4$s, two ks, $n_1$, $n_2$, and X are as defined in formula (1b) in WO 2014/024836, and two Q's each independently represent a structural unit represented by formula (2) in WO 2014/024836.

Preferably, the aromatic hydrocarbon group represented by $R^3$ is a phenyl group, a naphthyl group, an anthryl group, or a pyrenyl group.

An example of a film material (c) capable of crosslinking reaction includes a polymer having a unit structure represented by the following formula (1) as disclosed in WO 2010/147155 A1:

Formula (1)

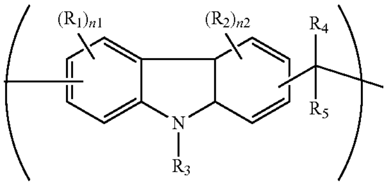

in WO 2010/147155 wherein, each of $R_1$ and $R_2$ is selected from the group consisting of a hydrogen atom, a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_3$ is selected from the group consisting of a hydrogen atom, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_4$ represents an aryl group having 6 to 40 carbon atoms or a heterocyclic group which may be substituted with a halogen group, a nitro group, an amino group, or a hydroxy group, $R_5$ represents a hydrogen atom, or an alkyl group having 1 to 10 carbon atoms, an aryl group having 6 to 40 carbon atoms, or a heterocyclic group which may be substituted with a halogen group, a nitro group, an amino group, or a hydroxy group, $R_4$ and $R_5$ may be combined to form a ring together with a carbon atom to which they bond, and each of n1 and n2 is an integer of 1 to 3.

Preferably, the film material (c) is a polymer having a unit structure represented by formula (1) in WO 2010/147155 in which each of $R_1$, $R_2$, $R_3$, and $R_5$ represents a hydrogen atom and $R_4$ represents a phenyl group or a naphthyl group.

Preferably, in formula (1) in WO 2010/147155, each of $R_1$, $R_2$, and $R_3$ represents a hydrogen atom, and $R_4$ and $R_5$ are combined to form a fluorene ring together with a carbon atom to which they bond. In this case, the film material (c) is a polymer according to claim 1, in which the carbon atom has a unit structure which is a carbon atom at the 9-position of the formed fluorene ring.

Preferably, the film material (c) is a polymer having a unit structure represented by the following formula (2) and/or (3) in WO 2010/147155:

Formula (2)

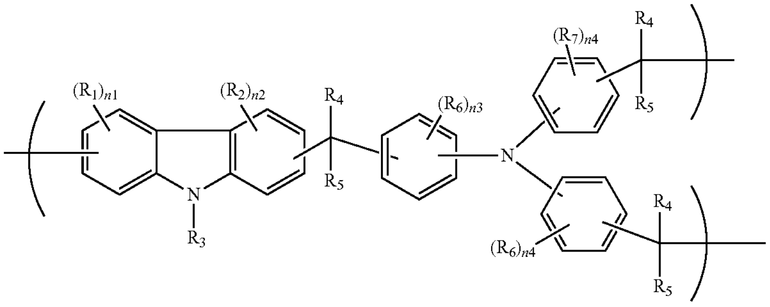

Formula (3)

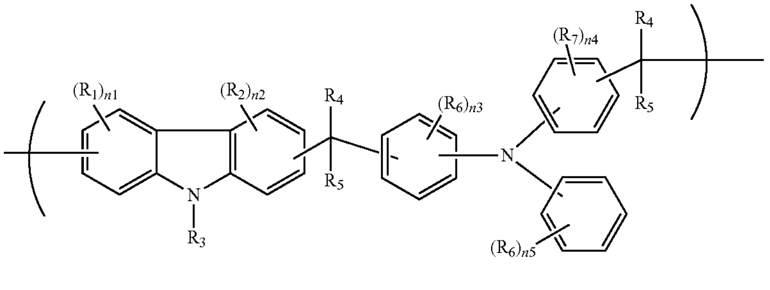

in WO 2010/147155 in WO 2010/147155 wherein, each of $R_1$, $R_2$, $R_6$, $R_7$, and $R_8$ is selected from the group consisting of a hydrogen atom, a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_3$ is selected from the group consisting of a hydrogen atom, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_4$ represents an aryl group having 6 to 40 carbon atoms or a heterocyclic group which may be substituted with a halogen group, a nitro group, an amino group, or a hydroxy group, $R_5$ represents a hydrogen atom, or an alkyl group having 1 to 10 carbon atoms, an aryl group having 6 to 40 carbon atoms, or a heterocyclic group which may be substituted with a halogen group, a nitro group, an amino group, or a hydroxy group, $R_4$ and $R_5$ may be combined to form a ring together with a carbon atom to which they bond, each of n1 and n2 is an integer of 1 to 3, and each of n3 to n5 is an integer of 1 to 4.

Preferably, the film material (c) is a polymer having a unit structure represented by formula (2) and/or (3) in WO 2010/147155 in which each of $R_1$, $R_2$, $R_3$, $R_5$, $R_6$, $R_7$, and $R_8$ represents a hydrogen atom and $R^4$ represents a phenyl group or a naphthyl group.

An example of a film material (d) capable of crosslinking reaction includes a polymer having a unit structure composed of a reaction product of a fused heterocyclic compound and a bicyclic compound as disclosed in WO 2013/005797 A1.

Preferably, the fused heterocyclic compound is a carbazole compound or a substituted carbazole compound.

Preferably, the bicyclic compound is dicyclopentadiene, substituted dicyclopentadiene, tetracyclo[4.4.0.$1^{2,5}$.$1^{7,10}$]dodeca-3,8-diene, or substituted tetracyclo[4.4.0.$1^{2,5}$.$1^{7,10}$]dodeca-3,8-diene.

Preferably, the polymer is a polymer having a unit structure represented by the following formula (1) in WO 2013/005797, a unit structure represented by the following formula (2) in WO 2013/005797, a unit structure represented by the following formula (3) in WO 2013/005797, or a combination thereof.

Preferably, the fused aromatic hydrocarbon ring group of B is a halogen group, a hydroxyl group, a nitro group, an amino group, a carboxyl group, a carboxylic acid ester group, a ditolyl group, or a group having a combination thereof as a substituent.

Formula (1)

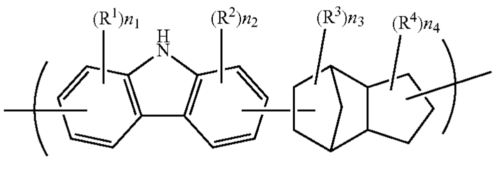

Formula (2)

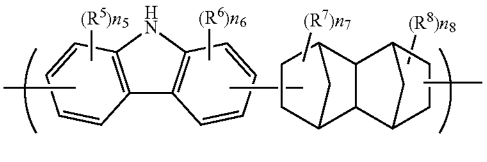

Formula (3)

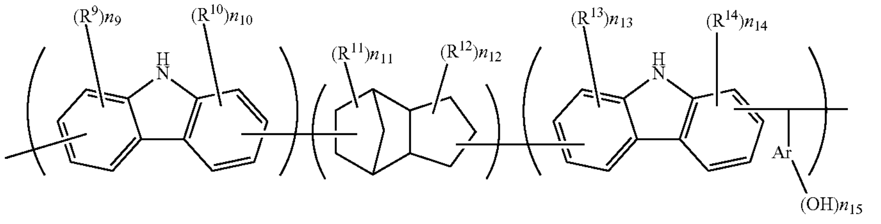

in WO 2013/005797
in WO 2013/005797
in WO 2013/005797 wherein, $R^1$ to $R^{14}$ are substituents of hydrogen atoms and are each independently an alkyl group having 1 to 10 carbon atoms or an aryl group having 6 to 40 carbon atoms, which may be substituted with a halogen group, a nitro group, an amino group, a hydroxy group, or a group thereof; Ar is an aromatic ring group having 6 to 40 carbon atoms; each of $n_1$, $n_2$, $n_5$, $n_6$, $n_9$, $n_{10}$, $n_{13}$, $n_{14}$, and $n_{15}$ is an integer of 0 to 3; and each of $n_3$, $n_4$, $n_7$, $n_8$, $n_{11}$, and $n_{12}$ is an integer of 0 to 4.

Preferably, in formula (3) in WO 2013/005797, Ar is a phenyl group or a naphthyl group.

An example of a film material (e) capable of crosslinking reaction includes a polymer having a unit structure represented by formula (1) as disclosed in WO 2012/176767 A1:

Formula (1)

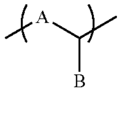

in WO 2012/176767 wherein, A is a hydroxy group-substituted phenylene group derived from polyhydroxybenzene, and B is a monovalent fused aromatic hydrocarbon ring group in which 2 to 4 benzene rings are fused.

Preferably, A is a hydroxy group-substituted phenylene group derived from benzenediol or benzenetriol.

Preferably, A is a hydroxy group-substituted phenylene group derived from catechol, resorcinol, hydroquinone, pyrogallol, hydroxyquinol, or phloroglucinol.

Preferably, the fused aromatic hydrocarbon ring group of B is a naphthalene ring group, an anthracene ring group, or a pyrene ring group.

An example of a film material (f) capable of crosslinking reaction includes a polymer having a unit structure (A) represented by the following formula (1) as disclosed in WO 2013/047516 A1:

Formula (1)

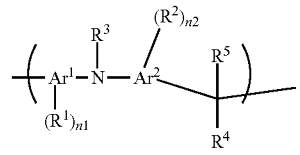

in WO 2013/047516 wherein, each of $Ar^1$ and $Ar^2$ represents a benzene ring or a naphthalene ring; each of $R^1$ and $R^2$ is a substituent of a hydrogen atom on the benzene ring or the naphthalene ring and is selected from the group consisting of a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, in which each of the alkyl group, the alkenyl group, and the aryl group represents an organic group which may have an ether bond, a ketone bond, or an ester bond, $R^3$ is selected from the group consisting of a hydrogen atom, an alkyl group having 1 to 10 carbon atoms, an alkenyl group having 2 to 10 carbon atoms, an aryl group having 6 to 40 carbon atoms, and a combination thereof, in which each of the alkyl group, the alkenyl group, and the aryl group represents an organic group which may have an ether bond, a ketone bond, or an ester bond, $R^4$ is selected from the group consisting of an aryl group having 6 to 40 carbon atoms and a heterocyclic group, in which each of the aryl group and the heterocyclic group represents an organic group which may be substituted with a halogen group, a nitro group, an amino group, an alkyl group having 1 to 10 carbon atoms, an alkoxy group having 1 to 10 carbon atoms, an aryl group having 6 to 40 carbon atoms, a formyl group, a carboxyl group, or a hydroxyl group, $R^5$ is selected from the group consisting of a hydrogen atom, an alkyl group having 1 to 10 carbon atoms, an aryl group having 6 to 40 carbon atoms, and a heterocyclic group, in which each of the alkyl group, the aryl group, and the heterocyclic group represents an organic group which may be substituted with a halogen group, a nitro group, an amino group, or a hydroxyl group, $R^4$ and $R^5$ may be combined to form a ring together with a carbon atom to which they bond, and each of n1 and n2 is an integer of 0 to 3.

Preferably, in formula (1) in WO 2013/047516, $R^5$ is a hydrogen atom, and $R^4$ is a phenyl group, a naphthyl group, an anthryl group, or a pyrenyl group which may be substituted.

Preferably, in formula (1) in WO 2013/047516, $R^3$ is a hydrogen atom or a phenyl group.

Preferably, the unit structure (A) includes a unit structure (a1) in which one of $Ar^1$ and $Ar^2$ is a benzene ring and the other is a naphthalene ring.

Preferably, the unit structure (A) includes a unit structure (a2), in which $Ar^1$ and $Ar^2$ form a benzene ring.

Preferably, the film material (f) is a copolymer having a unit structure (a1) and a unit structure (a2).

Preferably, the film material (f) is a copolymer having a unit structure (A) of formula (1) in WO 2013/047516 and a unit structure of the following formula (2) in WO 2013/047516:

Formula (2)

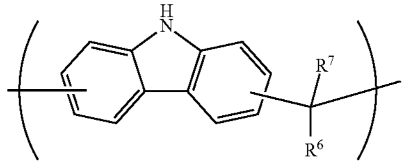

in WO 2013/047516 wherein, $R^6$ is selected from the group consisting of an aryl group having 6 to 40 carbon atoms and a heterocyclic group, in which each of the aryl group and the heterocyclic group represents an organic group which may be substituted with a halogen group, a nitro group, an amino group, an alkyl group having 1 to 10 carbon atoms, an alkoxy group having 1 to 10 carbon atoms, an aryl group having 6 to 40 carbon atoms, a formyl group, a carboxyl group, or a hydroxyl group; $R^7$ is selected from the group consisting of a hydrogen atom, an alkyl group having 1 to 10 carbon atoms, an aryl group having 6 to 40 carbon atoms, and a heterocyclic group, in which each of the alkyl group, the aryl group, and the heterocyclic group represents an organic group which may be substituted with a halogen group, a nitro group, an amino group, or a hydroxyl group; and $R^6$ and $R^7$ may be combined to form a ring together with a carbon atom to which they bond.

Preferably, the film material (f) is a copolymer having a unit structure (a1) and a unit structure (B).

An example of a film material (g) capable of crosslinking reaction includes a polymer having a unit structure represented by the following formula (1) as disclosed in WO 2013/146670 A1:

Formula (1)

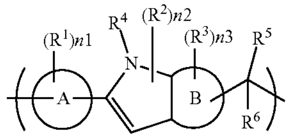

in WO 2013/146670 wherein, $R^1$, $R^2$, and $R^3$ are substituents of hydrogen atoms of rings and are each independently a halogen group, a nitro group, an amino group, a hydroxyl group, an alkyl group having 1 to 10 carbon atoms, an alkenyl group having 2 to 10 carbon atoms, an aryl group having 6 to 40 carbon atoms, or a combination thereof which may have an ether bond, a ketone bond, or an ester bond; $R^4$ is a hydrogen atom, an alkyl group having 1 to 10 carbon atoms, an alkenyl group having 2 to 10 carbon atoms, an aryl group having 6 to 40 carbon atoms, or a combination thereof which may have an ether bond, a ketone bond, or an ester bond; $R^5$ is a hydrogen atom, or an aryl group having 6 to 40 carbon atoms or a heterocyclic group which may be substituted with a halogen group, a nitro group, an amino group, a formyl group, a carboxyl group, a carboxylic acid alkyl ester group, a phenyl group, an alkoxy group having 1 to 10 carbon atoms, or a hydroxyl group; $R^6$ is a hydrogen atom, or an alkyl group having 1 to 10 carbon atoms, an aryl group having 6 to 40 carbon atoms, or a heterocyclic group which may be substituted with a halogen group, a nitro group, an amino group, a formyl group, a carboxyl group, a carboxylic acid alkyl ester group, or a hydroxyl group; and $R^5$ and $R^6$ may be combined to form a ring together with a carbon atom to which they bond; each of the ring A and the ring B represents a benzene ring, a naphthalene ring, or an anthracene ring; and each of n1, n2, and n3 is an integer of 0 or more and up to a maximum number of substituents capable of being substituted for the ring.

Preferably, both the ring A and the ring B are benzene rings, each of n1, n2, and n3 is 0, and $R^4$ is a hydrogen atom.

Preferably, $R^5$ is a hydrogen atom, or a phenyl group, a naphthyl group, an anthryl group, or a pyrenyl group which may be substituted with a halogen group, a nitro group, an amino group, a formyl group, a carboxyl group, a carboxylic acid alkyl ester group, a phenyl group, an alkoxy group having 1 to 10 carbon atoms, or a hydroxyl group; and $R^6$ is a hydrogen atom.

An example of a film material (h) capable of crosslinking reaction includes a polymer having one or two or more repeating structural units represented by the following formulas (1a), (1b), and (1c) as disclosed in WO 2014/129582 A1:

(1a)

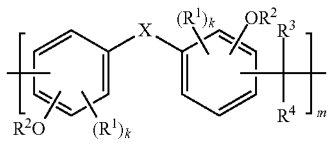

-continued (1b)

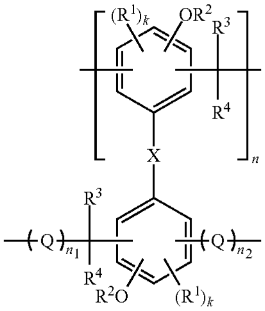

(1c)

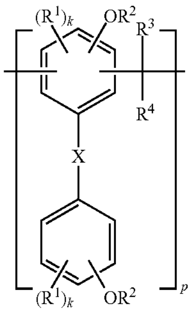

in WO 2014/129582 in WO 2014/129582 in WO 2014/129582 wherein, two $R^1$s each independently represent an alkyl group having 1 to 10 carbon atoms, an alkenyl group having 2 to 6 carbon atoms, an aromatic hydrocarbon group, a halogen atom, a nitro group, or an amino group; two $R^1$s each independently represent a hydrogen atom, an alkyl group having 1 to 10 carbon atoms, an alkenyl group having 2 to 6 carbon atoms, an acetal group, an acyl group, or a glycidyl group; $R^3$ represents an aromatic hydrocarbon group which may have a substituent; $R^4$ represents a hydrogen atom, a phenyl group, or a naphthyl group; when $R^3$ and $R^4$ bonded to the same carbon atom each represent a phenyl group, $R^3$ and $R^4$ may be bonded to each other to form a fluorene ring; and in formula (1b) in WO 2014/129582, groups represented by two $R^1$s and atoms or groups represented by two Ras may be different from each other; two ks each independently represent 0 or 1; m represents an integer of 3 to 500; each of n, n1, and n2 represents an integer of 2 to 500; p represents an integer of 3 to 500; X represents a single bond or a heteroatom; and two Qs each independently represent a structural unit represented by the following formula (2) in WO 2014/129582:

(2)

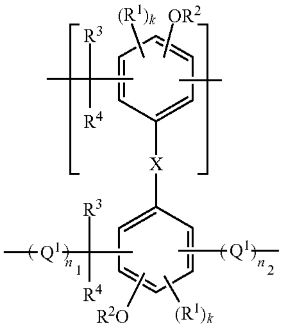

in WO 2014/129582 wherein, two $R^1$s, two $R^2$s, two $R^3$s, two $R^4$s, two ks, $n_1$, $n_2$, and X are as defined in formula (1b); and two $Q^1$s each independently represent a structural unit represented by formula (2).

Preferably, the aromatic hydrocarbon group represented by $R^3$ is a phenyl group, a naphthyl group, an anthryl group, or a pyrenyl group.

An example of a film material (i) capable of crosslinking reaction includes a polymer having a unit structure represented by the following formula (1) as disclosed in WO 2016/072316 A1:

Formula (1)

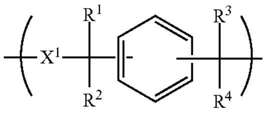

in WO 2016/072316 wherein, $R^1$ to $R^4$ each independently represent a hydrogen atom or a methyl group; and $X^1$ represents a divalent organic group having at least one arylene group which may be substituted with an alkyl group, an amino group, or a hydroxyl group.

Preferably, in formula (1), the arylene group in the definition of $X^1$ is a phenylene group, a biphenylene group, a terphenylene group, a fluorenylene group, a naphthylene group, an anthrylene group, a pyrenylene group, or a carbazolylene group.

Preferably, in formula (1) in WO 2016/072316, $X^1$ is an organic group represented by formula (2) in WO 2016/072316:

Formula (2)

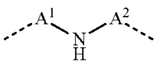

in WO 2016/072316 wherein, $A^1$ represents a phenylene group or a naphthylene group; $A^2$ represents a phenylene group, a naphthylene group, or an organic group represented by formula (3) in WO 2016/072316:

Formula (3)

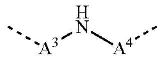

in WO 2016/072316 wherein, $A^3$ and $A^4$ each independently represent a phenylene group or a naphthylene group; and the dotted line represents a bond, and the dotted line represents a bond.

An example of a film material (j) capable of crosslinking reaction includes a novolac resin obtained by reacting an aromatic compound (A) with an aldehyde (B) having a formyl group bonded to a secondary carbon atom or a tertiary carbon atom of an alkyl group having 2 to 26 carbon atoms, as disclosed in WO 2017/069063 A1.

Preferably, the novolac resin has a unit structure represented by the following formula (1) in WO 2017/069063:

Formula (1)

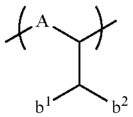

in WO 2017/069063 wherein, A represents a divalent group derived from an aromatic compound having 6 to 40 carbon atoms; $b^1$ represents an alkyl group having 1 to 16 carbon atoms; and $b^2$ represents a hydrogen atom or an alkyl group having 1 to 9 carbon atoms.

Preferably, A is a divalent group derived from an aromatic compound having an amino group, a hydroxyl group, or both an amino group and a hydroxyl group.

Preferably, A is a divalent group derived from an arylamine compound, a phenol compound, or an aromatic compound including both an arylamine compound and a phenol compound.

Preferably, A is divalent group derived from aniline, diphenylamine, phenylnaphthylamine, hydroxydiphenylamine, carbazole, phenol, N,N'-diphenylethylenediamine, N,N'-diphenyl-1,4-phenylenediamine, or polynuclear phenol.

Preferably, the polynuclear phenol is dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 2,2'-biphenol, or 1,1,2,2-tetrakis(4-hydroxyphenyl)ethane.

Preferably, the novolac resin has a unit structure represented by the following formula (2) in WO 2017/069063:

Formula (2)

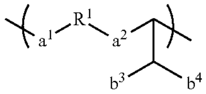

in WO 2017/069063 wherein, each of $a^1$ and $a^2$ represents a benzene ring or a naphthalene ring which may be substituted; $R^1$ represents a secondary amino group or a tertiary amino group, a divalent hydrocarbon group having 1 to 10 carbon atoms, which may be substituted, an arylene group, or a divalent group to which these groups are optionally bonded; $b^3$ represents an alkyl group having 1 to 16 carbon atoms; and $b^4$ represents a hydrogen atom or an alkyl group having 1 to 9 carbon atoms.

An example of a film material (k) capable of crosslinking reaction includes a polymer having a repeating structural unit represented by the following formula (1a) and/or (1b) as disclosed in WO 2017/199768 A1:

(1a)

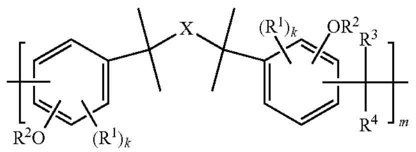

(1b)

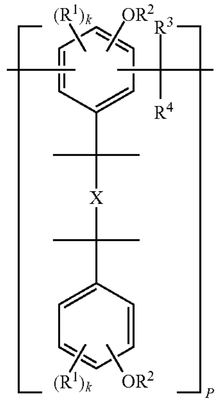

in WO 2017/199768 in WO 2017/199768 wherein, two $R^1$s each independently represent an alkyl group having 1 to 10 carbon atoms, an alkenyl group having 2 to 6 carbon atoms, an aromatic hydrocarbon group, a halogen atom, a nitro group, or an amino group; two $R^2$s each independently represent a hydrogen atom, an alkyl group having 1 to 10 carbon atoms, an alkenyl group having 2 to 6 carbon atoms, an acetal group, an acyl group, or a glycidyl group; $R^3$ represents an aromatic hydrocarbon group or a heterocyclic group which may have a substituent; $R^4$ represents a hydrogen atom, a phenyl group, or a naphthyl group; when $R^3$ and $R^4$ bonded to the same carbon atom each represent a phenyl group, $R^3$ and $R^4$ may be bonded to each other to form a fluorene ring; two ks each independently represent 0 or 1; m represents an integer of 3 to 500; p represents an integer of 3 to 500; X represents a benzene ring; and two $-C(CH_3)_2$-groups bonded to the benzene ring have a meta-position or para-position relationship.

Preferably, the polymer is a polymerization reaction product of at least one bisphenol compound and at least one aromatic aldehyde or aromatic ketone.

Preferably, the aromatic hydrocarbon group represented by $R^3$ is a phenyl group, a naphthyl group, an anthryl group, or a pyrenyl group.

An example of a film material (l) capable of crosslinking reaction includes a poly(epoxide) resin having an epoxy-functional value of greater than 2.0 and less than 10, as disclosed in JP 11-511194 A.

Preferably, the poly(epoxide) resin is selected from the group consisting of a bisphenol A-epichlorohydrin resin product, epoxy novolac, o-cresol epoxy novolac, polyglycidyl ether, polyglycidyl amine, alicyclic epoxide, and polyglycidyl ester.

Preferably, the poly(epoxide) resin has an epoxy-functional value of greater than 3.5.

Examples of a film material (m) capable of crosslinking reaction or a novolac film material include a compound represented by the following formula (1) and a novolac film material as disclosed in WO 2018/198960 A1.

Formula (1)

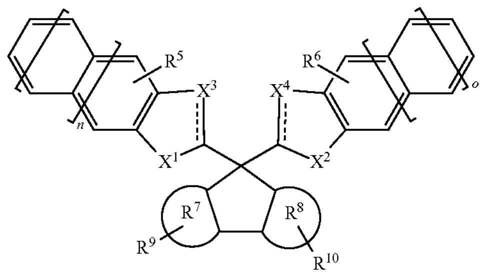

in WO 2018/198960 wherein, represents a single bond or a double bond, $X^1$ represents —N($R^1$)— or —CH($R^1$)—, $X^2$ represents —N($R^2$)— or —CH($R^3$)—, $X^3$ represents —N═, —CH═, —N($R^3$)—, or —CH($R^3$)—, $X^4$ represents —N═, —CH═, —N($R^4$)—, or —CH($R^4$)—, $R^1$, $R^2$, $R^3$, and $R^4$ are the same or different from each other and each represent a hydrogen atom, a C1-20 linear, branched, or cyclic alkyl group, a C6-20 aryl group, a C2-10 alkenyl group, a C2-10 alkynyl group, a carboxyl group, or a cyano group, in which each of the alkyl group and the aryl group may be substituted with a C1-6 acyl group, a C1-6 alkoxy group, a C1-6 alkoxycarbonyl group, an amino group, a glycidyl group, or a hydroxy group and may be interrupted by an oxygen atom or a sulfur atom, $R^5$, $R^6$, $R^9$, and $R^{10}$ are the same or different from each other and each represent a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, in which each of the acyl group, the alkoxy group, the alkoxycarbonyl group, the alkyl group, the aryl group, the alkenyl group, and the alkynyl group may have one or more groups selected from the group consisting of an amino group, a nitro group, a cyano group, a hydroxy group, a glycidyl group, and a carboxyl group, $R^7$ and $R^8$ are the same or different from each other and each represent a benzene ring or a naphthalene ring, and each of n and o is 0 or 1.

Preferably, in formula (1), $R^1$, $R^2$, $R^3$, or $R^4$ is a hydroxy group or a C1-20 linear, branched, or cyclic alkyl group which may be substituted with a hydroxy group and may be interrupted by an oxygen atom or a sulfur atom.

Preferably, the film material (m) is a compound having one or more units of repeating units a, b, c, d, e, f, g, h, and i represented by the following formula (2) in WO 2018/198960.

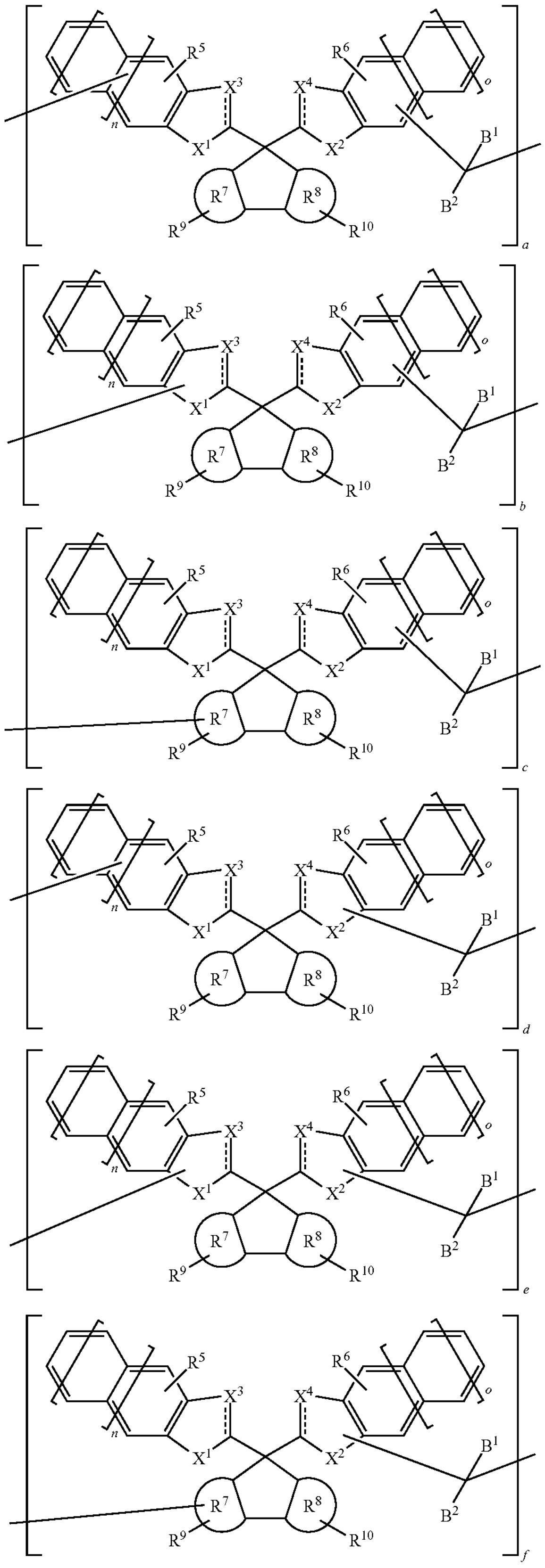

-continued

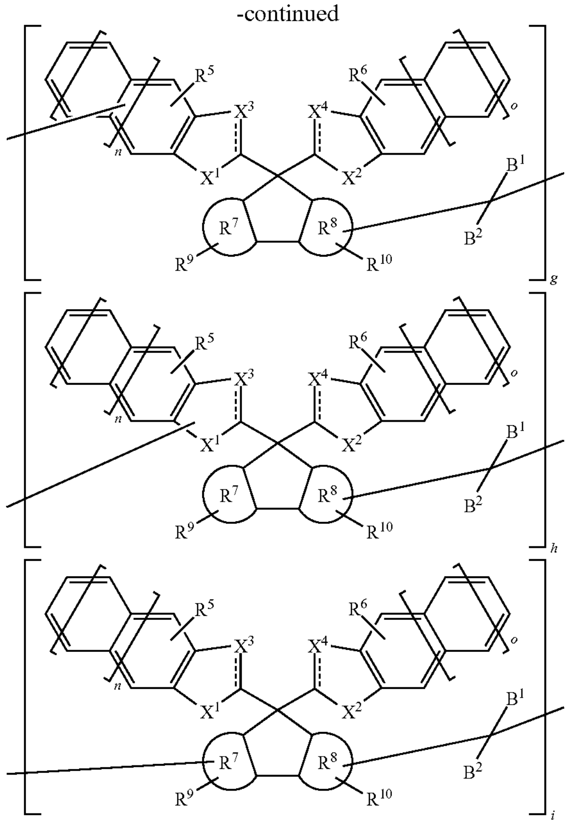

formula (2) in WO 2018/198960 wherein represents a single bond or a double bond, $X^1$ represents —N($R^1$)—, —CH($R^1$)—, —N<, or —CH<, $X^2$ represents —N($R^2$)—, —CH($R^2$)—, —N<, or —CH<, $X^3$ represents —N═, —CH═, —N($R^3$)—, —CH($R^3$)—, —N<, or —CH<, $X^4$ represents —N═, —CH═, —N($R^4$)—, —CH($R^4$)—, —N<, or —CH<, $R^1$, $R^2$, $R^3$, and $R^4$ are the same or different from each other and each represent a hydrogen atom, a C1-20 linear, branched, or cyclic alkyl group, a C6-20 aryl group, a C2-10 alkenyl group, a C2-10 alkynyl group, a carboxyl group, or a cyano group, in which each of the alkyl group and the aryl group may be substituted with a C1-6 acyl group, a C1-6 alkoxy group, a C1-6 alkoxycarbonyl group, an amino group, a glycidyl group, or a hydroxy group and may be interrupted by an oxygen atom or a sulfur atom, $R^5$, $R^6$, $R^9$, and $R^{10}$ are the same or different from each other and each represent a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, in which each of the acyl group, the alkoxy group, the alkoxycarbonyl group, the alkyl group, the aryl group, the alkenyl group, and the alkynyl group may have one or more groups selected from the group consisting of an amino group, a nitro group, a cyano group, a hydroxy group, a glycidyl group, and a carboxyl group, $R^7$ and $R^8$ are the same or different from each other and each represent a benzene ring or a naphthalene ring, each of n and o is 0 or 1, and $B^1$ and $B^2$ are the same or different from each other and each represent a group derived from an aromatic compound selected from the group consisting of a C1-20 linear, branched, or cyclic alkyl group or C6-40 aryl group which may be interrupted by a hydrogen atom, an oxygen atom, or a sulfur atom and a C6-40 heterocyclic group; $B^1$ and $B^2$ may be combined to form a ring together with a carbon atom to which they bond, and the hydrogen atom of the group derived from an aromatic compound may be substituted with a C1-20 alkyl group, a phenyl group, a fused ring group, a heterocyclic group, a hydroxy group, an amino group, an ether group, an alkoxy group, a cyano group, a nitro group, or a carboxyl group.

Preferably, the film material (m) is a compound having one or more units of repeating units j, k, l, m, r, s, t, u, v, and w represented by the following formula (3) in WO 2018/198960.

[Chem. 70-1]

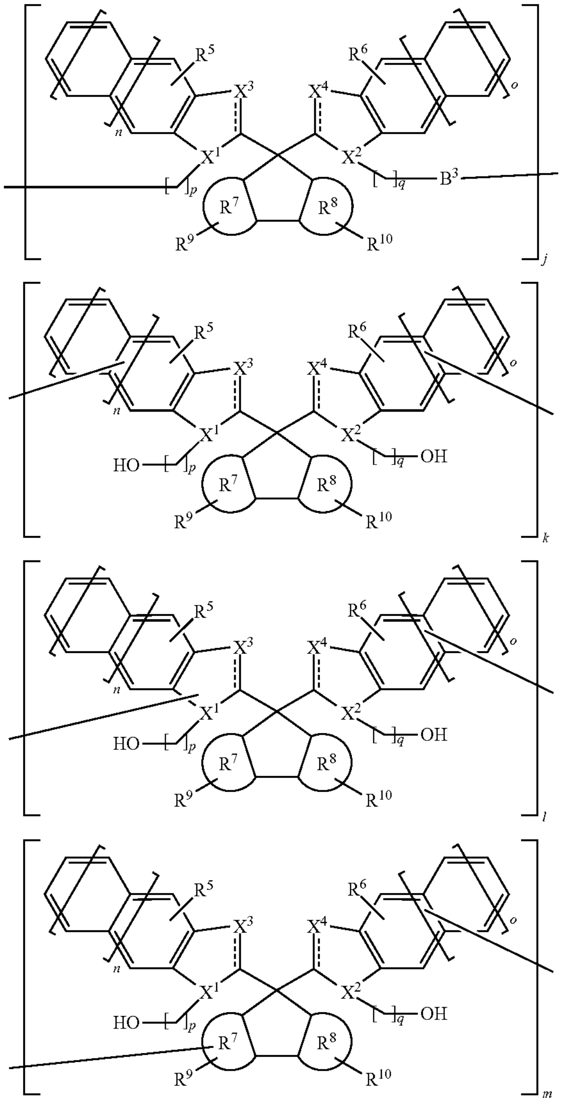

-continued

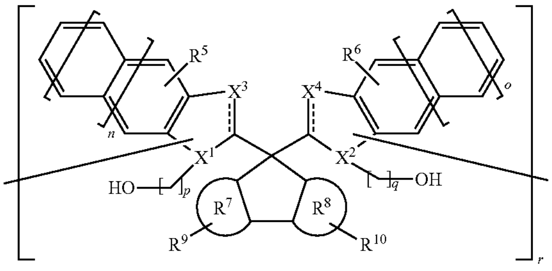

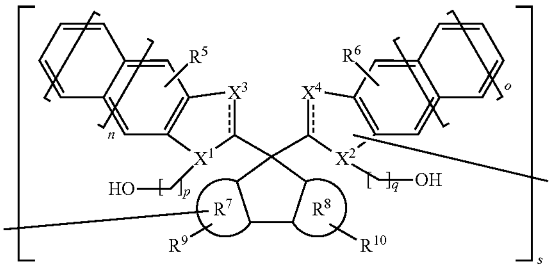

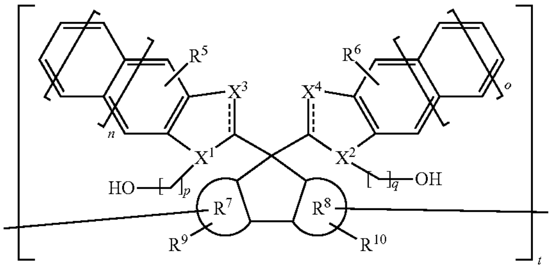

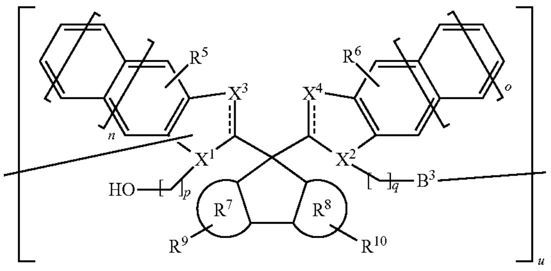

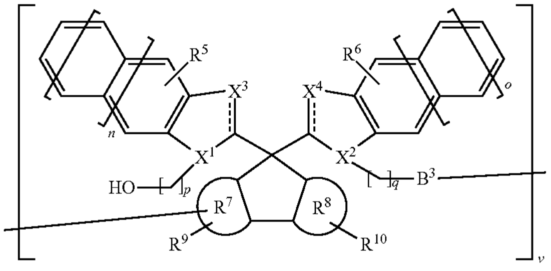

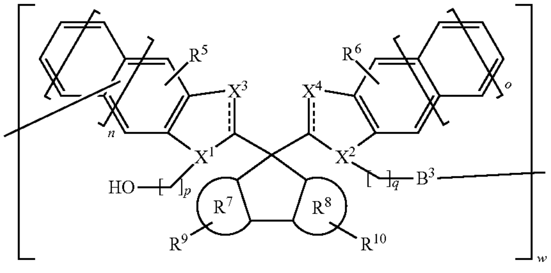

formula (3) in WO 2018/198960 wherein, represents a single bond or a double bond, $X^1$ represents —N< or —CH<, $X^2$ represents —N< or —CH<, $X^3$ represents —N═, —CH═, —N($R^3$)—, or —CH($R^3$)—, $X^4$ represents —N═, —CH═, —N($R^4$)—, or —CH($R^4$)—, $R^3$ and $R^4$ are the same or different from each other and each represent a hydrogen atom, a C1-20 linear, branched, or cyclic alkyl group, a C6-20 aryl group, a C2-10 alkenyl group, a C2-10 alkynyl group, a carboxyl group, or a cyano group, in which each of the alkyl group and the aryl group may be substituted with a C1-6 acyl group, a C1-6 alkoxy group, a C1-6 alkoxycarbonyl group, an amino group, a glycidyl group, or a hydroxy group and may be interrupted by an oxygen atom or a sulfur atom, $R^5$, $R^6$, $R^9$, and $R^{10}$ are the same or different from each other and each represent a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, in which each of the acyl group, the alkoxy group, the alkoxycarbonyl group, the alkyl group, the aryl group, the alkenyl group, and the alkynyl group may have one or more groups selected from the group consisting of an amino group, a nitro group, a cyano group, a hydroxy group, a glycidyl group, and a carboxyl group, $R^7$ and $R^8$ are the same or different from each other and each represent a benzene ring or a naphthalene ring, each of n and o is 0 or 1, each of p and q is an integer of 0 to 20, when the number of each of p methylene groups and q methylene groups is 2 or more, the methylene group may be interrupted by an oxygen atom or a sulfur group, and $B^3$ represents a direct bond, or a group derived from a C6-40 aromatic compound which may be substituted with a C1-20 alkyl group, a phenyl group, a fused ring group, a heterocyclic group, a hydroxy group, an amino group, an ether group, an alkoxy group, a cyano group, a nitro group, or a carboxyl group.

Preferably, in formula (1), $R^1$, $R^2$, $R^3$, or $R^4$ is a hydroxy group or a C1-20 linear, branched, or cyclic alkyl group which may be substituted with a hydroxy group and may be interrupted by an oxygen atom or a sulfur atom.

An example of a film material (n) capable of crosslinking reaction includes an epoxy adduct formed by reacting an epoxy group-containing compound having at least two epoxy groups with an epoxy adduct forming compound having one epoxy adduct reactive group as disclosed in WO 2017/002653 A1.

Examples of such an epoxy adduct include the followings.
Formula (3-1)
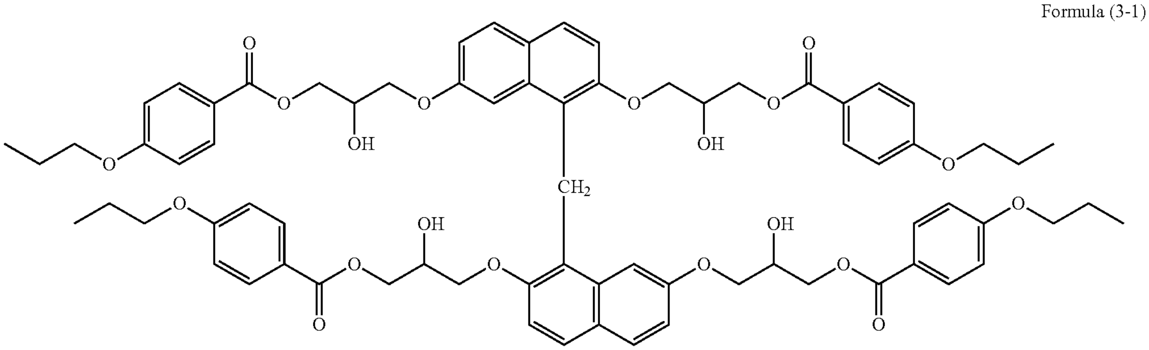
Formula (3-2)
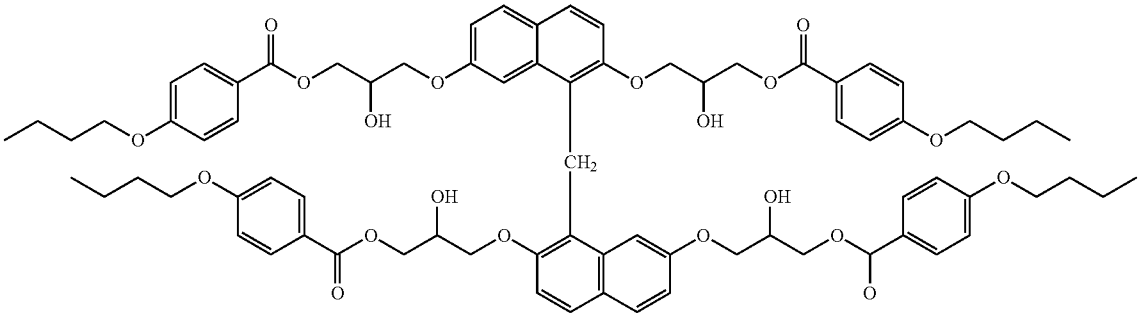
Formula (3-3)
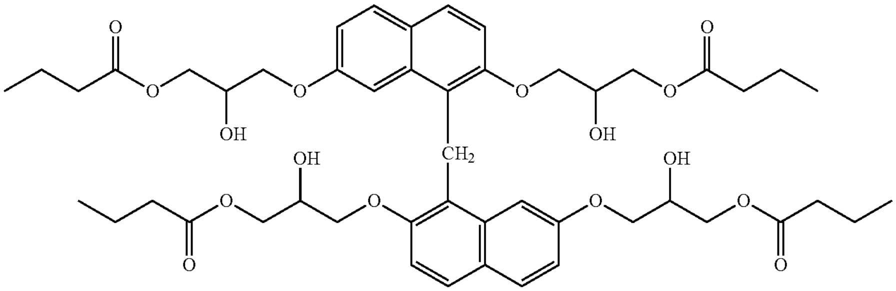
Formula (3-4)
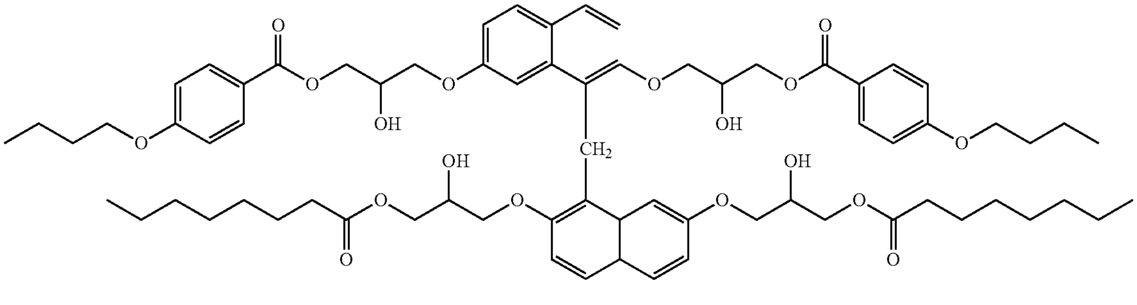

-continued
Formula (3-5)
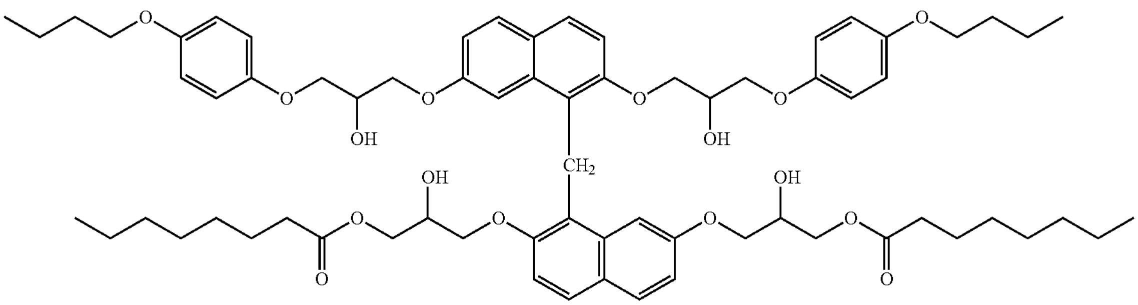
Formula (3-6)
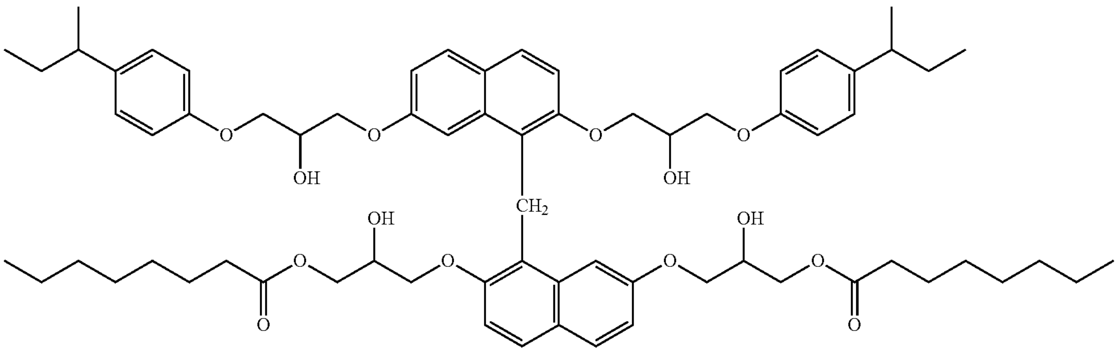
Formula (3-7)
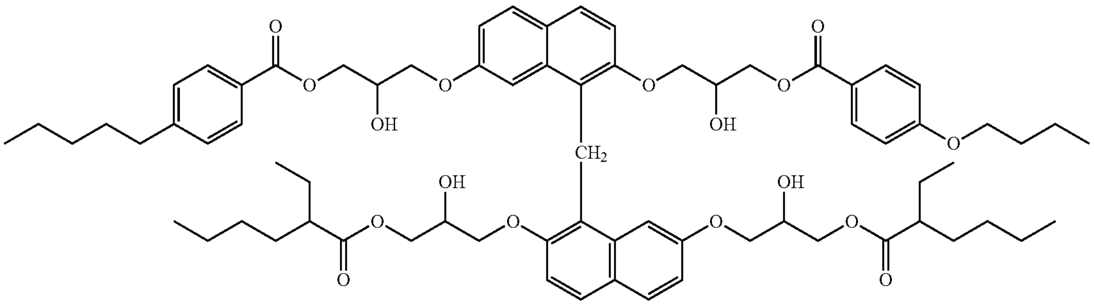
Formula (3-8)
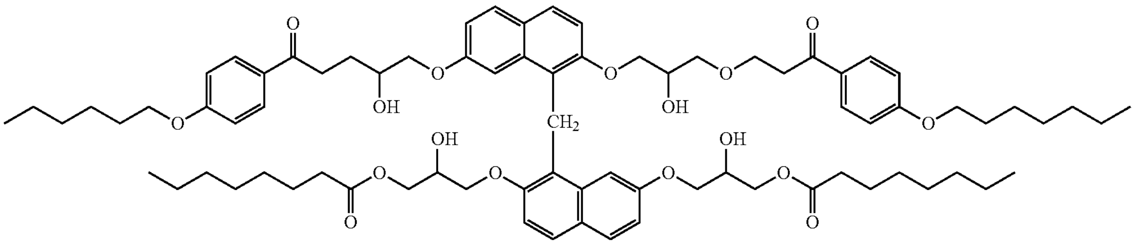
Formula (3-9)
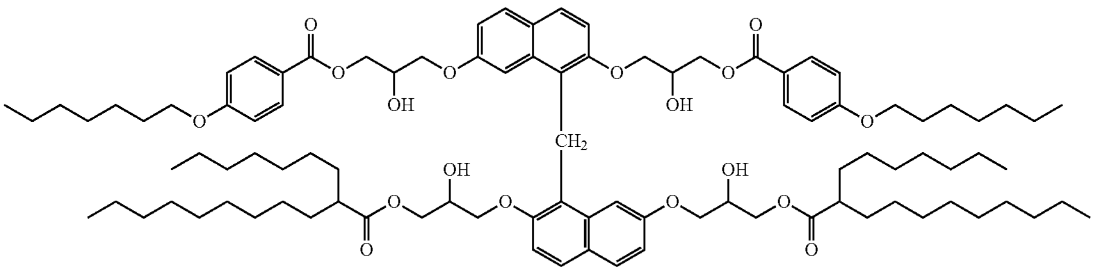

-continued

Formula (3-10)

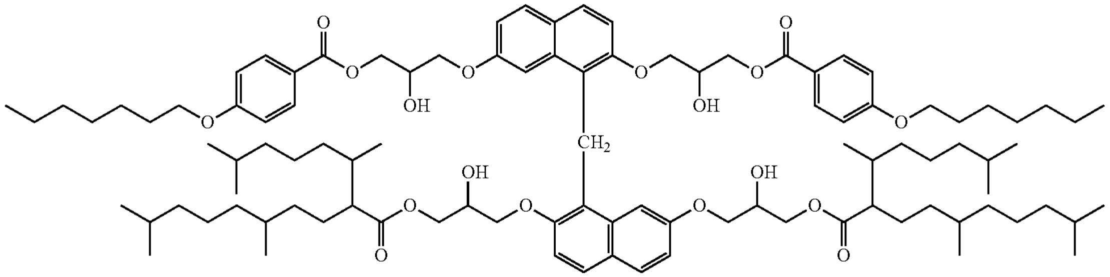

Formula (3-11)

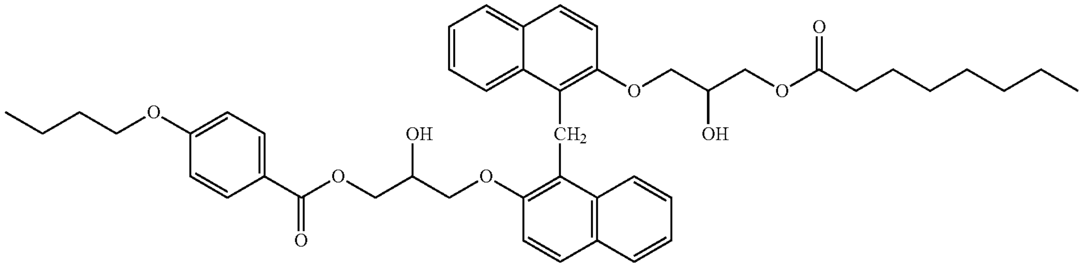

Formula (3-12)

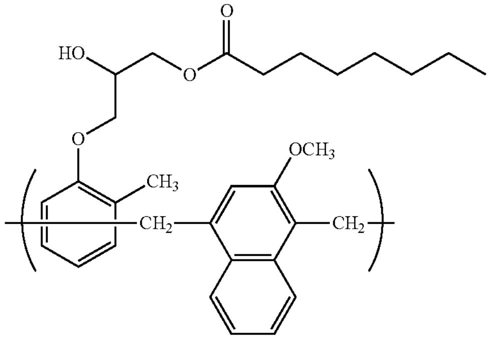

Formula (3-13)

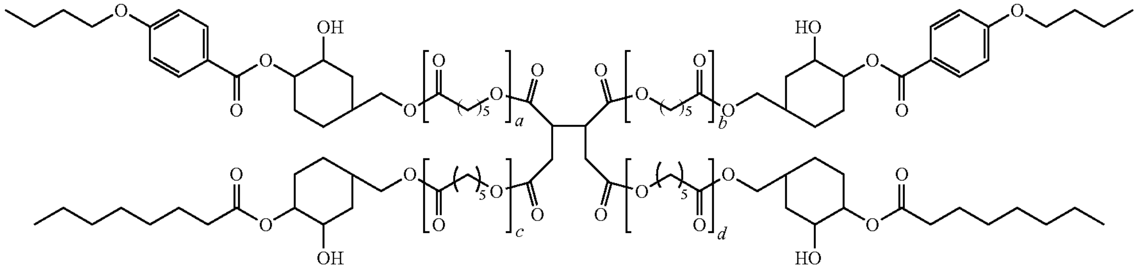

wherein, each of a, b, c, and d is 0 or 1 and a+b+c+d=1.

An example of a film material (o) capable of crosslinking reaction includes a polymer having a structure represented by formula (1) as disclosed in WO 2005/098542 A1:

(1)

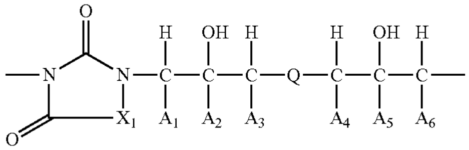

in WO 2005/098542 wherein, each of $A_1$, $A_2$, $A_3$, $A_4$, $A_5$, and $A_6$ represents a hydrogen atom, a methyl group, or an ethyl group; and $X_1$ represents formula (2), (3), (4), or (5) in WO 2005/098542:

(2)

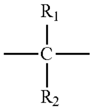

-continued (3)

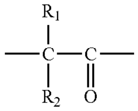

(4)

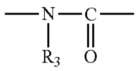

(5)

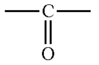

in WO 2005/098542 wherein, each of $R_1$ and $R_2$ represents a hydrogen atom, an alkyl group having 1 to 6 carbon atoms, an alkenyl group having 3 to 6 carbon atoms, a benzyl group, or a phenyl group, in which the phenyl group may be substituted with a group selected from the group consisting of an alkyl group having 1 to 6 carbon atoms, a halogen atom, an alkoxy group having 1 to 6 carbon atoms, a nitro group, a cyano group, a hydroxyl group, and an alkylthio group having 1 to 6 carbon atoms, $R_1$ and $R_2$ may be bonded to each other to form a ring having 3 to 6 carbon atoms; $R^3$ represents an alkyl group having 1 to 6 carbon atoms, an alkenyl group having 3 to 6 carbon atoms, a benzyl group, or a phenyl group, in which the phenyl group may be substituted with a group selected from the group consisting of an alkyl group having 1 to 6 carbon atoms, a halogen atom, an alkoxy group having 1 to 6 carbon atoms, a nitro group, a cyano group, a hydroxyl group, and an alkylthio group having 1 to 6 carbon atoms; and Q represents formula (6) or (7) in WO 2005/098542:

(6)

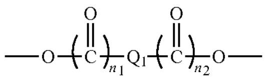

(7)

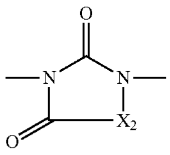

in WO 2005/098542 wherein, $Q_1$ represents an alkylene group having 1 to 10 carbon atoms, a phenylene group, a naphthylene group, or an anthrylene group, in which each of the phenylene group, the naphthylene group, and the anthrylene group may be substituted with a group selected from the group consisting of an alkyl group having 1 to 6 carbon atoms, a halogen atom, an alkoxy group having 1 to 6 carbon atoms, a nitro group, a cyano group, a hydroxyl group, and an alkylthio group having 1 to 6 carbon atoms; each of $n_1$ and $n_2$ represents the number of 0 or 1; and $X_2$ represents formula (2), (3), or (5) in WO 2005/098542.

Preferably, the structure represented by formula (1) in WO 2005/098542 is a structure represented by formula (12) in WO 2005/098542:

(12)

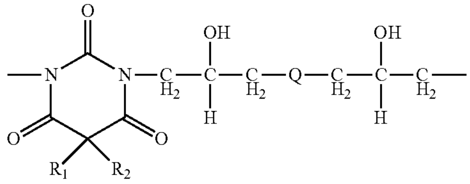

in WO 2005/098542 wherein, $R_1$, $R_2$, and Q are as defined above, or formula (13) in WO 2005/098542:

(13)

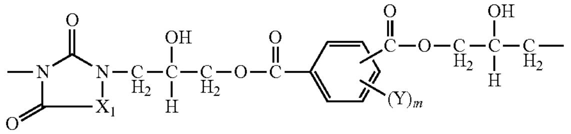

in WO 2005/098542 wherein, $X_1$ is as defined above, Y represents an alkyl group having 1 to 6 carbon atoms, a halogen atom, an alkoxy group having 1 to 6 carbon atoms, a nitro group, a cyano group, a hydroxyl group, or an alkylthio group having 1 to 6 carbon atoms, m represents an integer of 0 to 4; and when m is 2 to 4, Ys may be the same or different from each other.

An example of a film material (p) capable of crosslinking reaction includes a polymer having a repeating unit structure represented by formula (1) or (2) as disclosed in WO 2006/115074 A1:

(1)

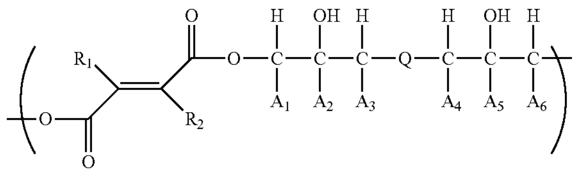

(2)

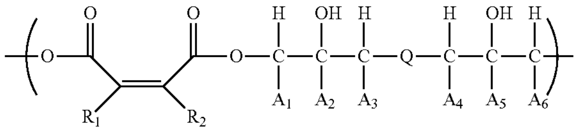

in WO 2006/115074 in WO 2006/115074 wherein, each of $R_1$ and $R_2$ represents a hydrogen atom, a methyl group, an ethyl group, or a halogen atom; each of $A_1$, $A_2$, $A_3$, $A_4$, $A_5$, and $A_6$ represents a hydrogen atom, a methyl group, or an ethyl group; and Q represents formula (3) or (4) in WO 2006/115074:

(3)

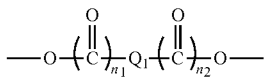

-continued (4)

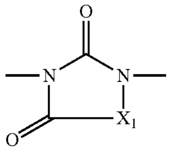

in WO 2006/115074 wherein, $Q_1$ represents an alkylene group having 1 to 15 carbon atoms, a phenylene group, a naphthylene group, or an anthrylene group, in which each of the phenylene group, the naphthylene group, and the anthrylene group may be substituted with a group selected from the group consisting of an alkyl group having 1 to 6 carbon atoms, a halogen atom, an alkoxy group having 1 to 6 carbon atoms, a nitro group, a cyano group, a hydroxyl group, and an alkylthio group having 1 to 6 carbon atoms; each of $n_1$ and $n_2$ represents the number of 0 or 1; and $X_1$ represents formula (5), (6), or (7) in WO 2006/115074, (5)

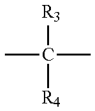

(6)

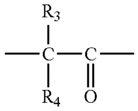

(7)

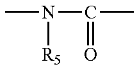

in WO 2006/115074 wherein, each of $R_3$ and $R_4$ represents a hydrogen atom, an alkyl group having 1 to 6 carbon atoms, an alkenyl group having 3 to 6 carbon atoms, a benzyl group, or a phenyl group, in which the phenyl group may be substituted with a group selected from the group consisting of an alkyl group having 1 to 6 carbon atoms, a halogen atom, an alkoxy group having 1 to 6 carbon atoms, a nitro group, a cyano group, a hydroxyl group, and an alkylthio group having 1 to 6 carbon atoms, and $R_3$ and $R_4$ may be bonded to each other to form a ring having 3 to 6 carbon atoms; and $R_5$ represents an alkyl group having 1 to 6 carbon atoms, an alkenyl group having 3 to 6 carbon atoms, a benzyl group, or a phenyl group, in which the phenyl group may be substituted with a group selected from the group consisting of an alkyl group having 1 to 6 carbon atoms, a halogen atom, an alkoxy group having 1 to 6 carbon atoms, a nitro group, a cyano group, a hydroxyl group, and an alkylthio group having 1 to 6 carbon atoms.

Preferably, the polymer is a polymer having a repeating unit structure represented by formula (12) in WO 2006/115074:

(12)

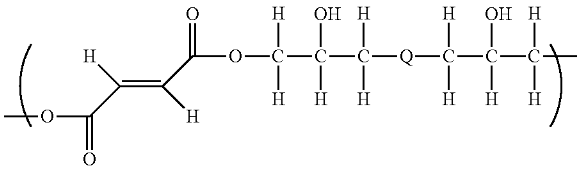

in WO 2006/115074 wherein, Q is as defined above.

Preferably, the polymer is a polymer having a repeating unit structure represented by formula (13) or (14) in WO 2006/115074:

(13)

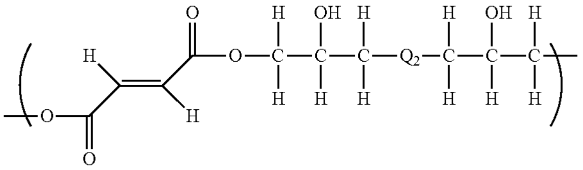

(14)

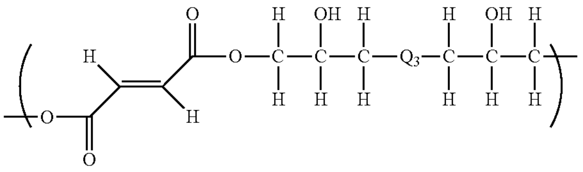

in WO 2006/115074 in WO 2006/115074 wherein, $Q_2$ represents formula (15), (16), or (17) in WO 2006/115074:

(15)

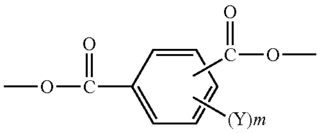

(16)

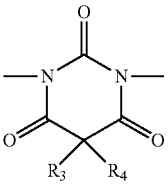

(17)

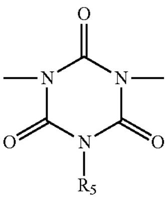

in WO 2006/115074 wherein, Y, m, $R_3$, $R_4$, and $R_5$ are as defined above, and $Q_3$ represents formula (18) in WO 2006/115074:

(18)

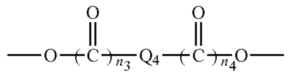

in WO 2006/115074 wherein, $Q_4$ represents an alkylene group having 1 to 15 carbon atoms; and each of $n_3$ and $n_4$ represents the number of 0 or 1.

Examples of a film material (q) capable of crosslinking reaction include polymers having at least one unit structure selected from the group consisting of unit structures represented by the following formulas (1), (2), and (3) as disclosed in WO 2008/069047 A1 and a combination thereof:

Formula (1)

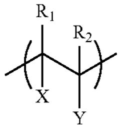

Formula (2)

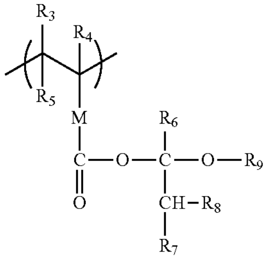

Formula (3)

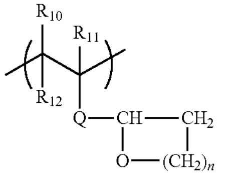

Formula (3)

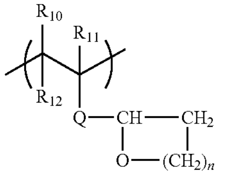

in WO 2008/069047 in WO 2008/069047 in WO 2008/069047 wherein,

X represents a hydrogen atom or an aromatic fused ring,

Y represents an aromatic fused ring, X and Y may be bonded to each other to form a fused ring, each of $R_1$, $R_2$, $R_3$, $R_4$, $R_5$, $R_{10}$, $R_{11}$, and $R_{12}$ represents a hydrogen atom, a halogen atom, or an alkyl group having 1 to 3 carbon atoms, each of $R_6$, $R_7$, and $R_8$ represents a hydrogen atom or a chain or cyclic alkyl group having 1 to 10 carbon atoms, $R_9$ represents a chain or cyclic alkyl group having 1 to 10 carbon atoms or an aromatic group having 6 to 20 carbon atoms, $R_7$ and $R_8$ may be bonded to each other to form a ring, each of M and Q represents a direct bond or a linking group, and n represents an integer of 0 or 1.

An example of the film material (q) includes a polymer, in which 0.3≤a≤0.95, 0.005≤b≤0.7, and 0≤c≤0.45, in which (a) is a ratio of the number of unit structures represented by formula (1) in WO 2008/069047, (b) is a ratio of the number of unit structures represented by formula (2) in WO 2008/069047, and (c) is a ratio of the number of unit structures represented by formula (3) in WO 2008/069047, when a total number of all unit structures constituting the polymer is 1.0.

Preferably, the polymer having unit structures represented by formulas (1) and (2) is a polymer in which 0.305≤a+b≤1, 0.3≤a≤0.95, and 0.005≤b≤0.7, in which (a) is a ratio of the number of unit structures represented by formula (1) in WO 2008/069047 and (b) is a ratio of the number of unit structures represented by formula (2), when a total number of all unit structures constituting the polymer is 1.0.

Preferably, the polymer having unit structures represented by formulas (1) and (3) in WO 2008/069047 is a polymer in which 0.35≤a+c≤1, 0.3≤a≤0.95, and 0.05≤c≤0.7, in which (a) is a ratio of the number of unit structures represented by formula (1) in WO 2008/069047 and (c) is a ratio of the number of unit structures represented by formula (3) in WO 2008/069047, when a total number of all unit structures constituting the polymer is 1.0.

Preferably, the polymer having unit structures represented by formulas (1), (2), and (3) in WO 2008/069047 is a polymer, in which 0.355≤a+b+c≤1, 0.3≤a≤0.9, 0.005≤b≤0.65, and 0.05≤c≤0.65, in which (a) is a ratio of the number of unit structures represented by formula (1), (b) is a ratio of the number of unit structures represented by formula (2) in WO 2008/069047, and (c) is a ratio of the number of unit structures represented by formula (3) in WO 2008/069047, when a total number of all unit structures constituting the polymer is 1.0.

Preferably, the unit structure represented by formula (1) in WO 2008/069047 is a unit structure composed of vinylnaphthalene, acenaphthylene, vinylanthracene, vinylcarbazole, or derivatives thereof.

An example of a film material (r) capable of crosslinking reaction includes compounds represented by the following formula (2) as disclosed in WO 2018/203464 A1:

(2)

Ar—Q—Ar in WO 2018/203464 wherein, two Ars each independently represent an aryl group, in which the aryl group has at least one hydroxy group as a substituent; and Q represents a divalent linking group having at least one benzene ring or naphthalene ring, a methylene group, or a single bond. A molecular weight thereof is, for example, between 150 and 600.

Examples of the aryl group represented by Ar in formula (2) in WO 2018/203464 include a phenyl group, a biphenylyl group, a naphthyl group, an anthryl group, and a phenanthryl group. In addition, in a case where Q represents a divalent linking group having at least one benzene ring or naphthalene ring, examples of the divalent linking group include a divalent group, in which at least one of two hydrogen atoms of a methylene group is substituted with a phenyl group, a biphenyl group, or a naphthyl group, a divalent aromatic group selected from the group consisting of a phenylene group, a biphenylene group, and a naphthylene group, and a divalent group having the divalent aromatic group and a methylene group, an ether group (—O— group), or a sulfide group (—S— group). Examples of the monomer include compounds represented by the following formulas (2-1) to (2-6) in WO 2018/203464.

(2-1)

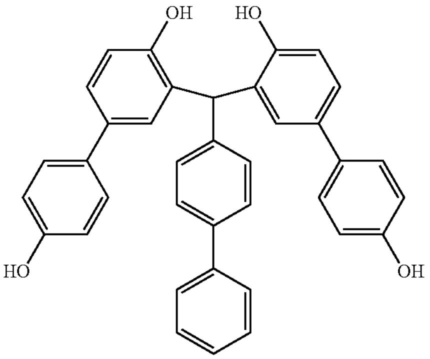

(2-2)

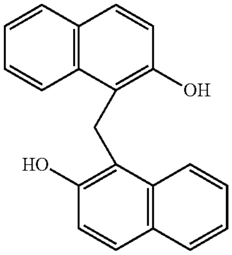

(2-3)

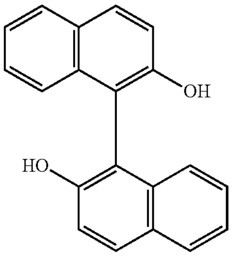

(2-4)

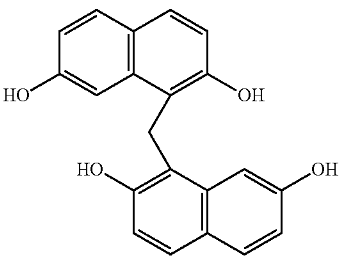

-continued (2-5)

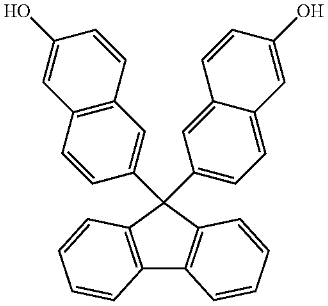

(2-6)

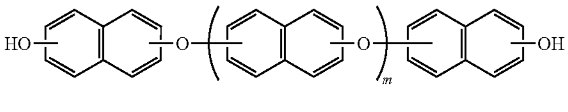

wherein, m represents an integer of 0 to 3.

An example of a film material(s) capable of crosslinking reaction includes a fullerene derivative, to which are added per molecule of the fullerene 1 to 6 molecules of malonic acid diester represented by the following formula (1) as disclosed in WO 2011/108365 A1 and WO 2016/143436 A1:

(1)

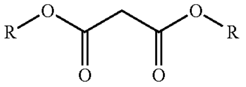

in WO 2011/108365 and WO 2016/143436 wherein, each of R independently represents an alkyl group having 1 to 10 carbon atoms.

An example of a film material (t) capable of crosslinking reaction includes a polyfunctional (meth)acrylate compound having a molecular weight of 300 to 10,000, which is in a liquid state at room temperature and atmospheric pressure as disclosed in WO 2011/132640 A1.

Preferably, the compound is a compound having 2 to 20 (meth)acrylate groups in the molecule.

Preferably, a molecular weight of the compound is 300 to 2,300.

Examples of such a compound include the followings.

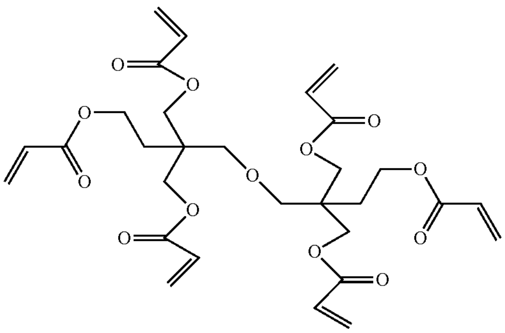

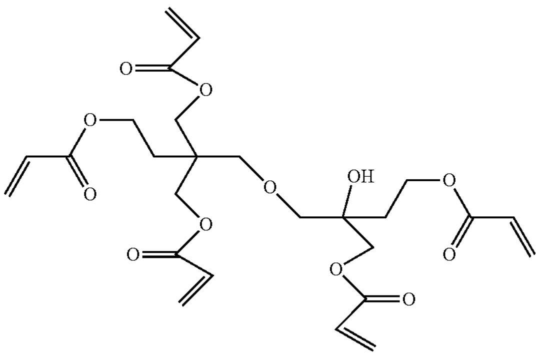

-continued
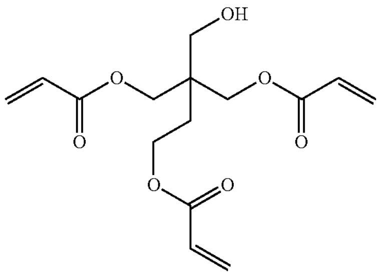
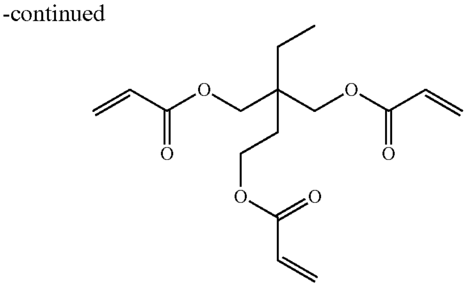
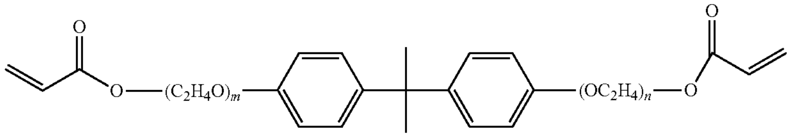
m + n = 4
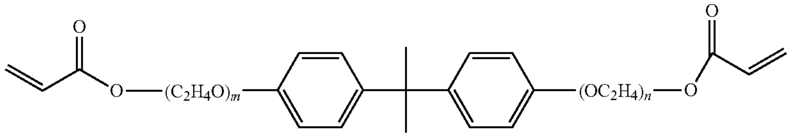
m + n = 10
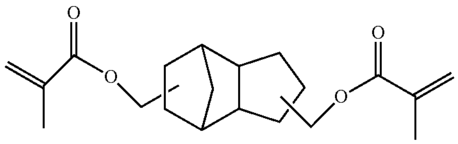
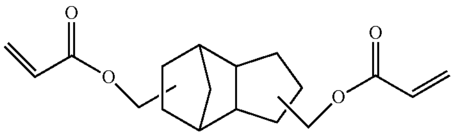
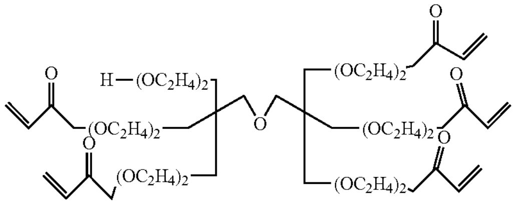
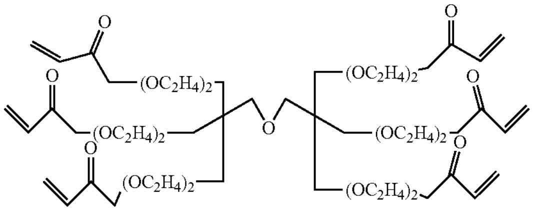
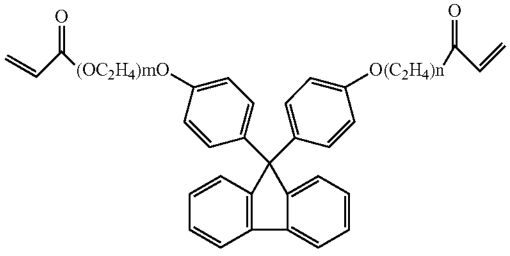
m + n = 2~4
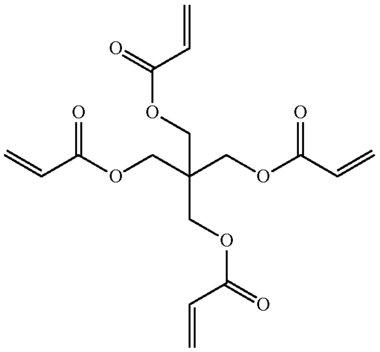
Formula (1-9)
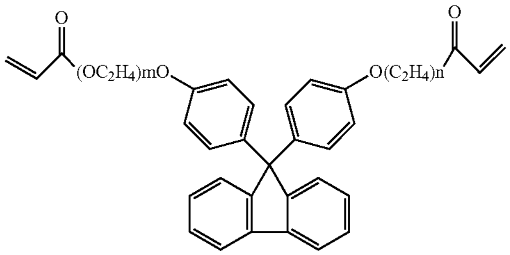
m + n = 2~4
Formula (1-10)
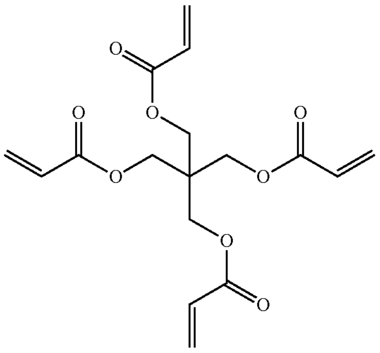

An example of a film material (u) capable of crosslinking reaction includes a compound (E) having a partial structure (I) and a partial structure (II) as disclosed in WO 2017/154921 A1. The partial structure (II) has a hydroxy group generated by reacting an epoxy group with a proton-generating compound; the partial structure (I) is at least one partial structure selected from the group consisting of partial structures represented by the following formulas (1-1) to (1-5) in WO 2017/154921 or a partial structure composed of a combination of a partial structure represented by formula (1-6) and a partial structure represented by formula (1-7) or (1-8) in WO 2017/154921; and the partial structure (II) is a partial structure represented by the following formula (2-1) or (2-2) in WO 2017/154921.

Formula (1-1)

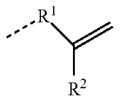

Formula (1-2)

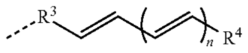

Formula (1-3)

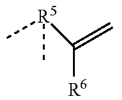

Formula (1-4)

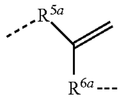

Formula (1-5)

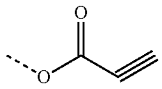

Formula (1-6)

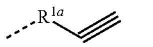

Formula (1-7)

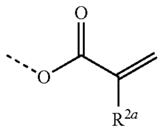

Formula (1-8)

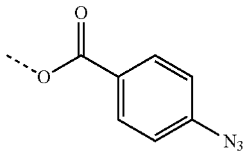

Formula (2-1)

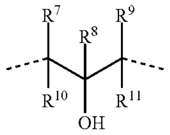

Formula (2-2)

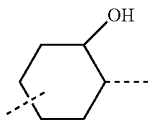

in WO 2017/154921
in WO 2017/154921 in WO 2017/154921
in WO 2017/154921
in WO 2017/154921 in WO 2017/154921 in WO 2017/154921
in WO 2017/154921 in WO 2017/154921 wherein, each of $R^1$, $R^{1a}$, $R^3$, $R^5$, $R^{5a}$, and $R^{6a}$ represents a saturated hydrocarbon group having 1 to 10 carbon atoms, an aromatic hydrocarbon group having 6 to 40 carbon atoms, an oxygen atom, a carbonyl group, a sulfur atom, a nitrogen atom, an amide group, an amino group, or a group composed of a combination thereof; each of $R^2$, $R^{2a}$, $R^4$, and $R^6$ represents a hydrogen atom, a saturated hydrocarbon group having 1 to 10 carbon atoms, an unsaturated hydrocarbon group having 2 to 10 carbon atoms, an oxygen atom, a carbonyl group, an amide group, an amino group, or a group composed of a combination thereof; each of $R^2$, $R^{2a}$, $R^4$, and $R^6$ represents a monovalent group; each of $R^1$, $R^{1a}$, $R^3$, $R^{5a}$, and $R^{6a}$ represents a divalent group; $R^5$ represents a trivalent group; each of $R^7$, $R^8$, $R^9$, $R^{10}$, and $R^{11}$ represents a hydrogen atom or a saturated hydrocarbon group having 1 to 10 carbon atoms; n represents the number of repeating units of 1 to 10, and the dotted line represents a chemical bond to an adjacent atom.

Preferably, the compound (E) has an epoxy group and a hydroxy group in a molar ratio in which 0≤(epoxy group)/(hydroxy group)≤0.5 and has a partial structure (II) in a molar ratio: 0.01≤(partial structure (II))/(partial structure (I)+partial structure (II))≤0.8.

Preferably, the compound (E) is a compound having at least one partial structure (I) and at least one partial structure (II).

Preferably, each of $R^{5a}$ and $R^{6a}$ is an alkylene group having 1 to 10 carbon atoms, an arylene group having 6 to 40 carbon atoms, an oxygen atom, a carbonyl group, a sulfur atom, or a divalent group composed of a combination thereof.

Preferably, the compound (E) has the partial structure (I) and the partial structure (II) in a ratio of 1 to 1,000.

An example of a film material (v) capable of crosslinking reaction includes a compound having at least one photodegradable nitrogen-containing structure and/or photodegradable sulfur-containing structure and a hydrocarbon structure as disclosed in WO 2018/030198 A1.

Preferably, the compound is a compound having one or more photodegradable nitrogen-containing structures and/or photodegradable sulfur-containing structures in the molecule.

Preferably, the compound is a compound, in which a photodegradable nitrogen-containing nitrogen structure and/or a photodegradable sulfur-containing structure and a hydrocarbon structure are present in the same molecule, or a combination of compounds, in which the structures are present in different molecules. Preferably, the hydrocarbon structure is a saturated or unsaturated group having 1 to 40 carbon atoms or a linear, branched, or cyclic hydrocarbon group.

Preferably, the photodegradable nitrogen-containing structure is a structure, in which a reactive nitrogen-containing functional group or a reactive carbon functional group is generated by irradiation with ultraviolet rays, or a structure having a reactive nitrogen-containing functional group or a reactive carbon-containing functional group generated by irradiation of ultraviolet rays.

Preferably, the photodegradable nitrogen-containing structure is a photodegradable nitrogen-containing structure, which may have a sulfur atom; and the structure includes an azide structure, a tetrazole structure, a triazole structure, an imidazole structure, a pyrazole structure, an azole structure, a diazo structure, and a combination of these structures.

Preferably, the photodegradable sulfur-containing structure is a structure, in which an organic sulfur radical or a carbon radical is generated by irradiation with ultraviolet rays, or a structure having an organic sulfur radical or a carbon radical generated by irradiation of ultraviolet rays.

Preferably, the photodegradable sulfur-containing structure is a photodegradable sulfur-containing structure, which may have a nitrogen atom; and the structure includes a trisulfide structure, a disulfide structure, a sulfide structure, a thioketone structure, a thiophene structure, a thiol structure, or a combination of these structures.

Preferably, examples of the film material (v) include the following compounds.

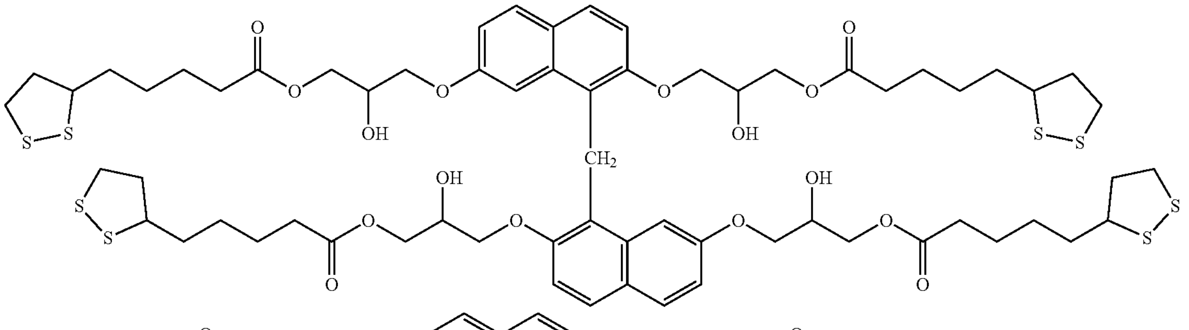

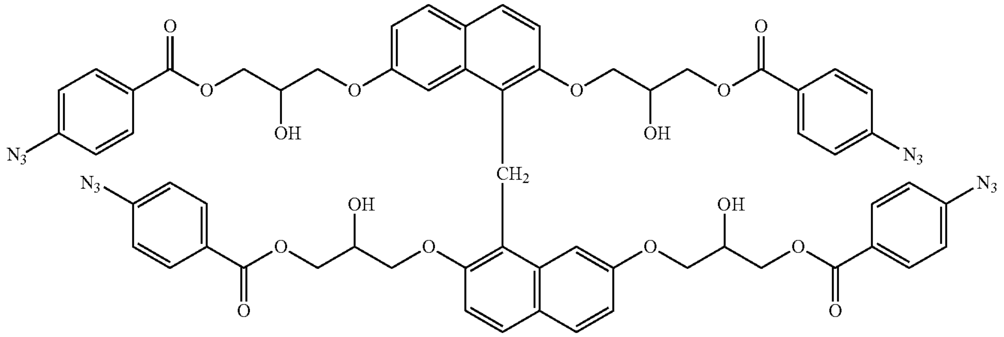

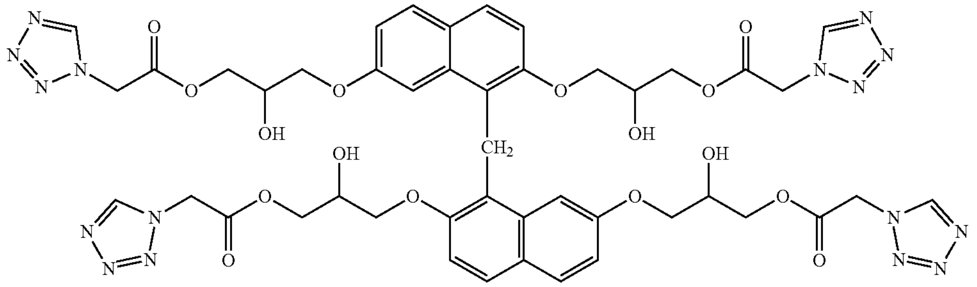

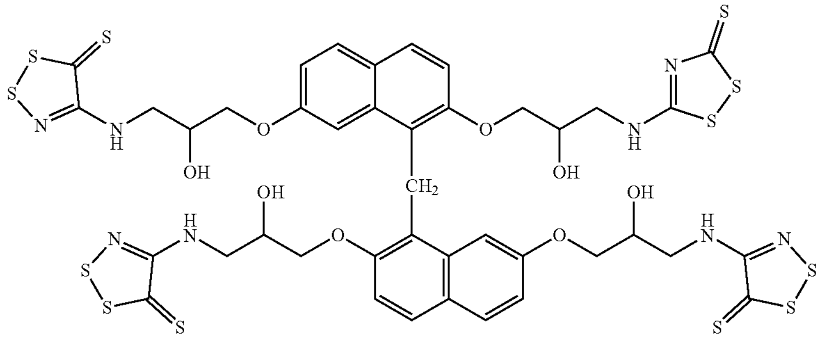

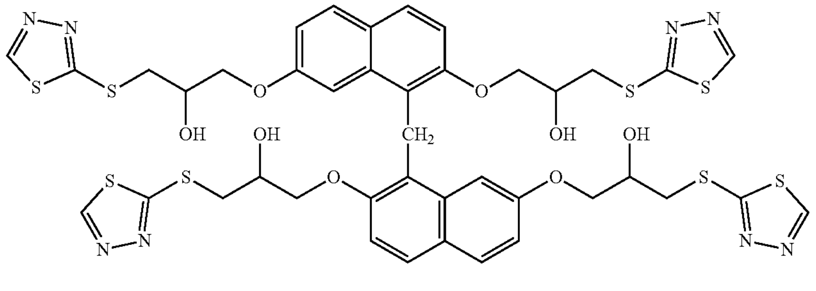

-continued

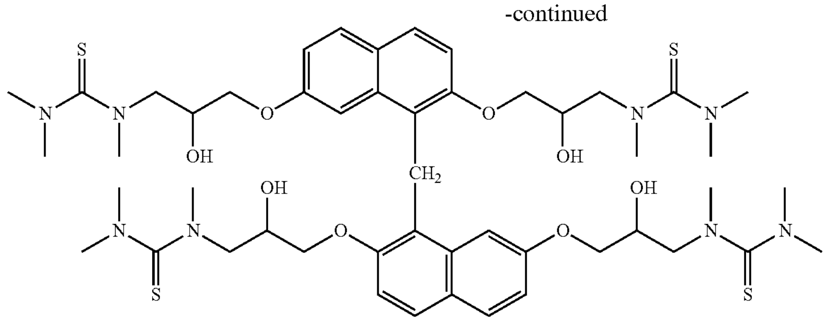

An example of a film material (w) capable of crosslinking reaction includes a compound represented by the following formula (1) as disclosed in WO 2019/013293 A1.

(1)

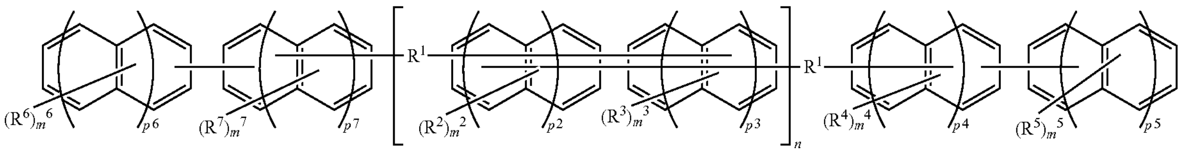

in WO 2019/013293 wherein, $R^1$s are each independently a divalent group having 1 to 30 carbon atoms; $R^2$ to $R^7$ are each independently a linear, branched, or cyclic alkyl group having 1 to 10 carbon atoms, an aryl group having 6 to 10 carbon atoms, an alkenyl group having 2 to 10 carbon atoms, a thiol group, or a hydroxyl group; at least one of $R^1$s is a hydroxyl group or a thiol group; $m^2$, $m^3$, and me are each independently an integer of 0 to 9; $m^4$ and $m^7$ are each independently an integer of 0 to 8; $m^5$ is an integer of 1 to 9; n is an integer of 0 to 4; and $p^2$ to $p^7$ are each independently an integer of 0 to 2.

Preferably, examples of the film material (v) include the following compounds.

in WO 2019/013293

An example of a film material (x) capable of crosslinking reaction includes a compound represented by the following general formula (1) as disclosed in JP 2016-216367 A.

(1)

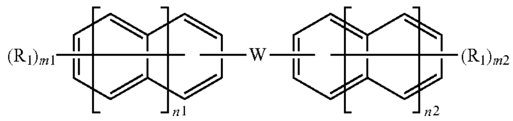

(5)

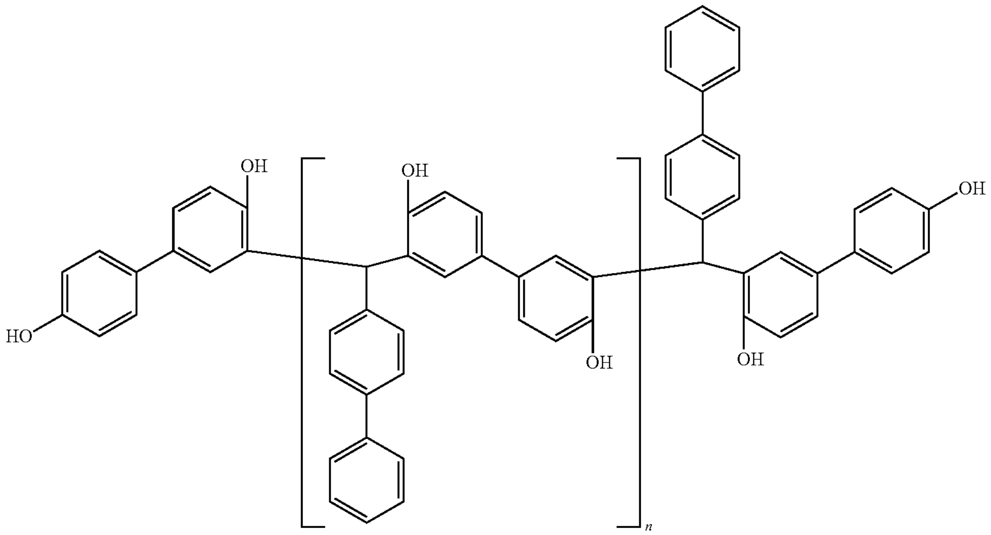

n = 0(61%), n = 1(25%), n = 2(9%), n = 4(5%)

in JP 2106-216367 wherein, n1 and n2 each independently represent 0 or 1; W is a single bond or a structure represented by the following formula (2) in JP 2016-216367; $R_1$ is a structure represented by the following general formula (3) in JP 2016-216367; m1 and m2 each independently represent an integer of 0 to 7; and m1+m2 is 1 or more and 14 or less, (2)

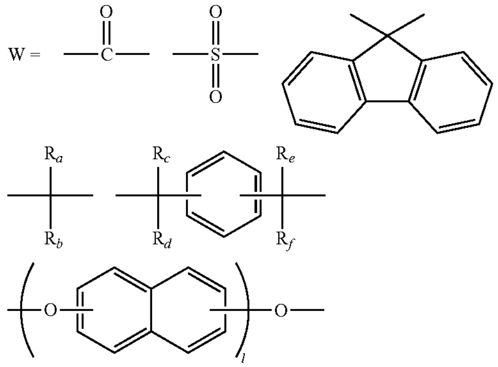

in JP 2106-216367 wherein, l represents an integer of 0 to 3; Ra to Rf each independently represent a hydrogen atom, or an alkyl group having 1 to 10 carbon atoms, a phenyl group, or a phenylethyl group, which may be substituted with fluorine, and Ra and Rb may be bonded to form a cyclic compound, (3)

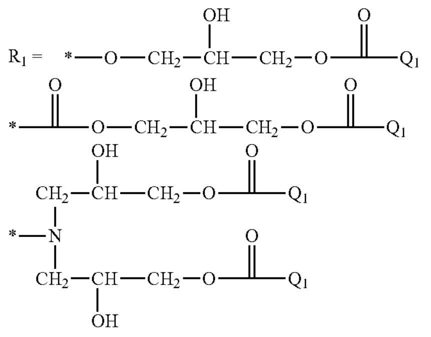

in JP 2106-216367 wherein, * represents a bonding site to an aromatic ring; $Q_1$ represents a linear or branched and saturated or unsaturated hydrocarbon group having 1 to 30 carbon atoms, an alicyclic group having 4 to 20 carbon atoms, or a substituted or unsubstituted phenyl group, naphthyl group, anthracenyl group, or pyrenyl group, and in a case where $Q_1$ represents a linear or branched and saturated or unsaturated hydrocarbon group having 1 to 30 carbon atoms, a methylene group constituting $Q_1$ may be substituted with an oxygen atom or a carbonyl group.

Preferably, the compound represented by general formula (1) is a compound represented by the following general formula (4) in JP 2016-216367.

(4)

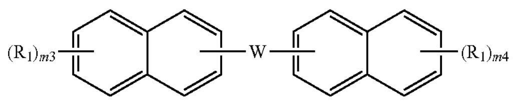

in JP 2106-216367 wherein, each of m3 and m4 represents 1 or 2 and W and $R_1$ are as defined above.

Preferably, W is a single bond or a structure represented by the following formula (5) in JP 2016-216367.

(5)

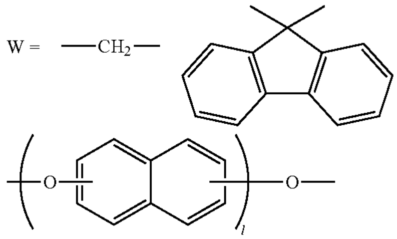

in JP 2106-216367 wherein, l is as defined above.

Preferably, the compound represented by general formula (1) has one or more structures represented by the following general formula (6) in JP 2016-216367 in which two or more $Q_1$s are present in the molecule and one or more structures represented by the following general formula (7) in JP 2016-216367.

$$**—R_h \quad (6) \text{ in JP 2106-216367}$$

wherein, ** represents a bonding site to a carbonyl group; $R_h$ represents a linear or branched and saturated or unsaturated hydrocarbon group having 1 to 30 carbon atoms, and a methylene group constituting $R_h$ may be substituted with an oxygen atom or a carbonyl group, (7)

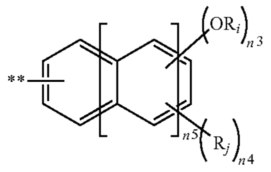

in JP 2106-216367 wherein, ** represents a bonding site to a carbonyl group; $R_i$ represents a hydrogen atom or a linear or branched hydrocarbon group having 1 to 10 carbon atoms; $R_j$ represents a linear or branched hydrocarbon group having 1 to 10 carbon atoms, a halogen atom, a nitro group, an amino group, a nitrile group, an alkoxycarbonyl group having 1 to 10 carbon atoms, or an alkanoyloxy group having 1 to 10 carbon atoms; each of n3 and n4 represents the number of substituents in the aromatic ring and represents an integer of 0 to 7, n3+n4 is 0 or more and 7 or less; and n5 represents 0 to 2.

An example of a film material (y) capable of crosslinking reaction includes a compound represented by the following general formula (1A) as disclosed in JP 2017-119670 A.

$$R\text{-}(R_1)_{(m1+m2)} \quad (1A)$$

wherein, in a case where R is a single bond, an organic group having 1 to 50 carbon atoms, an ether bond, a —SO— group, or a —$SO_2$— group, $R_1$ is a group represented by the following general formula (1B) in JP 2017-119670, and each of m1 and m2 is an integer satisfying 1≤m1≤5, 1≤m2≤5, and 2≤m1+m2≤8, $$—R_1 = —X^1—X \quad (1B)$$

wherein, $X^1$ is a group represented by the following general formula (1C) in JP 2017-119670 and X is a group represented by the following general formula (1D) in JP 2017-119670, (1C)

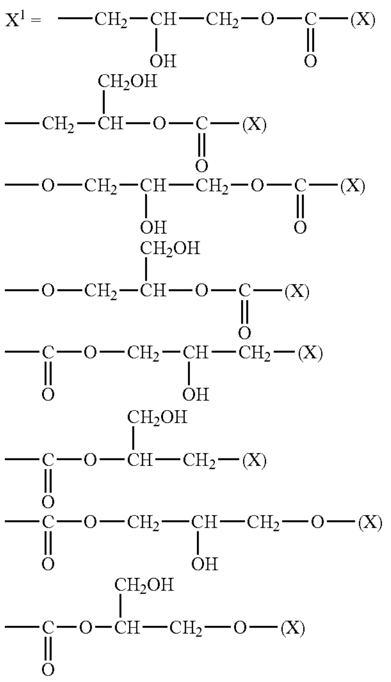

wherein, (X) represents a bonding site to X, (1D)

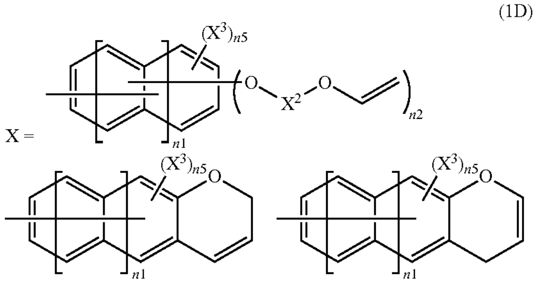

-continued

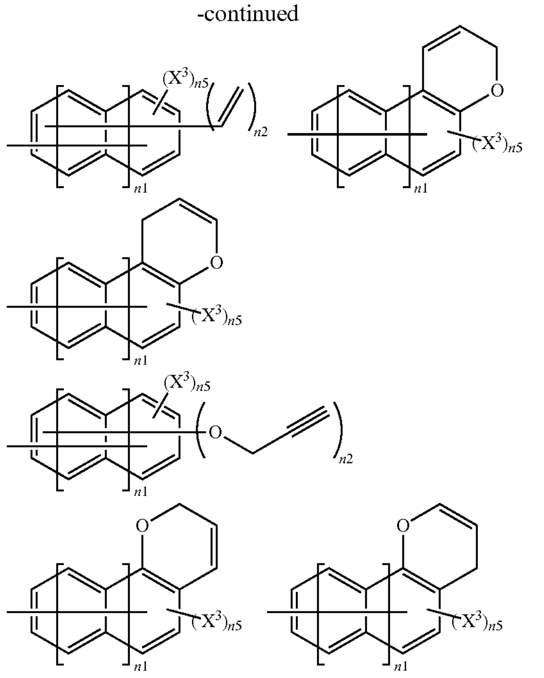

wherein, $X^2$ is a divalent organic group having 1 to 10 carbon atoms; n1 is 0 or 1, n2 is 1 or 2; $X^3$ is a group represented by the following general formula (1E) in JP 2017-119670; and n5 is 0, 1, or 2, (1E)

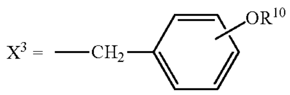

wherein, $R^{10}$ is a hydrogen atom or a saturated or unsaturated hydrocarbon group having 1 to 10 carbon atoms, and the hydrogen atom in the benzene ring in the formula may be substituted with a methyl group or a methoxy group.

Preferably, a molecular weight of the compound is 2,500 or less.

Preferably, the compound is a compound represented by the following general formula (2A) in JP 2017-119670 or a compound represented by the following general formula (3A) in JP 2017-119670.

$$R\text{-}(R_2)_{(m3+m4)} \quad (2A)$$

wherein, in a case where R is a single bond, an organic group having 1 to 50 carbon atoms, an ether bond, a —SO— group, or a —$SO_2$— group; $R_2$ is a group represented by the following general formula (2B) in JP 2017-119670; and each of m3 and m4 is an integer satisfying 1≤m3≤5, 1≤m4≤5, and 2<m3+m4≤8, $$—R_2=—X^{11}—X' \quad (2B)$$

wherein, $X^{11}$ is a group represented by the following general formula (2C) in JP 2017-119670 and X' is a group represented by the following general formula (2D) in JP 2017-119670, (2C)

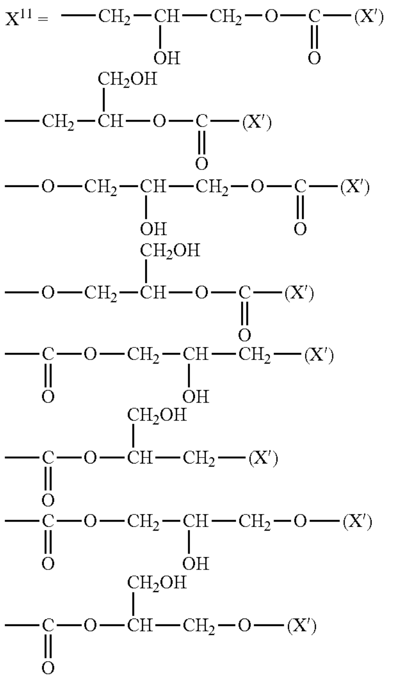

wherein, (X') represents a bonding site to X', (2D)

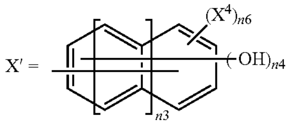

wherein, n3 is 0 or 1; n4 is 1 or 2; $X^4$ is a group represented by the following general formula (2E) in JP 2017-119670; and n6 is 0, 1, or 2, (2E)

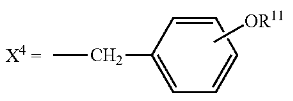

wherein, $R^{11}$ is a hydrogen atom or a saturated or unsaturated hydrocarbon group having 1 to 10 carbon atoms, and the hydrogen atom in the benzene ring in the formula may be substituted with a methyl group or a methoxy group, wherein, $R^{101}$, $R^{102}$, $R^{103}$, and $R^{104}$ are each independently a hydroxyl group; m100 is 1, 2, or 3; $R^{100}$ is a hydrogen atom or a hydroxyl group when m100 is 1, $R^{100}$ is a single bond or a group represented by the following general formula (3B) in JP 2017-119670 when m100 is 2, $R^{100}$ is a group represented by the following general formula (3C) in JP 2017-119670 when m100 is 3; and the hydrogen atom in the aromatic ring in the formula may be substituted with a methyl group or a methoxy group; m101 is 0 or 1, m102 is 1 or 2, m103 is 0 or 1, m104 is 1 or 2, and m105 is 0 or 1; when m101 is 0, each of n101 and n102 is an integer satisfying $0 \leq n101 \leq 3$, $0 \leq n102 \leq 3$, and $1 \leq n101+n102 \leq 4$; and when m101 is 1, each of n101, n102, n103, and n104 is an integer satisfying $0 \leq n101 \leq 2, 0 \leq n102 \leq 2, 0 \leq n103 \leq 2, 0 \leq n104 \leq 2$, and $2 \leq n101+n102+n103+n104 \leq 8$, (3B)

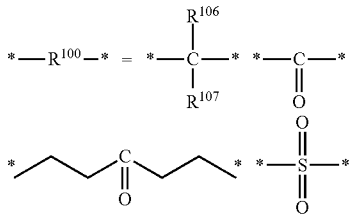

wherein, * represents a bonding site; each of $R^{106}$ and $R^{107}$ is a hydrogen atom or an organic group, which does not have an ester bond having 1 to 24 carbon atoms; and $R^{106}$ and $R^{107}$ may be bonded to form a cyclic structure, (3C)

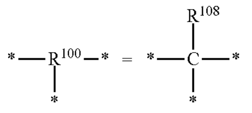

wherein, * represents a bonding site, and $R^{108}$ is a hydrogen atom or an organic group having 1 to 15 carbon atoms.

An example of a polyether film material (z) includes a polymer represented by the following general formula (1) as disclosed in WO 2012/050064.

The polyether film material is a polymer having a unit structure represented by the following formula (1) in WO 2012/050064:

(3A)

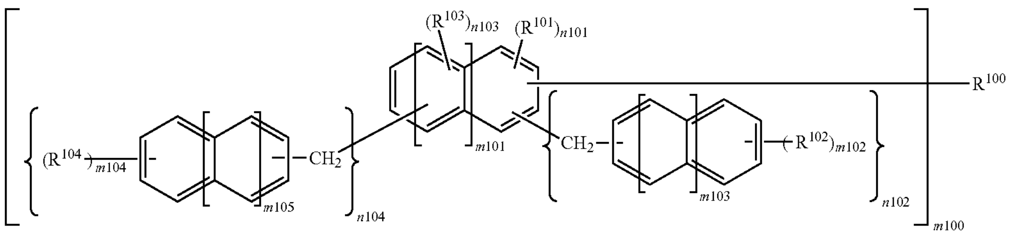

Formula (1)

$$-\!\!(O-Ar_1)\!\!-$$

in WO 2012/050064 wherein, $Ar_1$ represents an arylene group having 6 to 50 carbon atoms or an organic group having a heterocyclic group, a unit structure represented by the following formula (2):

Formula (2)

$$-\!\!(O-Ar_2-O-Ar_3-T-Ar_4)\!\!-$$

in WO 2012/050064 wherein, each of $Ar_2$, $Ar_3$, and Ara represents an arylene group having 6 to 50 carbon atoms or an organic group having a heterocyclic group, and T represents a carbonyl group or a sulfonyl group, or a combination of a unit structure represented by formula (1) in WO 2012/050064 and a unit structure represented by formula (2) in WO 2012/050064.

The film material (B) capable of crosslinking reaction preferably includes at least one selected from the group consisting of a film material (B1) containing an aliphatic ring (for example, (a) and (m)), a novolac film material (B2) (for example, (b), (c), (d), (c), (f), (g), (h), (i), (j), (k), and (l)), a polyether film material (B3) (for example, (z)), a polyester film material (B4) (for example, (o) and (p)), a compound (B5) different from the crosslinkable compound (A) (for example, (m), (n), (r), (s), (t), (u), (v), (w), (x), and (y)), a film material containing an aromatic fused ring (B6) (for example, (q)), an acrylic resin (B7), and a methacrylic resin (B8).

In a case where the resist underlayer film-forming composition according to the present invention contains a film material (B) capable of crosslinking reaction (a film material or a polymer), a content of the film material (B) capable of crosslinking reaction is generally within the range of 1 to 99.9% by mass, preferably 50 to 99.9% by mass, more preferably 50 to 95% by mass, and still more preferably 50 to 90% by mass, relative to a total solid content.

[Acid Catalyst (C)]

The acid catalyst optionally contained in the resist underlayer film-forming composition according to the present invention is not particularly limited as long as it is a catalyst for promoting the reaction of the crosslinkable compound (A) and the film material (B) capable of crosslinking reaction.

Examples of the acid catalyst include sulfonic acid compounds and carboxylic acid compounds, such as pyridinium p-toluenesulfonate, pyridinium p-hydroxybenzenesulfonate, pyridinium trifluoromethanesulfonate, p-toluenesulfonic acid, p-hydroxybenzenesulfonic acid, trifluoromethanesulfonic acid, salicylic acid, camphorsulfonic acid, 5-sulfosalicylic acid, chlorobenzenesulfonic acid, methyl 4-phenolsulfonate, benzenesulfonic acid, naphthalenesulfonic acid, citric acid, and benzoic acid; quaternary ammonium salts of trifluoromethanesulfonic acid, such as K-PURE [registered trademark] TAG2689, TAG2690, TAG2678, and CXC-1614 (manufactured by King Industries Inc.); and thermal acid generators such as 2,4,4,6-tetrabromocyclohexadienone, benzoin tosylate, 2-nitrobenzyl tosylate, and other organic sulfonic acid alkyl esters.

As the acid generator, the following thermal acid generator or photoacid generator may also be used.

Examples of the thermal acid generator include K-PURE [registered trademark] CXC-1612, TAG-2172, TAG-2179, and TAG2700 (manufactured by King Industries Inc.), SI-45, SI-60, SI-80, SI-100, SI-110, and SI-150 (manufactured by SANSHIN CHEMICAL INDUSTRY CO., LTD.), quaternary ammonium salts of trifluoroacetate, and organic sulfonic acid alkyl esters.

Examples of the onium salt compound include iodonium salt compounds such as diphenyliodoniumhexafluorophosphate, diphenyliodoniumtrifluoromethanesulfonate, diphenyliodoniumnonafluoro n-butane sulfonate, diphenyliodoniumperfluoro n-octane sulfonate, diphenyliodoniumcamphorsulfonate, bis(4-tert-butylphenyl)iodoniumcamphorsulfonate, and bis(4-tert-butylphenyl) iodoniumtrifluoromethanesulfonate; and sulfonium salt compounds such as triphenylsulfoniumhexafluoroantimonate, triphenylsulfoniumnonafluoro n-butane sulfonate, triphenylsulfoniumcamphorsulfonate, and triphenylsulfoniumtrifluoromethanesulfonate.

Examples of the sulfonimide compound include N-(trifluoromethanesulfonyloxy) succinimide, N-(nonafluoro n-butanesulfonyloxy) succinimide, N-(camphorsulfonyloxy) succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These acid catalysts may be used each alone or in combination of two or more thereof. In addition, pyridinium p-hydroxybenzenesulfonate is preferred for the acid catalyst.

An unreacted acid or catalyst and an ion exchange resin for a catalyst to prevent a residue of an inactivated catalyst or the like may be used for a reaction system. As the ion exchange resin for a catalyst, for example, a sulfonic acid-based strong acid ion exchange resin may be used.

In a case where the resist underlayer film-forming composition according to the present invention contains an acid catalyst, the acid catalyst is contained in an amount of, for example, 1% by mass to 30% by mass, and preferably 5% by mass to 15% by mass, relative to a content of the crosslinking agent.

Solvent (D)

In the resist underlayer film-forming composition according to the present invention, a solvent for dissolving the crosslinkable compound (A), the film material (B) capable of crosslinking reaction, which is an optional component, the acid catalyst (C), and other components is not particularly limited as long as it is a solvent capable of uniformly dissolving these components.

Examples thereof include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monoethyl ether, propylene glycol monomethyl ether, propylene glycol monomethyl ether acetate, propropylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more thereof.

Among these solvents, propylene glycol monomethyl ether, propylene glycol monomethyl ether acetate, ethyl lactate, butyl lactate, and cyclohexanone are preferred. Diverting of the solvent used for preparing the crosslinkable compound (A) or the film material (B) capable of crosslinking reaction as it is as a solvent contributes to effective use of resources, which is useful.

In addition, a solvent having a high boiling point, such as propylene glycol monobutyl ether and propylene glycol monobutyl ether acetate may be mixed with these solvents.

The amount of solvent is selected so that a solid content of the resist underlayer film-forming composition according to the present invention ranges preferably 0.1 to 70% by mass, and more preferably 0.1 to 60% by mass. The solid content refers to a content of all components excluding the solvent from the resist underlayer film-forming composition.

[Other Components]

In addition to the above components, a surfactant, a rheology modifier, an adhesion assistant, a light absorber, or the like may be added to the resist underlayer film-forming composition according to the present invention.

The resist underlayer film-forming composition according to the present invention may contain a surfactant for improving applicability to a semiconductor substrate as an optional component. Examples of the surfactant include nonionic surfactants such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan triolcate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as EFTOP [registered trademark] EF301, EF303, and EF352 (manufactured by Mitsubishi Materials Electronic Chemicals Co., Ltd.), MEGAFACE [registered trademark] F171, F173, R-30, R-30N, R-40, and R-40-LM (manufactured by DIC Corporation), Fluorad FC430 and FC431 (manufactured by Sumitomo 3M Limited), AsahiGuard [registered trademark] AG710 and Surflon [registered trademark] S-382, SC101, SC102, SC103, SC104, SC105, and SC106 (manufactured by AGC Inc.); and Organosiloxane polymer KP341 (manufactured by Shin-Etsu Chemical Co., Ltd.). These surfactants may be used each alone or in combination of two or more thereof. A blending amount of these surfactants is usually 2.0% by mass or less, and preferably 1.0% by mass or less, relative to the total solid content of the resist underlayer film-forming composition of the present invention. These surfactants may be added each alone or in combination of two or more thereof.

The rheology modifier is added mainly to improve fluidity of the resist underlayer film-forming composition, and in particular, to improve thickness uniformity of the resist underlayer film or to enhance filling properties of the resist underlayer film-forming composition into holes in a baking step. Specific examples thereof include phthalic acid derivatives such as dimethyl phthalate, diethyl phthalate, diisobutyl phthalate, dihexyl phthalate, and butylisodecyl phthalate; adipic acid derivatives such as di-n-butyl adipate, diisobutyl adipate, diisooctyl adipate, and octyldecyl adipate; maleic acid derivatives such as di-n-butyl maleate, diethyl maleate, and dinonyl maleate; oleic acid derivatives such as methyl oleate, butyl olcate, and tetrahydrofurfuryl oleate; and stearic acid derivatives such as n-butyl stearate and glyceryl stearate. These rheology modifiers are usually blended in a ratio of less than 30% by mass relative to the total solid content of the resist underlayer film-forming composition.

The adhesion assistant is mainly added to improve adhesion of the resist underlayer film-forming composition to a substrate or a resist, and in particular, to prevent peeling off of the resist during development. Specific examples thereof include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltricthoxylsilane; silazanes such as hexamethyldisilazane, N,N'-bis(trimethylsilyl) urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea such as 1,1-dimethyl urea and 1,3-dimethyl urea or thiourea compounds. These adhesion assistants are usually blended in a ratio of less than 5% by mass, and preferably less than 2% by mass, relative to the total solid content of the resist underlayer film-forming composition for lithography.

As the light absorber, commercially available light absorbers described in "Technique and Market of Industrial Pigments" (CMC Publishing Co., Ltd.) or "Dye Handbook" (edited by The Society of Synthetic Organic Chemistry, Japan), such as C.I.Disperse Yellow 1, 3, 4, 5, 7, 8, 13, 23, 31, 49, 50, 51, 54, 60, 64, 66, 68, 79, 82, 88, 90, 93, 102, 114 and 124; C.I. Disperse Orange 1, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.I. Disperse Violet 43; C.I. Disperse Blue 96; C.I. Fluorescent Brightening Agent 112, 135 and 163; C.I. olvent Orange 2 and 45; C.I. Solvent Red 1, 3, 8, 23, 24, 25, 27 and 49; C.I. Pigment Green 10; and C.I. Pigment Brown 2, may be suitably used. The light absorber is usually blended in a ratio of 10% by mass or less, and preferably 5% by mass or less, relative to the total solid content of the resist underlayer film-forming composition.

In addition, the resist underlayer film-forming composition according to the present invention may contain a crosslinking agent other than the crosslinkable compound represented by formula (I). Examples of such a crosslinking agent include a melamine-based crosslinking agent, a substituted urea-based crosslinking agent, and a polymer-based crosslinking agent thereof. Preferably, the crosslinking agent is a crosslinking agent having at least two crosslink forming substituents, which is a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or butoxymethylated thiourea. In addition, condensates of these compounds may also be used.

In addition, the resist underlayer film-forming composition may contain the following crosslinking agent other than the crosslinkable compound represented by formula (I). As the crosslinking agent, a crosslinkable compound having at least two crosslink forming substituents is preferably used. Examples thereof include a melamine-based compound, a substituted urea-based compound, a phenol-based compound having a crosslink forming substituent such as a methylol group or a methoxymethyl group, and a polymer-based crosslinkable compound thereof. Specific examples thereof include tetramethoxymethylglycoluril, tetrabutoxymethylglycoluril, and hexamethoxymethylmelamine. Further, examples of the substituted urea-based compound include tetramethoxymethyl urea and tetrabutoxymethyl urea. In addition, condensates of these compounds may also be used. Examples of the phenol-based compound include tetrahydroxymethylbiphenol, tetramethoxymethylbiphenol, tetrahydroxymethylbisphenol, tetramethoxymethylbisphenol, and compounds represented by the following formulas.

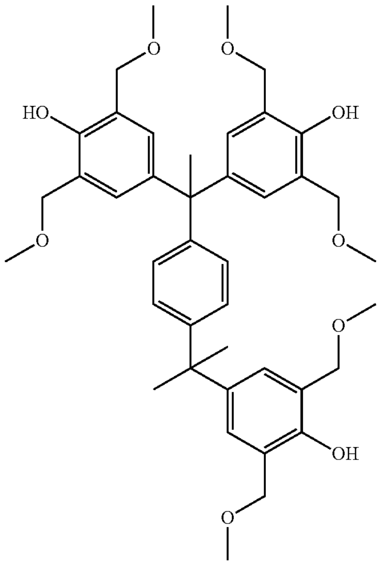

HMOM—TPPA

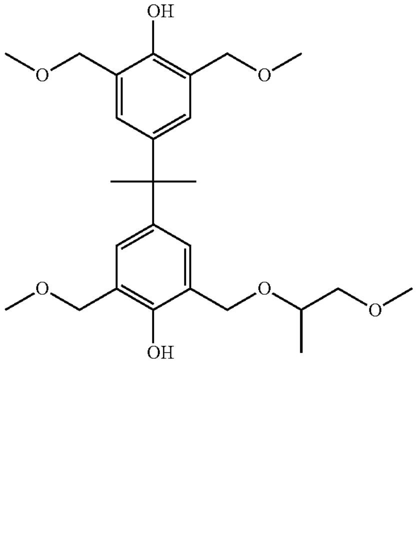

-continued

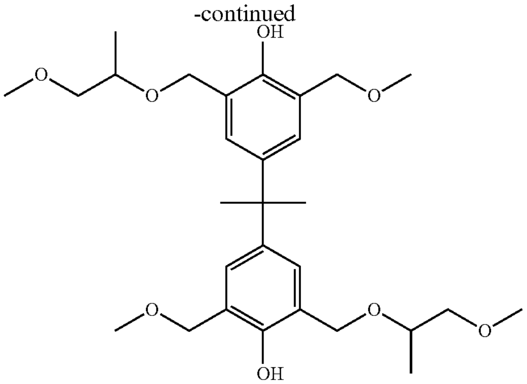

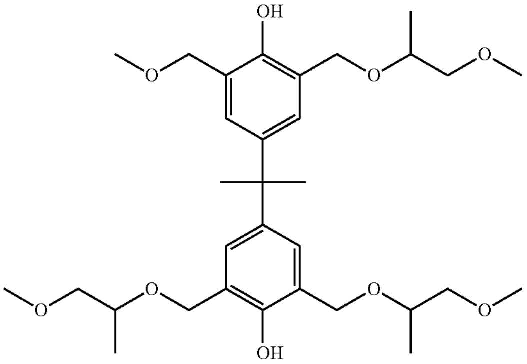

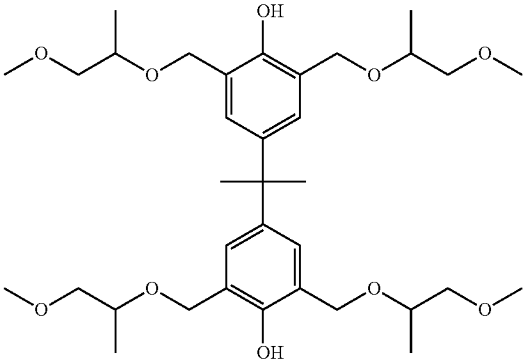

In addition, as the crosslinking agent, a compound having at least two epoxy groups may also be used. Examples of such a compound include tris(2,3-epoxypropyl)isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexanedicarboxylic acid diglycidyl ester, 4,4'-methylenebis (N,N-diglycidylaniline), 3,4-epoxycyclohexylmethyl-3,4-epoxycyclohexane carboxylate, trimethylolethane triglycidyl ether, bisphenol-A-diglycidyl ether, EPOLEAD [registered trademark] GT-401, GT-403, GT-301, and GT-302 and CELLOXIDE [registered trademark] 2021 and 3000, manufactured by Daicel Corporation; 1001, 1002, 1003, 1004, 1007, 1009, 1010, 828, 807, 152, 154, 180S75, 871, and 872, manufactured by Mitsubishi Chemical Corporation, EPPN 201 and 202, EOCN-102, 103S, 104S, 1020, 1025, and 1027, manufactured by Nippon Kayaku Co., Ltd., Denacol [registered trademark] EX-252, EX-611, EX-612, EX-614, EX-622, EX-411, EX-512, EX-522, EX-421, EX-313, EX-314, and EX-321, manufactured by Nagase ChemteX Corporation, CY175, CY177, CY179, CY182, CY184, and CY192, manufactured by BASF Japan Ltd., and EPICLON 200, 400, 7015, 835LV, and 850CRP, manufactured by DIC Corporation. In addition, as the compound having at least two epoxy groups, an epoxy resin having an amino group may also be used. Examples of the epoxy resin include YH-434 and YH-434L (manufactured by NIPPON STEEL Epoxy Manufacturing Co., Ltd.).

In addition, as the crosslinking agent, a compound having at least two block isocyanate groups may also be used. Examples of such a compound include TAKENATE [registered trademark] B-830 and B-870N, manufactured by Mitsui Chemicals, Inc. and VESTANAT [registered trademark] B1358/100, manufactured by Evonik Degussa GmbH.

In addition, as the crosslinking agent, a compound having at least two vinyl ether groups may also be used. Examples of such a compound include bis(4-(vinyloxymethyl)cyclohexylmethyl)glutarate, tri(ethyleneglycol)divinyl ether, adipic acid divinyl ester, diethylene glycol divinyl ether, 1,2,4-tris(4-vinyloxybutyl)trimellitate, 1,3,5-tris(4-vinyloxybutyl)trimellitate, bis(4-(vinyloxy)butyl) terephthalate, bis(4-(vinyloxy)butyl)isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether.

In addition, as the crosslinking agent, a crosslinking agent having high heat resistance may be used. As the crosslinking agent having high heat resistance, a compound having a crosslink forming substituent having an aromatic ring (for example, a benzene ring or a naphthalene ring) in the molecule may be preferably used.

Examples of the compound include a compound having a partial structure of the following formula (4) and a polymer or an oligomer having a repeating unit of the following formula (5).

Formula (4)

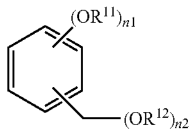

Formula (5)

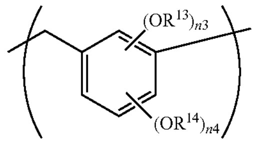

Each of $R^{11}$, $R^{12}$, $R^{13}$, and $R^{14}$ is a hydrogen atom or an alkyl group having 1 to 10 carbon atoms, and examples described above may be used for these alkyl groups.

Examples of the compound, the polymer, and the oligomer of formulas (4) and (5) include the followings.

Formula (4-1)

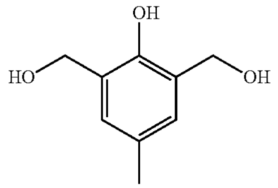

-continued

Formula (4-2)

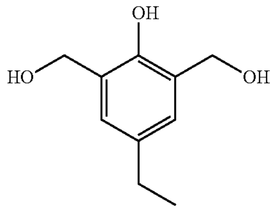

Formula (4-3)

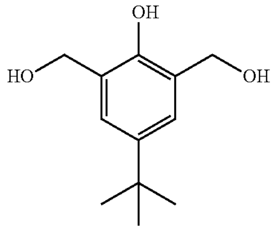

Formula (4-4)

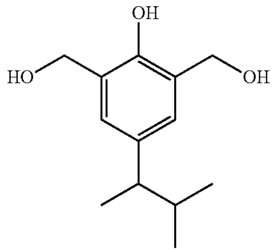

Formula (4-5)

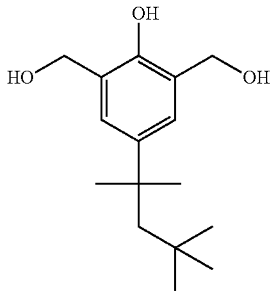

Formula (4-6)

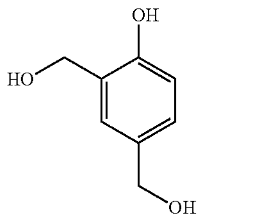

Formula (4-7)

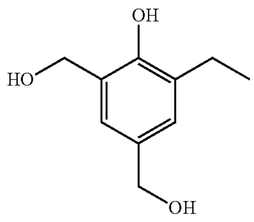

-continued
Formula (4-8)
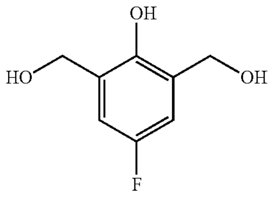
Formula (4-9)
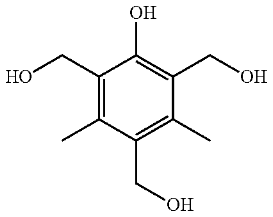
Formula (4-10)
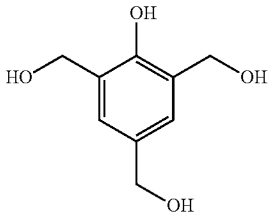
Formula (4-11)
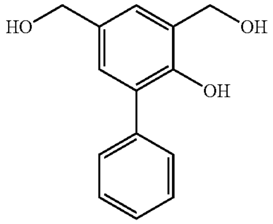
Formula (4-12)
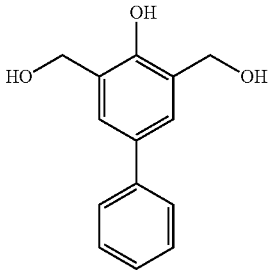
Formula (4-13)
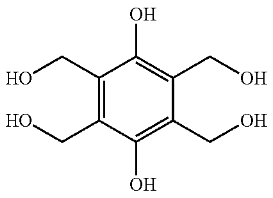
Formula (4-14)
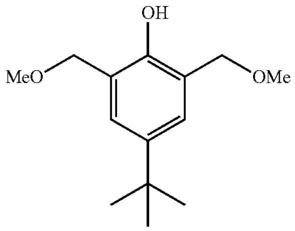
-continued
Formula (4-15)
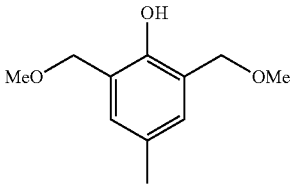
Formula (4-16)
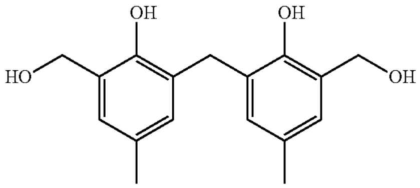
Formula (4-17)
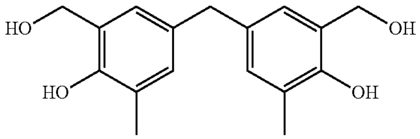
Formula (4-18)
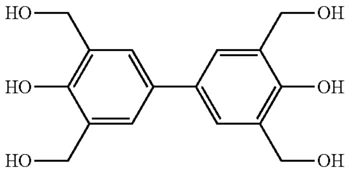
Formula (4-19)
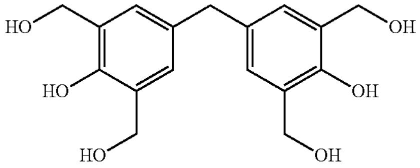
Formula (4-20)
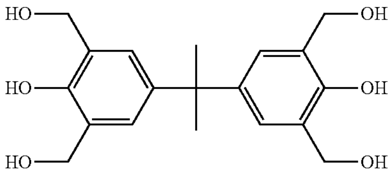
Formula (4-21)
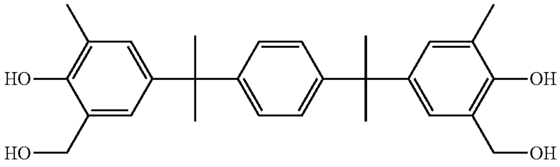
Formula (4-22)
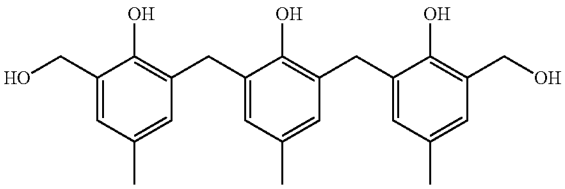

-continued

Formula (4-23)

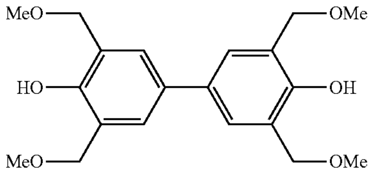

Formula (4-24)

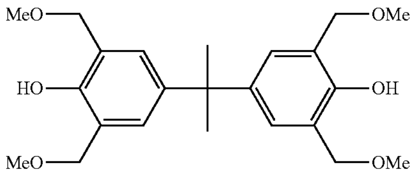

Formula (4-25)

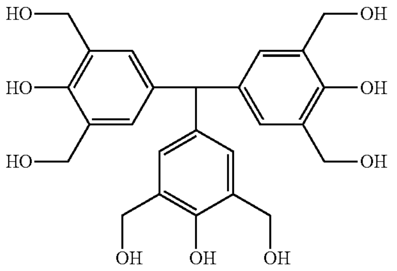

Formula (4-26)

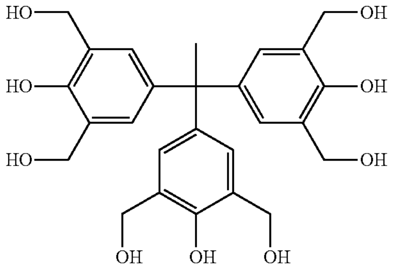

Formula (4-27)

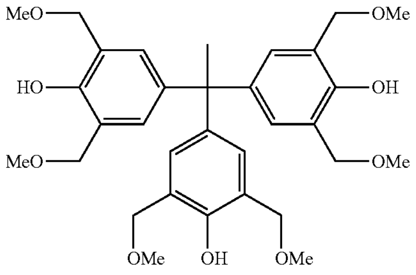

Formula (4-28)

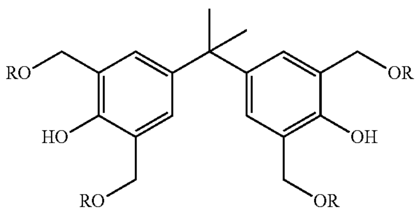

R: —H or —$CH(CH_3)CH_2OCH_3$

The compound may be available as products from ASAHI YUKIZAI CORPORATION and Honshu Chemical Industry Co., Ltd. Of the crosslinking agents, for example, the compound of formula (4-23) is available as TMOM-BP, trade name, from Honshu Chemical Industry Co., Ltd., the compound of formula (4-24) is available as TM-BIP-A, trade name, from ASAHI YUKIZAI CORPORATION, and the compound of formula (4-28) is available as PGME-BIP-A, trade name, from Japan Finechem Company, Inc.

The amount of crosslinking agent added varies depending on an application solvent to be used, a substrate to be used, a solution viscosity to be required, a film shape to be required, or the like. The amount of crosslinking agent added is 0.001% by mass or more, 0.01% by mass or more, 0.05% by mass or more, 0.5% by mass or more, or 1.0% by mass or more, and 80% by mass or less, 50% by mass or less, 40% by mass or less, 20% by mass or less, or 10% by mass or less, relative to the total solid content. The crosslinking agent may cause crosslinking reaction due to self-condensation. However, in a case where a crosslinkable substituent is present in the polymer of the present invention, the crosslinking agent can cause crosslinking reaction with the crosslinkable substituent.

One crosslinking agent selected from these crosslinking agents may be added, and a combination of two or more crosslinking agents may be added.

The resist underlayer film-forming composition according to the present invention can be prepared by uniformly mixing the above components by a normal method. The prepared resist underlayer film-forming composition is preferably used after filtration is performed using a filter having a pore size of, for example, 0.2 μm or 0.1 μm and/or a filter having a pore size of 0.01 μm.

[Method of Manufacturing Patterned Substrate]

A method of manufacturing a patterned substrate using the resist underlayer film-forming composition according to the present invention includes: applying and curing the resist underlayer film-forming composition on a semiconductor substrate to form a resist underlayer film; applying and baking a resist on the resist underlayer film to form a resist film; exposing the resist underlayer film and the semiconductor substrate coated with the resist; and developing the exposed resist film to perform patterning. Hereinafter, the method will be described in order.

Examples of the semiconductor substrate on which the resist underlayer film-forming composition according to the present invention is applied include a silicon substrate, a germanium substrate, and a semiconductor wafer formed of a compound such as gallium arsenide, indium phosphide, gallium nitride, indium nitride, or aluminum nitride. In a case where a semiconductor substrate having a surface on which an inorganic film is formed is used, the inorganic film is formed by, for example, an atomic layer deposition (ALD) method, a chemical vapor deposition (CVD) method, a reactive sputtering method, an ion-plating method, a vacuum deposition method, or a spin coating method (spin on glass: SOG). Examples of the inorganic film include a polysilicon film, a silicon oxide film, a silicon nitride film, a boro-phospho silicate glass (BPSG) film, a titanium nitride film, a titanium nitride oxide film, a tungsten film, a gallium nitride film, and a gallium arsenide film.

The resist underlayer film-forming composition according to the present invention is applied onto the semiconductor substrate by an appropriate application method such as a spinner or a coater. Thereafter, the coating film is cured to form a resist underlayer film according to the present invention, which is a cured product of the coating film.

Means for curing the coating film includes baking of a coating film using a heating means such as a hotplate and photocuring of a coating film by irradiation with light (for example, ultraviolet rays).

Conditions for baking are appropriately selected from a baking temperature of 100° C. to 400° C. and a baking time of 0.3 minutes to 60 minutes. It is preferable that the baking temperature is 120° C. to 350° C. and the baking time is 0.5 minutes to 30 minutes, it is more preferable that the baking temperature is 150° C. to 300° C. and the baking time is 0.8 minutes to 10 minutes, and it is most preferable that the baking temperature is 200° C. to 260° C. and the baking time is 0.8 minutes to 3 minutes. A thickness of the formed resist underlayer film is, for example, within the range of 0.001 μm to 10 μm, preferably 0.002 μm to 1 μm, more preferably 0.005 μm to 0.5 μm, and most preferably 0.02 to 0.3 μm. When the temperature during the baking is lower than the above range, the crosslinking may be insufficient, and a resistance of the formed resist underlayer film to a resist solvent or an aqueous hydrogen peroxide solution may be hardly obtained. On the other hand, when the temperature during the baking is higher than the above range, the resist underlayer film may be decomposed by heat.

In a case where the coating film is cured only by baking, the resist underlayer film according to the present invention is a baked product of the coating film.

Instead of the curing of the coating film only by baking, the curing may be completed by a photocuring treatment after a heat treatment is performed at a relatively low temperature (for example, a temperature lower than the baking temperature by 10 to 80° C.). Alternatively, after the heat treatment is performed at the baking temperature for a shorter time, curing can be completed by a photocuring treatment.

Ultraviolet rays are preferably used for the photocuring treatment. An irradiation energy is usually within the range of 100 to 1,000 $mJ/cm^2$.

Planarity of the resist underlayer film can be further improved by appropriately combining thermal curing and photocuring.

Next, a resist pattern is formed on the resist underlayer film. The resist pattern may be formed by a general method, that is, by applying a photoresist solution onto the resist underlayer film (after forming a film of a coating material having one layer to a plurality of layers, if necessary), performing pre-baking (if necessary), performing irradiation (exposing) with light of electron beams through a predetermined mask, performing baking after exposure (if necessary), which is abbreviated as post-exposure bake (PEB), and performing development, rinse, and drying. The resist used in the present invention is a photoresist or an electron beam resist. A photoresist solution used for forming the resist pattern is not particularly limited as long as it is sensitive to light used for exposure, and a positive photoresist may be used. Examples of the photoresist include a chemically amplified photoresist formed of a binder having a group degradable by an acid to increase an alkali dissolution rate and a photoacid generator; a chemically amplified photoresist formed of a low-molecular-weight compound degradable by an acid to increase an alkali dissolution rate of the photoresist, an alkali-soluble binder, and a photoacid generator; a chemically amplified photoresist formed of a binder having a group degradable by an acid to increase an alkali dissolution rate, a low-molecular-weight compound degradable by an acid to increase an alkali dissolution rate of the photoresist, and a photoacid generator; and a DNQ-novolac non-chemically amplified photoresist designed to use a difference in alkali dissolution rate between an exposed portion and an unexposed portion. Examples thereof include PAR710, trade name, manufactured by Sumitomo Chemical Co., Ltd., TDUR-P3435LP and THMR-iP1800, trade name, manufactured by TOKYO OHKA KOGYO CO., LTD., and SEPR430, trade name, manufactured by Shin-Etsu Chemical Co., Ltd. A negative photoresist may be used instead of the positive photoresist.

In addition, examples of the electron beam resist applied to an upper portion of the resist underlayer film in the present invention include a composition composed of a resin that has a Si—Si bond in a main chain and an aromatic ring at a terminal thereof and an acid generator that generates an acid by irradiation with electron beams; and a composition composed of poly(p-hydroxystyrene) that has a hydroxyl group substituted with an organic group containing N-carboxyamine and an acid generator that generates an acid by irradiation with electron beams. In the latter electron beam resist composition, an acid generated from the acid generator by irradiation with electron beams is reacted with an N-carboxyaminoxy group on a side chain of the polymer, the side chain of the polymer is degraded to form a hydroxyl group, and the polymer is dissolved in an alkali developer exhibiting alkali solubility, thereby forming a resist pattern. Examples of the acid generator that generates an acid by irradiation with electron beams include halogenated organic compounds such as 1,1-bis [p-chlorophenyl]-2,2,2-trichloroethane, 1,1-bis [p-methoxyphenyl]-2,2,2-trichloroethane, 1,1-bis [p-chlorophenyl]-2,2-dichloroethane, and 2-chloro-6-(trichloromethyl)pyridine; onium salts such as a triphenyl sulfonium salt and a diphenyl iodonium salt; and sulfonic acid esters such as nitrobenzyl tosylate and dinitrobenzyl tosylate.

The exposure is performed through a mask (reticle) for forming a predetermined pattern, and for example, i rays, KrF energy lasers, ArF energy lasers, extreme ultraviolet (EUV) rays, or electron beams (EB) are used. In the development, an alkali developer is used, and a development temperature and a development time are appropriately selected from 5° C. to 50° C. and 10 seconds to 300 seconds, respectively. Examples of the alkali developer include aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous alkaline solutions such as aqueous solutions of amines such as ethanolamine, propylamine, and ethylenediamine. Furthermore, a surfactant or the like may be added to the developer. Instead of the alkali developer, a method of performing development with an organic solvent such as butyl acetate and developing a portion where an alkali dissolution rate of the photoresist is not increased may also be used.

Next, the resist underlayer film is dry-etched using the formed resist pattern as a mask. At this time, when the inorganic film is formed on the surface of the used semiconductor substrate, the surface of the inorganic film is exposed; and when the inorganic film is not formed on the surface of the used semiconductor substrate, the surface of the semiconductor substrate is exposed.

Furthermore, a desired pattern is formed by wet-etching using the dry-etched resist underlayer film (and the resist pattern if it remains on the resist underlayer film) as a mask with an aqueous hydrogen peroxide solution. Examples of a chemical solution for wet etching include basic aqueous hydrogen peroxide solutions obtained by mixing a basic substance, for example, ammonia, sodium hydroxide, potassium hydroxide, sodium cyanide, potassium cyanide, or an organic amine such as triethanolamine with a hydrogen peroxide solution, and adjusting a pH of the mixture to a basic pH; and acidic aqueous hydrogen peroxide solutions obtained by mixing an inorganic acid such as hydrochloric acid or sulfuric acid with a hydrogen peroxide solution. In addition, a substance capable of adjusting a pH to a basic pH, for example, a substance capable of finally adjusting a pH to a basic pH by mixing urea with a hydrogen peroxide solution and causing thermal decomposition of urea by heating to generate ammonia, may be used as a chemical solution for wet etching. The use temperature of the basic aqueous hydrogen peroxide solution and the acidic aqueous hydrogen peroxide solution is desirably within the range of 25° C. to 90° C. and more desirably 40° C. to 80° C. The wet etching time is desirably within the range of 0.5 minutes to 30 minutes and more desirably 1 minute to 20 minutes.

As described above, a semiconductor device can be manufactured by: forming a resist underlayer film using the resist underlayer film-forming composition on a semiconductor substrate; forming a resist film on the resist underlayer film; forming a resist pattern by irradiation with light or an electron beam and development; etching the underlayer film through the resist pattern; and processing the semiconductor substrate using the patterned underlayer film.

EXAMPLES

Next, the content of the present invention will be described in detail with reference to Examples and the like, but the present invention is not limited thereto.

The chemical structures and abbreviations of the raw materials used in synthesis examples are as follows.

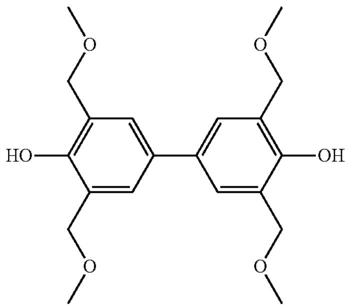

TMOM-BP

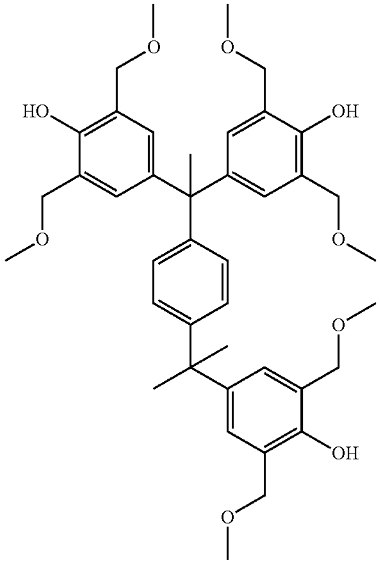

HMOM-TPPA

-continued

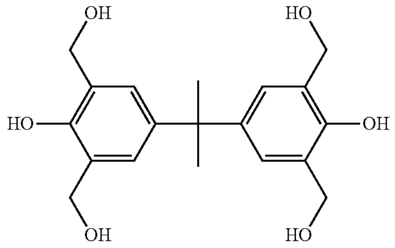

TM-BIP-A

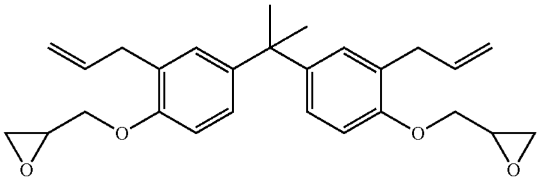

RE-810 NM

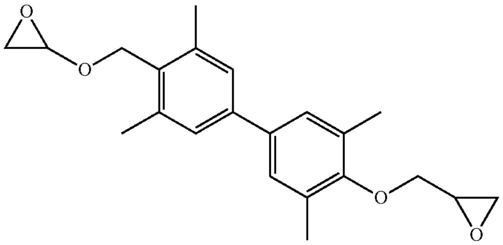

YX-4000

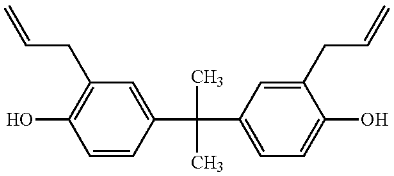

BPA-CA

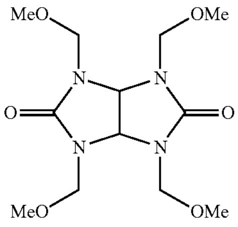

PL-LI

The chemical structures (examples) and abbreviations of the raw materials used in synthesis examples are as follows.

HP-6000

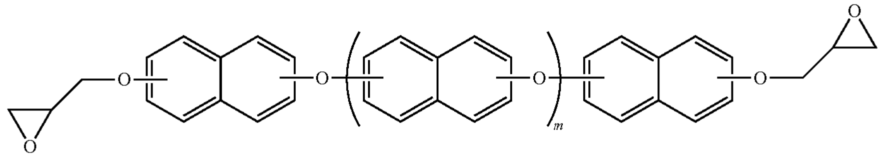

wherein, m represents an integer of 0 to 3.

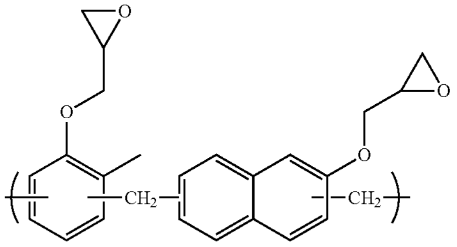

NC-7300L

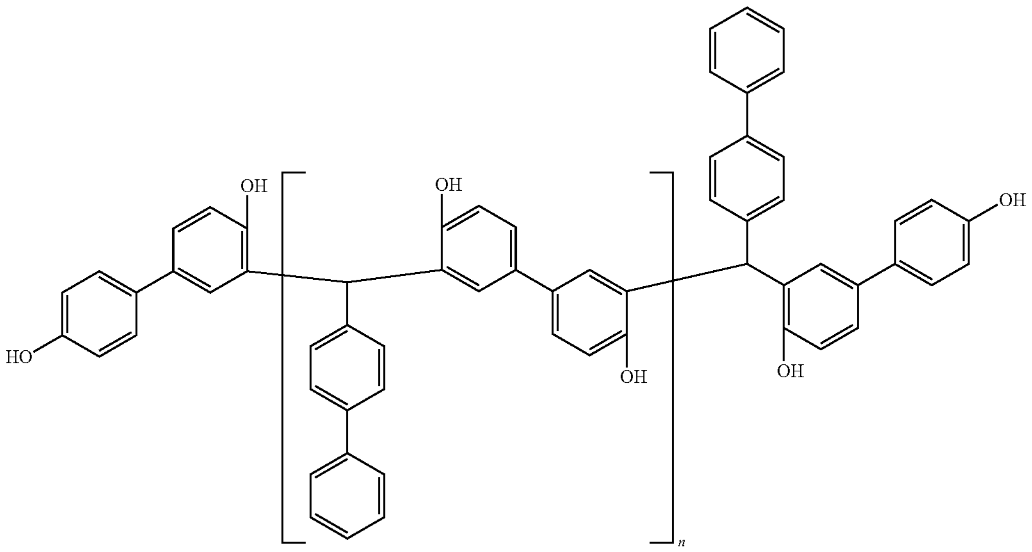

n = 0(61%), n = 1(25%), n =2(9%), n =4(5%)

NeoFARIT 7177C

The weight average molecular weight of a resin (polymer) obtained in the following Synthesis Example 1 is a result of measurement by gel permeation chromatography (hereinafter, abbreviated as GPC). For the measurement, a GPC apparatus manufactured by Tosoh Corporation is used, and the measurement conditions and the like are as follows.

GPC column: Shodex KF803L, Shodex KF802, Shodex KF801 [registered trademark] (Showa Denko K. K.)

Column temperature: 40° C.

Solvent: tetrahydrofuran (THF)

Flow rate: 1.0 ml/min

Standard sample: polystyrene (manufactured by Tosoh Corporation)

Synthesis Example 1

A 100 mL two-necked flask was charged with 10.90 g of TMOM-BP (manufactured by Honshu Chemical Industry Co., Ltd.), 10.00 g of 2-ethylhexyl glycidyl ether (manufactured by Tokyo Chemical Industry Co., Ltd.), 1.03 g of ethyltriphenylphosphonium bromide (manufactured by HOKKO CHEMICAL INDUSTRY CO., LTD.), and 21.0 g of propylene glycol monomethyl ether. Thereafter, the mixture was heated to 140° C. and was stirred under reflux for about 24 hours. After the completion of the reaction, the solution was diluted with propylene glycol monomethyl ether. 21.0 g of an anion exchange resin (trade name: DOWEX [registered trademark] 550A, MUROMACHI CHEMICALS INC.) and 21.0 g of a cation exchange resin (trade name: Amberlite [registered trademark] 15JWET, ORGANO CORPORATION) were added to the solution, and an ion exchange treatment was performed at room temperature for 4 hours. After separation of the ion exchange resin, a solution of a compound having a structure of formula (1-1) was obtained. The weight average molecular weight Mw measured in terms of polystyrene by GPC was 960, with no residual epoxy.

Formula (1-1)

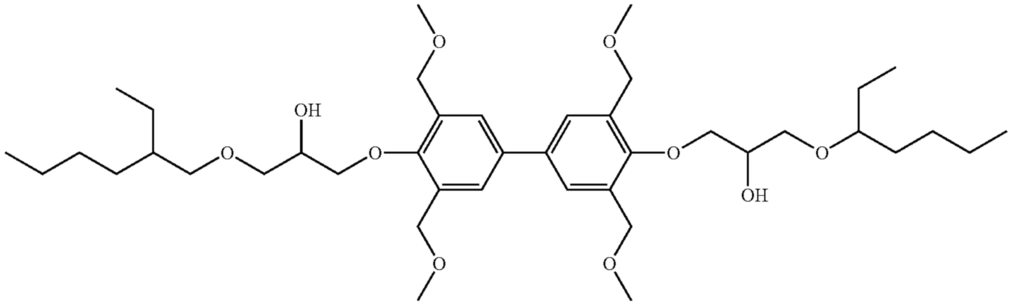

Synthesis Example 2

A 100 mL two-necked flask was charged with 9.80 g of TMOM-BP (manufactured by Honshu Chemical Industry Co., Ltd.), 12.00 g of 2-biphenyl glycidyl ether (manufactured by Tokyo Chemical Industry Co., Ltd.), 1.00 g of ethyltriphenylphosphonium bromide (manufactured by HOKKO CHEMICAL INDUSTRY CO., LTD.), and 22.8 g of propylene glycol monomethyl ether. Thereafter, the mixture was heated to 140° C. and was stirred under reflux for about 24 hours. After the completion of the reaction, the solution was diluted with propylene glycol monomethyl ether. 22.8 g of an anion exchange resin (trade name: DOWEX [registered trademark] 550A, MUROMACHI CHEMICALS INC.) and 22.8 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure of formula (1-2) was obtained. The weight average molecular weight Mw measured in terms of polystyrene by GPC was 680, with no residual epoxy.

Synthesis Example 3

A 100 mL two-necked flask was charged with 9.60 g of TMOM-BP (manufactured by Honshu Chemical Industry Co., Ltd.), 12.00 g of 4-tert-butyl glycidyl benzoate (manufactured by Tokyo Chemical Industry Co., Ltd.), 0.98 g of ethyltriphenylphosphonium bromide (manufactured by HOKKO CHEMICAL INDUSTRY CO., LTD.), and 22.6 g of propylene glycol monomethyl ether. Thereafter, the mixture was heated to 140° C. and was stirred under reflux for about 24 hours. After the completion of the reaction, the solution was diluted with propylene glycol monomethyl ether. 22.6 g of an anion exchange resin (trade name: DOWEX [registered trademark] 550A, MUROMACHI CHEMICALS INC.) and 22.6 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure of formula (1-3) was obtained. The weight average molecular weight Mw measured in terms of polystyrene by GPC was 870, with no residual epoxy.

Formula (1-2)

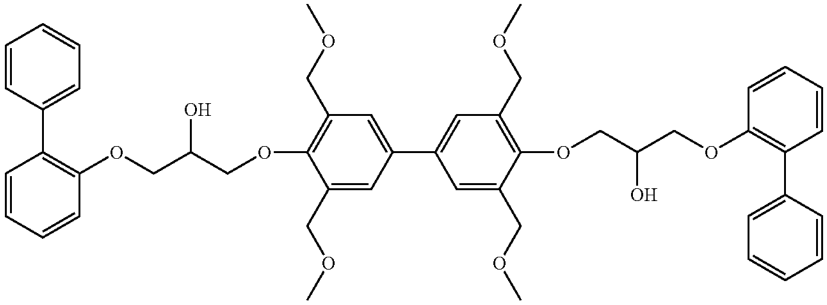

Formula (1-3)

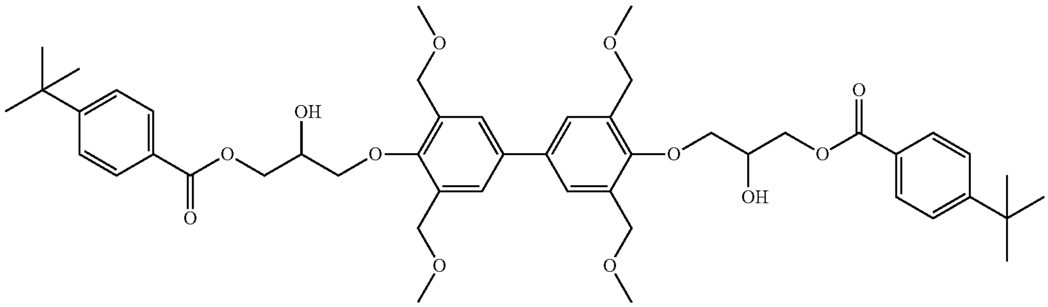

Synthesis Example 4

A 100 mL two-necked flask was charged with 3.34 g of HMOM-TPPA (manufactured by Honshu Chemical Industry Co., Ltd.), 3.00 g of 2-ethylhexyl glycidyl ether (manufactured by Tokyo Chemical Industry Co., Ltd.), 0.31 g of ethyltriphenylphosphonium bromide (manufactured by HOKKO CHEMICAL INDUSTRY CO., LTD.), and 15.5 g of propylene glycol monomethyl ether. Thereafter, the mixture was heated to 140° C. and was stirred under reflux for about 24 hours. After the completion of the reaction, the solution was diluted with propylene glycol monomethyl ether. 6.6 g of an anion exchange resin (trade name: DOWEX [registered trademark] 550A, MUROMACHI CHEMICALS INC.) and 6.6 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure of formula (1-4) was obtained. The weight average molecular weight Mw measured in terms of polystyrene by GPC was 1,200, with no residual epoxy.

Synthesis Example 5

A 100 mL two-necked flask was charged with 9.62 g of TM-BIP-A (manufactured by ASAHI YUKIZAI CORPORATION), 10.00 g of 2-ethylhexyl glycidyl ether (manufactured by Tokyo Chemical Industry Co., Ltd.), 1.03 g of ethyltriphenylphosphonium bromide (manufactured by HOKKO CHEMICAL INDUSTRY CO., LTD.), and 48.2 g of propylene glycol monomethyl ether. Thereafter, the mixture was heated to 80° C. and was stirred for about 24 hours. After the completion of the reaction, the solution was diluted with propylene glycol monomethyl ether. 20.6 g of an anion exchange resin (trade name: DOWEX [registered trademark] 550A, MUROMACHI CHEMICALS INC.) and 20.6 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure of formula (1-5) was obtained. The weight average molecular weight Mw measured in terms of polystyrene by GPC was 1,600 and the amount of residual epoxy was 2.5% relative to the charged amount.

Formula (1-4)

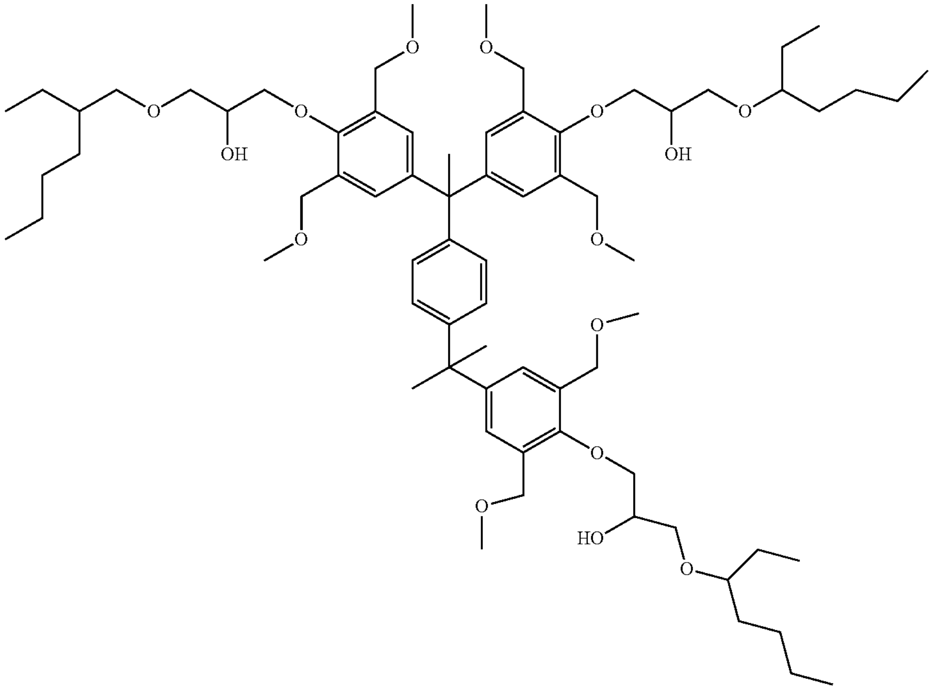

Formula (1-5)

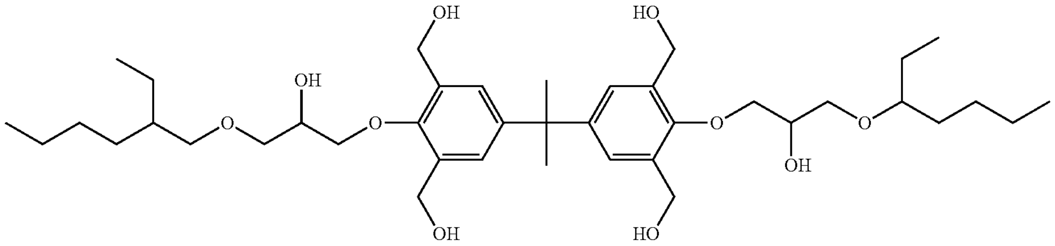

Synthesis Example 6

A 100 mL two-necked flask was charged with 7.87 g of TM-BIP-A (manufactured by ASAHI YUKIZAI CORPORATION), 10.00 g of 2-biphenyl glycidyl ether (manufactured by Tokyo Chemical Industry Co., Ltd.), 0.84 g of ethyltriphenylphosphonium bromide (manufactured by HOKKO CHEMICAL INDUSTRY CO., LTD.), and 43.7 g of propylene glycol monomethyl ether. Thereafter, the mixture was heated to 80° C. and was stirred for about 21 hours. After the completion of the reaction, the solution was diluted with propylene glycol monomethyl ether. 18.7 g of an anion exchange resin (trade name: DOWEX [registered trademark] 550A, MUROMACHI CHEMICALS INC.) and 18.7 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure of formula (1-6) was obtained. The weight average molecular weight Mw measured in terms of polystyrene by GPC was 900 and the amount of residual epoxy was 0.2% relative to the charged amount.

Synthesis Example 7

A 100 mL two-necked flask was charged with 7.68 g of TM-BIP-A (manufactured by ASAHI YUKIZAI CORPORATION), 10.00 g of 4-tert-butyl glycidyl benzoate (manufactured by Tokyo Chemical Industry Co., Ltd.), 0.82 g of ethyltriphenylphosphonium bromide (manufactured by HOKKO CHEMICAL INDUSTRY CO., LTD.), and 43.2 g of propylene glycol monomethyl ether. Thereafter, the mixture was heated to 80° C. and was stirred for about 21 hours. After the completion of the reaction, the solution was diluted with propylene glycol monomethyl ether. 18.5 g of an anion exchange resin (trade name: DOWEX [registered trademark] 550A, MUROMACHI CHEMICALS INC.) and 18.5 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure of formula (1-7) was obtained. The weight average molecular weight Mw measured in terms of polystyrene by GPC was 1,700 and the amount of residual epoxy was 1.1% relative to the charged amount.

Formula (1-6)

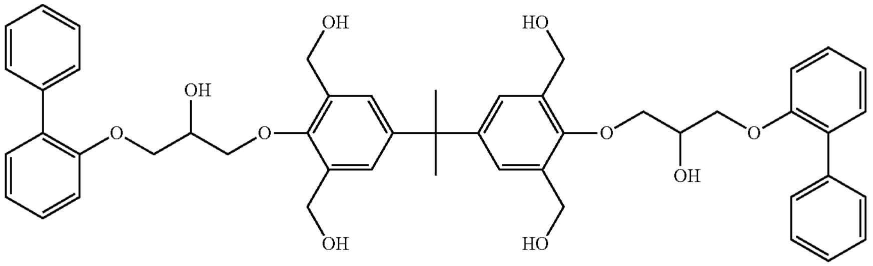

Formula (1-7)

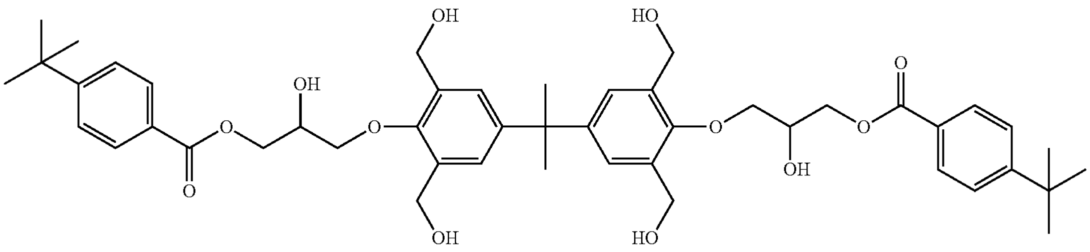

Synthesis Example 8

A 100 mL two-necked flask was charged with 7.89 g of 2,6-bis(hydroxymethyl)-p-cresol (manufactured by Tokyo Chemical Industry Co., Ltd.), 10.00 g of RE-810 NM (manufactured by Nippon Kayaku Co., Ltd.), 0.87 g of ethyltriphenylphosphonium bromide (HOKKO CHEMICAL INDUSTRY CO., LTD.), and 8.42 g of propylene glycol monomethyl ether. Thereafter, the mixture was heated to 100° C. and was stirred for about 24 hours. After the completion of the reaction, the solution was diluted with propylene glycol monomethyl ether. 18.8 g of an anion exchange resin (trade name: DOWEX [registered trademark] 550A, MUROMACHI CHEMICALS INC.) and 18.8 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure of formula (1-8) was obtained. The weight average molecular weight Mw measured in terms of polystyrene by GPC was 1,900, with no residual epoxy.

Synthesis Example 9

A 100 mL two-necked flask was charged with 9.09 g of 2,6-bis(hydroxymethyl)-p-cresol (manufactured by Tokyo Chemical Industry Co., Ltd.), 10.00 g of YX-4000 (manufactured by Mitsubishi Chemical Holdings Corporation), 1.00 g of ethyltriphenylphosphonium bromide (HOKKO CHEMICAL INDUSTRY CO., LTD.), and 8.61 g of propylene glycol monomethyl ether. Thereafter, the mixture was heated to 100° C. and was stirred for about 24 hours. After the completion of the reaction, the solution was diluted with propylene glycol monomethyl ether. 20.1 g of an anion exchange resin (trade name: DOWEX [registered trademark] 550A, MUROMACHI CHEMICALS INC.) and 20.1 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure of formula (1-9) was obtained. The weight average molecular weight Mw measured in terms of polystyrene by GPC was 1,500, with no residual epoxy.

Formula (1-8)

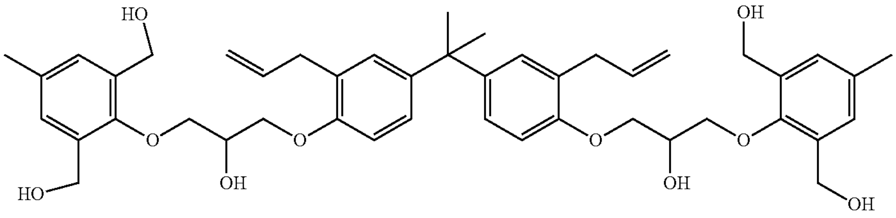

Formula (1-9)

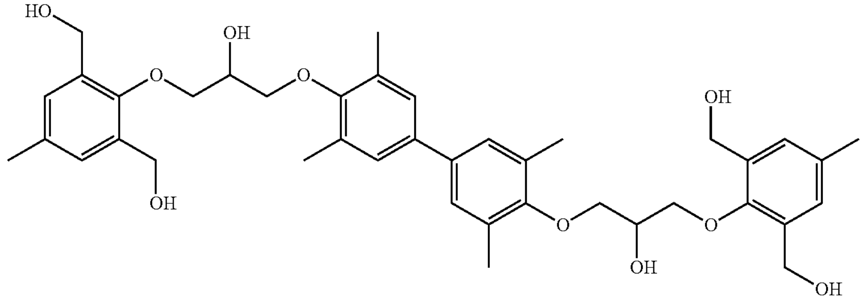

Synthesis Example 10

A 100 mL two-necked flask was charged with 6.89 g of 2,6-bis(hydroxymethyl)-p-cresol (manufactured by Tokyo Chemical Industry Co., Ltd.), 10.00 g of HP-6000 (manufactured by DIC Corporation), 0.76 g of ethyltriphenylphosphonium bromide (HOKKO CHEMICAL INDUSTRY CO., LTD.), and 7.57 g of propylene glycol monomethyl ether. Thereafter, the mixture was heated to 100° C. and was stirred for about 24 hours. After the completion of the reaction, the solution was diluted with propylene glycol monomethyl ether. 17.7 g of an anion exchange resin (trade name: DOWEX [registered trademark] 550A, MUROMACHI CHEMICALS INC.) and 17.7 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure (example) of formula (1-10) was obtained. The weight average molecular weight Mw measured in terms of polystyrene by GPC was 1,900, with no residual epoxy.

Formula (1-10)

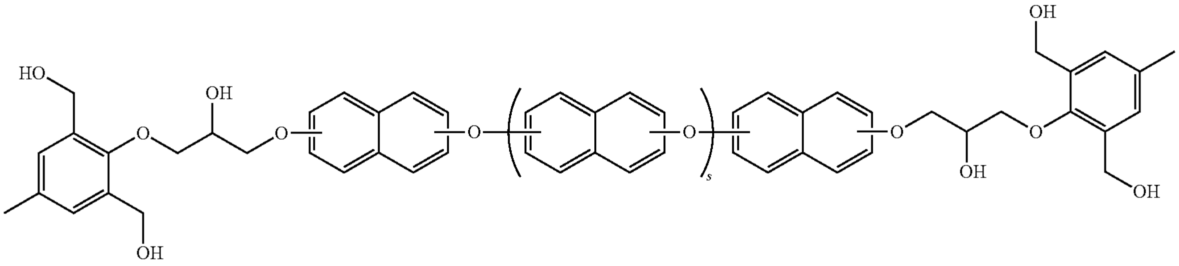

wherein, s represents an integer of 0 to 3.

Synthesis Example 11

A 100 mL two-necked flask was charged with 7.20 g of 2,6-bis(hydroxymethyl)-p-cresol (manufactured by Tokyo Chemical Industry Co., Ltd.), 10.00 g of NC-7300L (manufactured by Nippon Kayaku Co., Ltd.), 0.80 g of ethyltriphenylphosphonium bromide (HOKKO CHEMICAL INDUSTRY CO., LTD.), and 7.71 g of propylene glycol monomethyl ether. Thereafter, the mixture was heated to 100° C. and was stirred for about 24 hours. After the completion of the reaction, the solution was diluted with propylene glycol monomethyl ether. 18.0 g of an anion exchange resin (trade name: DOWEX [registered trademark] 550A, MUROMACHI CHEMICALS INC.) and 18.0 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure (example) of formula (1-11) was obtained. The weight average molecular weight Mw measured in terms of polystyrene by GPC was 2,200, with no residual epoxy.

Formula (1-11)

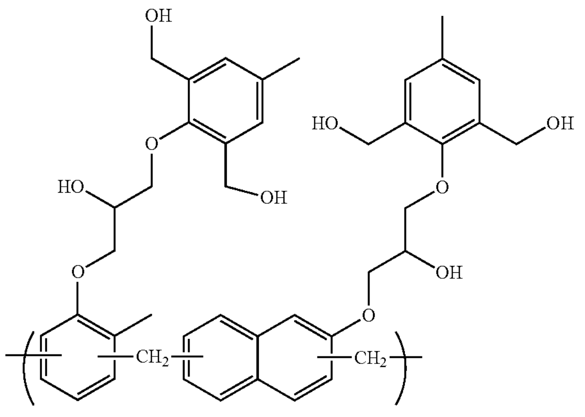

Formula (1-13)

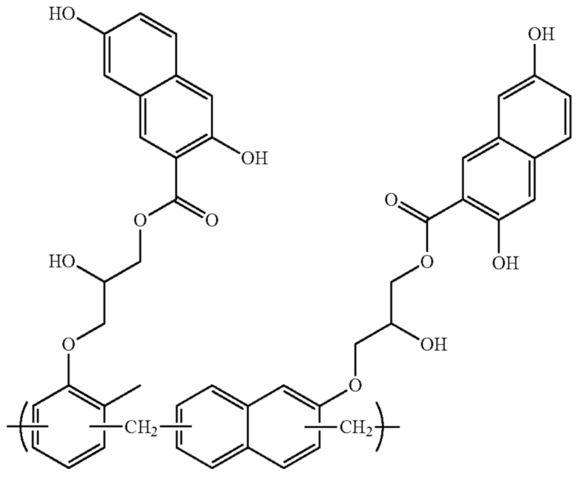

Synthesis Example 12

A polymer was obtained by the method described in Synthesis Example 10 of the description of Japanese Patent No. 6191831. The weight average molecular weight Mw measured in terms of polystyrene by GPC was 2,000.

Synthesis Example 13

A 100 mL two-necked flask was charged with 8.74 g of 3,7-dihydroxy-2-naphthoic acid, 10.00 g of NC-7300L (manufactured by Nippon Kayaku Co., Ltd.), 0.40 g of ethyltriphenylphosphonium bromide (HOKKO CHEMICAL INDUSTRY CO., LTD.), and 44.7 g of propylene glycol monomethyl ether. Thereafter, the mixture was heated to 120° C. and was stirred for about 18 hours. After the completion of the reaction, the solution was diluted with propylene glycol monomethyl ether. 19.4 g of an anion exchange resin (trade name: DOWEX [registered trademark] 550A, MUROMACHI CHEMICALS INC.) and 19.4 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a solution of a compound having a structure (example) of formula (1-13) was obtained. The weight average molecular weight Mw measured in terms of polystyrene by GPC was 1,100, with no residual epoxy.

Example 1

The polymer obtained in Synthesis Example 12 was dissolved in propylene glycol monomethyl ether acetate. An anion exchange resin (trade name: DOWEX [registered trademark] 550A, MUROMACHI CHEMICALS INC.) and a cation exchange resin (trade name: Amberlite [registered trademark] 15JWET, ORGANO CORPORATION) were added to the solution, and an ion exchange treatment was performed at room temperature for 4 hours, thereby obtaining a polymer solution (solid content: 34.3% by mass). To 2.6 g of the polymer solution, 0.09 g of propylene glycol monomethyl ether acetate containing a 1% surfactant (MEGAFACE R-40, manufactured by DIC Corporation), 1.1 g of the solution of the compound obtained in Synthesis Example 1 (solid content: 24.2% by mass), 2.0 g of propylene glycol monomethyl ether containing 2% by mass of pyridinium p-hydroxybenzenesulfonate, 8.0 g of propylene glycol monomethyl ether acetate, and 1.3 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 2

The solution of the polymer obtained in Synthesis Example 12 (solid content: 34.3% by mass) was prepared in the same manner as in Example 1. To 2.6 g of the polymer solution, 0.09 g of propylene glycol monomethyl ether acetate containing a 1% surfactant (MEGAFACE R-40, manufactured by DIC Corporation), 1.0 g of the solution of the compound obtained in Synthesis Example 2 (solid content: 26.1% by mass), 2.0 g of propylene glycol monomethyl ether containing 2% by mass of pyridinium p-hydroxybenzenesulfonate, 8.0 g of propylene glycol monomethyl ether acetate, and 1.3 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 3

The solution of the polymer obtained in Synthesis Example 12 (solid content: 34.3% by mass) was prepared in the same manner as in Example 1. To 2.6 g of the polymer solution, 0.09 g of propylene glycol monomethyl ether acetate containing a 1% surfactant (MEGAFACE R-40, manufactured by DIC Corporation), 1.0 g of the solution of the compound obtained in Synthesis Example 3 (solid content: 26.5% by mass), 2.0 g of propylene glycol monomethyl ether containing 2% by mass of pyridinium p-hydroxybenzenesulfonate, 8.0 g of propylene glycol monomethyl ether acetate, and 1.3 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 4

The solution of the polymer obtained in Synthesis Example 13 (solid content: 29.1% by mass) was prepared in the same manner as in Example 1. To 2.7 g of the polymer solution, 0.16 g of propylene glycol monomethyl ether acetate containing a 1% surfactant (MEGAFACE R-40, manufactured by DIC Corporation), 1.0 g of the solution of the compound obtained in Synthesis Example 1 (solid content: 24.2% by mass), 1.8 g of propylene glycol monomethyl ether containing 2% by mass of pyridinium p-hydroxybenzenesulfonate, 4.0 g of propylene glycol monomethyl ether acetate, and 5.4 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 5

The solution of the polymer obtained in Synthesis Example 12 (solid content: 34.3% by mass) was prepared in the same manner as in Example 1. To 2.4 g of the polymer solution, 0.08 g of propylene glycol monomethyl ether acetate containing a 1% surfactant (MEGAFACE R-40, manufactured by DIC Corporation), 1.4 g of the solution of the compound obtained in Synthesis Example 8 (solid content: 24.1% by mass), 2.5 g of propylene glycol monomethyl ether containing 2% by mass of pyridinium p-hydroxybenzenesulfonate, 8.1 g of propylene glycol monomethyl ether acetate, and 0.6 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 6

The solution of the polymer obtained in Synthesis Example 12 (solid content: 34.3% by mass) was prepared in the same manner as in Example 1. To 2.4 g of the polymer solution, 0.08 g of propylene glycol monomethyl ether acetate containing a 1% surfactant (MEGAFACE R-40, manufactured by DIC Corporation), 1.5 g of the solution of the compound obtained in Synthesis Example 9 (solid content: 22.0% by mass), 2.5 g of propylene glycol monomethyl ether containing 2% by mass of pyridinium p-hydroxybenzenesulfonate, 8.1 g of propylene glycol monomethyl ether acetate, and 0.5 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 7

The solution of the polymer obtained in Synthesis Example 12 (solid content: 34.3% by mass) was prepared in the same manner as in Example 1. To 2.4 g of the polymer solution, 0.08 g of propylene glycol monomethyl ether acetate containing a 1% surfactant (MEGAFACE R-40, manufactured by DIC Corporation), 1.3 g of the solution of the compound obtained in Synthesis Example 10 (solid content: 24.5% by mass), 2.5 g of propylene glycol monomethyl ether containing 2% by mass of pyridinium p-hydroxybenzenesulfonate, 8.1 g of propylene glycol monomethyl ether acetate, and 0.7 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 8

The solution of the polymer obtained in Synthesis Example 12 (solid content: 34.3% by mass) was prepared in the same manner as in Example 1. To 2.4 g of the polymer solution, 0.08 g of propylene glycol monomethyl ether acetate containing a 1% surfactant (MEGAFACE R-40, manufactured by DIC Corporation), 1.2 g of the solution of the compound obtained in Synthesis Example 11 (solid content: 27.1% by mass), 2.5 g of propylene glycol monomethyl ether containing 2% by mass of pyridinium p-hydroxybenzenesulfonate, 8.1 g of propylene glycol monomethyl ether acetate, and 0.8 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 9

The solution of the polymer obtained in Synthesis Example 12 (solid content: 34.3% by mass) was prepared in the same manner as in Example 1. To 2.6 g of the polymer solution, 0.09 g of propylene glycol monomethyl ether acetate containing a 1% surfactant (MEGAFACE R-40, manufactured by DIC Corporation), 1.0 g of the solution of the compound obtained in Synthesis Example 4 (solid content: 26.9% by mass), 2.0 g of propylene glycol monomethyl ether containing 2% by mass of pyridinium p-hydroxybenzenesulfonate, 8.0 g of propylene glycol monomethyl ether acetate, and 1.4 g of propylene glycol monomethyl ether were added and dissolved.

The solution was filtered with a polytetrafluoroethylene microfilter having a diameter of 0.1 μm, thereby preparing a solution of a resist underlayer film-forming composition.

Example 10

The solution of the polymer obtained in Synthesis Example 12 (solid content: 34.3% by mass) was prepared in the same manner as in Example 1. To 2.8 g of the polymer solution, 0.10 g of propylene glycol monomethyl ether acetate containing a 1% surfactant (MEGAFACE R-40, manufactured by DIC Corporation), 0.95 g of the solution of the compound obtained in Synthesis Example 5 (solid content: 20.6% by mass), 1.5 g of propylene glycol monomethyl ether containing 2% by mass of pyridinium p-hydroxybenzenesulfonate, 7.8 g of propylene glycol monomethyl ether acetate, and 1.9 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 11

The solution of the polymer obtained in Synthesis Example 12 (solid content: 34.3% by mass) was prepared in the same manner as in Example 1. To 2.8 g of the polymer solution, 0.10 g of propylene glycol monomethyl ether acetate containing a 1% surfactant (MEGAFACE R-40, manufactured by DIC Corporation), 0.82 g of the solution of the compound obtained in Synthesis Example 6 (solid content: 23.9% by mass), 1.5 g of propylene glycol monomethyl ether containing 2% by mass of pyridinium p-hydroxybenzenesulfonate, 7.8 g of propylene glycol monomethyl ether acetate, and 2.0 g of propylene glycol monomethyl ether were added and dissolved.

The solution was filtered with a polytetrafluoroethylene microfilter having a diameter of 0.1 μm, thereby preparing a solution of a resist underlayer film-forming composition.

Example 12

The solution of the polymer obtained in Synthesis Example 12 (solid content: 34.3% by mass) was prepared in the same manner as in Example 1. To 2.8 g of the polymer solution, 0.10 g of propylene glycol monomethyl ether acetate containing a 1% surfactant (MEGAFACE R-40, manufactured by DIC Corporation), 0.83 g of the solution of the compound obtained in Synthesis Example 7 (solid content: 23.5% by mass), 1.5 g of propylene glycol monomethyl ether containing 2% by mass of pyridinium p-hydroxybenzenesulfonate, 7.8 g of propylene glycol monomethyl ether acetate, and 2.0 g of propylene glycol monomethyl ether were added and dissolved.

The solution was filtered with a polytetrafluoroethylene microfilter having a diameter of 0.1 μm, thereby preparing a solution of a resist underlayer film-forming composition.

Comparative Example 1

The polymer obtained in Synthesis Example 12 was dissolved in propylene glycol monomethyl ether acetate and then was subjected to ion exchange to obtain a polymer solution (solid content: 34.3% by mass). To 2.6 g of the polymer solution, 0.09 g of propylene glycol monomethyl ether acetate containing a 1% surfactant (MEGAFACE R-40, manufactured by DIC Corporation), 0.27 g of TMOM-BP (manufactured by Honshu Chemical Industry Co., Ltd.), 2.0 g of propylene glycol monomethyl ether containing 2% by mass of pyridinium p-hydroxybenzenesulfonate, 8.0 g of propylene glycol monomethyl ether acetate, and 2.1 g of propylene glycol monomethyl ether were added and dissolved. The solution was filtered with a polytetrafluoroethylene microfilter having a diameter of 0.1 μm, thereby preparing a solution of a resist underlayer film-forming composition.

Comparative Example 2

The solution of the polymer obtained in Synthesis Example 13 (solid content: 29.1% by mass) was prepared in the same manner as in Example 1. To 2.7 g of the polymer solution, 0.16 g of propylene glycol monomethyl ether acetate containing a 1% surfactant (MEGAFACE R-40, manufactured by DIC Corporation), 0.23 g of TMOM-BP (manufactured by Honshu Chemical Industry Co., Ltd.), 1.8 g of propylene glycol monomethyl ether containing 2% by mass of pyridinium p-hydroxybenzenesulfonate, 4.0 g of propylene glycol monomethyl ether acetate, and 6.2 g of propylene glycol monomethyl ether were added and dissolved. The solution was filtered with a polytetrafluoroethylene microfilter having a diameter of 0.1 μm, thereby preparing a solution of a resist underlayer film-forming composition.

Comparative Example 3

The solution of the polymer obtained in Synthesis Example 12 (solid content: 34.3% by mass) was prepared in the same manner as in Example 1. To 3.6 g of the polymer solution, 0.12 g of propylene glycol monomethyl ether acetate containing a 1% surfactant (MEGAFACE R-40, manufactured by DIC Corporation), 0.49 g of TMOM-BP (manufactured by Honshu Chemical Industry Co., Ltd.), 1.5 g of propylene glycol monomethyl ether containing 2% by mass of pyridinium p-hydroxybenzenesulfonate, 10.4 g of propylene glycol monomethyl ether acetate, and 3.9 g of propylene glycol monomethyl ether were added and dissolved. The solution was filtered with a polytetrafluoroethylene microfilter having a diameter of 0.1 μm, thereby preparing a solution of a resist underlayer film-forming composition.

Comparative Example 4

The solution of the polymer obtained in Synthesis Example 12 (solid content: 34.3% by mass) was prepared in the same manner as in Example 1. To 2.6 g of the polymer solution, 0.09 g of propylene glycol monomethyl ether acetate containing a 1% surfactant (MEGAFACE R-40, manufactured by DIC Corporation), 0.27 g of HMOM-TPPA (manufactured by Honshu Chemical Industry Co., Ltd.), 2.0 g of propylene glycol monomethyl ether containing 2% by mass of pyridinium p-hydroxybenzenesulfonate, 8.0 g of propylene glycol monomethyl ether acetate, and 2.1 g of propylene glycol monomethyl ether were added and dissolved. The solution was filtered with a polytetrafluoroethylene microfilter having a diameter of 0.1 μm, thereby preparing a solution of a resist underlayer film-forming composition.

Comparative Example 5

The solution of the polymer obtained in Synthesis Example 12 (solid content: 34.3% by mass) was prepared in the same manner as in Example 1. To 2.8 g of the polymer solution, 0.10 g of propylene glycol monomethyl ether acetate containing a 1% surfactant (MEGAFACE R-40, manufactured by DIC Corporation), 0.20 g of TM-BIP-A (manufactured by ASAHI YUKIZAI CORPORATION), 1.5 g of propylene glycol monomethyl ether containing 2% by mass of pyridinium p-hydroxybenzenesulfonate, 7.8 g of propylene glycol monomethyl ether acetate, and 2.6 g of propylene glycol monomethyl ether were added and dissolved. The solution was filtered with a polytetrafluoroethylene microfilter having a diameter of 0.1 μm, thereby preparing a solution of a resist underlayer film-forming composition.

(Elution Test in Resist Solvent)

The solution of the resist underlayer film-forming composition prepared in each of Comparative Examples 1 to 5 and Examples 1 to 12 was applied onto a silicon wafer using a spin coater, followed by baking on a hot plate at 240° for 60 seconds, thereby forming a resist underlayer film (film thickness: 0.20 μm). The resist underlayer film was immersed in ethyl lactate, propylene glycol monomethyl ether, propylene glycol monomethyl ether acetate, and cyclohexanone, which were solvents used for the resist. The resist underlayer film was insoluble in these solvents.

(Measurement of Optical Constant)

The solution of the resist underlayer film-forming composition prepared in each of Comparative Examples 1 to 5 and Examples 1 to 12 was applied onto a silicon wafer using a spin coater, followed by baking on a hot plate at 240° C. for 60 seconds, to form a resist underlayer film (film thickness: 0.05 μm). The refractive index (n value) and optical absorption coefficient (also referred to as a k value or an attenuation coefficient) of the resist underlayer film at a wavelength of 193 nm were measured using a spectroscopic ellipsometer. The results are shown in Tables 1 to 5.

TABLE 1

| Refractive index n and optical absorption coefficient k | | |
|---|---|---|
| | | n/k 193 nm |
| Comparative Example 1 | 240° C. baked film | 1.41/0.58 |
| Example 1 | 240° C. baked film | 1.46/0.52 |
| Example 2 | 240° C. baked film | 1.44/0.55 |
| Example 3 | 240° C. baked film | 1.44/0.59 |

TABLE 2

| Refractive index n and optical absorption coefficient k | | |
|---|---|---|
| | | n/k 193 nm |
| Comparative Example 2 | 240° C. baked film | 1.38/0.37 |
| Example 4 | 240° C. baked film | 1.42/0.30 |

TABLE 3

| Refractive index n and optical absorption coefficient k | | |
|---|---|---|
| | | n/k 193 nm |
| Comparative Example 3 | 240° C. baked film | 1.40/0.57 |
| Example 5 | 240° C. baked film | 1.43/0.60 |
| Example 6 | 240° C. baked film | 1.42/0.58 |
| Example 7 | 240° C. baked film | 1.42/0.60 |
| Example 8 | 240° C. baked film | 1.40/0.59 |

TABLE 4

| Refractive index n and optical absorption coefficient k | | |
|---|---|---|
| | | n/k 193 nm |
| Comparative Example 4 | 240° C. baked film | 1.40/0.62 |
| Example 9 | 240° C. baked film | 1.43/0.56 |

TABLE 5

| Refractive index n and optical absorption coefficient k | | |
|---|---|---|
| | | n/k 193 nm |
| Comparative Example 5 | 240° C. baked film | 1.41/0.62 |
| Example 10 | 240° C. baked film | 1.43/0.59 |

TABLE 5-continued

| Refractive index n and optical absorption coefficient k | | |
|---|---|---|
| | | n/k 193 nm |
| Example 11 | 240° C. baked film | 1.41/0.62 |
| Example 12 | 240° C. baked film | 1.42/0.62 |

[Measurement of Dry Etching Rate]

The following etcher and etching gas were used to measure a dry etching rate.

RIE-10NR (manufactured by SAMCO Inc.): $CF_4$

The solution of the resist underlayer film-forming composition prepared in each of Comparative Examples 1 to 5 and Examples 1 to 12 was applied onto a silicon wafer using a spin coater, followed by baking on a hot plate at 240° C. for 60 seconds, to form a resist underlayer film (film thickness: 0.20 μm). The dry etching rate was measured using $CF_4$ gas as the etching gas and the dry etching rate ratio in each of Comparative Examples 1 to 5 and Examples 1 to 12 was determined. The dry etching rate ratio is a dry etching rate ratio of (resist underlayer film)/(KrF photoresist). The results are shown in Tables 6 to 10.

TABLE 6

| Dry etching rate ratio | | |
|---|---|---|
| | | Etching rate |
| Comparative Example 1 | 240° C. baked film | 0.84 |
| Example 1 | 240° C. baked film | 0.86 |
| Example 2 | 240° C. baked film | 0.89 |
| Example 3 | 240° C. baked film | 0.87 |

TABLE 7

| Dry etching rate ratio | | |
|---|---|---|
| | | Etching rate |
| Comparative Example 2 | 240° C. baked film | 1.05 |
| Example 4 | 240° C. baked film | 1.08 |

TABLE 8

| Dry etching rate ratio | | |
|---|---|---|
| | | Etching rate |
| Comparative Example 3 | 240° C. baked film | 0.93 |
| Example 5 | 240° C. baked film | 0.87 |
| Example 6 | 240° C. baked film | 0.87 |
| Example 7 | 240° C. baked film | 0.83 |
| Example 8 | 240° C. baked film | 0.84 |

TABLE 9

| Dry etching rate ratio | | |
|---|---|---|
| | | Etching rate |
| Comparative Example 4 | 240° C. baked film | 0.86 |
| Example 9 | 240° C. baked film | 0.85 |

TABLE 10

| Dry etching rate ratio | | |
|---|---|---|
| | | Etching rate |
| Comparative Example 5 | 240° C. baked film | 0.87 |
| Example 10 | 240° C. baked film | 0.88 |
| Example 11 | 240° C. baked film | 0.85 |
| Example 12 | 240° C. baked film | 0.86 |

(Evaluation of Embeddability)

Embeddability of a 200 nm-thick $SiO_2$ substrate in a dense pattern area having a trench width of 50 nm and a pitch of 100 nm was observed. The resist underlayer film-forming composition prepared in each of Comparative Examples 1 to 5 and Examples 1 to 12 was applied onto the substrate, and the composition was baked at 240° C. for 60 seconds, thereby forming a resist underlayer film having a thickness of about 200 nm. The cross-sectional shape of the substrate was observed with a scanning electron microscope (S-4800) manufactured by Hitachi High-Technologies Corporation to confirm the presence or absence of filling of the resist underlayer film-forming composition in the pattern. The results are shown in Tables 11 to 15. When the resist underlayer film was formed inside the pattern without a gap, embeddability was indicated by good "○", and when the inside of the pattern was not filled or a hole or gap was present inside the pattern, embeddability was indicated by poor "x".

TABLE 11

| Evaluation of embeddability | | |
|---|---|---|
| | | Embeddability |
| Comparative Example 1 | 240° C. baked film | ○ |
| Example 1 | 240° C. baked film | ○ |
| Example 2 | 240° C. baked film | ○ |
| Example 3 | 240° C. baked film | ○ |

TABLE 12

| Evaluation of embeddability | | |
|---|---|---|
| | | Embeddability |
| Comparative Example 2 | 240° C. baked film | ○ |
| Example 4 | 240° C. baked film | ○ |

TABLE 13

| Evaluation of embeddability | | |
|---|---|---|
| | | Embeddability |
| Comparative Example 3 | 240° C. baked film | ○ |
| Example 5 | 240° C. baked film | ○ |
| Example 6 | 240° C. baked film | ○ |
| Example 7 | 240° C. baked film | ○ |
| Example 8 | 240° C. baked film | ○ |

TABLE 14

| Evaluation of embeddability | | |
|---|---|---|
| | | Embeddability |
| Comparative Example 4 | 240° C. baked film | ○ |
| Example 9 | 240° C. baked film | ○ |

TABLE 15

| Evaluation of embeddability | | |
|---|---|---|
| | | Embeddability |
| Comparative Example 5 | 240° C. baked film | ○ |
| Example 10 | 240° C. baked film | ○ |
| Example 11 | 240° C. baked film | ○ |
| Example 12 | 240° C. baked film | ○ |

The crosslinking agent used in each of Examples 1 to 12 exhibits good embeddability similarly to the crosslinking agent according to the related art.

(Test for Coating to Stepped Substrate)

As a test for coating to a stepped substrate, with a 200 nm-thick $SiO_2$ substrate, the coating thickness in the dense area (DENSE) having a trench width of 50 nm and a pitch of 100 nm was compared with that in the open area (OPEN), in which the pattern was not formed. The resist underlayer film-forming composition prepared in each of Comparative Examples 1 to 5 and Examples 1 to 11 was applied onto the substrate, and the composition was baked at 240° C. for 60 seconds, thereby forming a resist underlayer film having a thickness of about 200 nm. The planarity of the substrate was evaluated by measuring, by the observation, using a scanning electron microscope (S-4800) manufactured by Hitachi High-Technologies Corporation, of the difference (called as a bias which was an application step between the trench area and the open area) in thickness between the trench area (pattern portion) and the open area (no pattern portion) of the stepped substrate. Here, the planarity means that the difference (Iso-dense bias) in thickness of the coated product existing on the portion where a pattern exists (dense area (patterned portion)) and the portion where no pattern exists (open area (unpatterned portion)) is small. The results are shown in Tables 16 to 20. The examples in which the improvement (decrease by less than 15 nm) was observed were evaluated as o, and the examples in which the significant improvement (decrease by 15 nm or more) was observed were evaluated as ◎, relative to the evaluation A of Comparative Example (control).

TABLE 16

| Evaluation of planarity | | |
|---|---|---|
| | | Planarity |
| Comparative Example 1 | 240° C. baked film | Δ (Control) |
| Example 1 | 240° C. baked film | ◎ |
| Example 2 | 240° C. baked film | ◎ |
| Example 3 | 240° C. baked film | ○ |

TABLE 17

| Evaluation of planarity | | |
|---|---|---|
| | | Planarity |
| Comparative Example 2 | 240° C. baked film | Δ (Control) |
| Example 4 | 240° C. baked film | ◎ |

TABLE 18

| Evaluation of planarity | | |
|---|---|---|
| | | Planarity |
| Comparative Example 3 | 240° C. baked film | Δ (Control) |
| Example 5 | 240° C. baked film | ◎ |
| Example 6 | 240° C. baked film | ○ |
| Example 7 | 240° C. baked film | ○ |
| Example 8 | 240° C. baked film | ◎ |

TABLE 19

| Evaluation of planarity | | |
|---|---|---|
| | | Planarity |
| Comparative Example 4 | 240° C. baked film | Δ (Control) |
| Example 9 | 240° C. baked film | ○ |

TABLE 20

| Evaluation of planarity | | |
|---|---|---|
| | | Planarity |
| Comparative Example 5 | 240° C. baked film | Δ (Control) |
| Example 10 | 240° C. baked film | ○ |
| Example 11 | 240° C. baked film | ○ |
| Example 12 | 240° C. baked film | ○ |

In Examples 1 to 12, it was confirmed that the planarity was improved as compared with Comparative Examples.

Synthesis Example 21

A 100 mL two-necked flask was charged with 19.12 g of TMOM-BP (manufactured by Honshu Chemical Industry Co., Ltd.), 15.00 g RE810-NM (manufactured by Nippon Kayaku Co., Ltd.), 0.65 g of ethyltriphenylphosphonium bromide (manufactured by HOKKO CHEMICAL INDUSTRY CO., LTD.), and 81.14 g of propylene glycol monomethyl ether. Thereafter, the mixture was heated to 140° C. and was stirred under reflux for about 14 hours. After the completion of the reaction, 34.8 g of an anion exchange resin (trade name: DOWEX [registered trademark] 550A, MUROMACHI CHEMICALS INC.) and 34.8 g of a cation exchange resin (trade name: Amberlite [registered trademark] 15JWET, ORGANO CORPORATION) were added to the solution, and an ion exchange treatment was performed at room temperature for 4 hours. After separation of the ion exchange resin, a compound solution (1-21) was obtained. The weight average molecular weight Mw measured in terms of polystyrene by GPC was 6,000.

Formula (1-21)

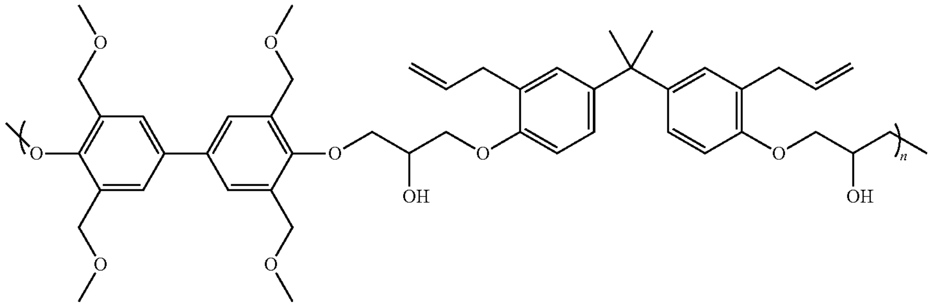

Synthesis Example 22

A 100 mL two-necked flask was charged with 26.96 g of TMOM-BP (manufactured by Honshu Chemical Industry Co., Ltd.), 10.00 g of 1,4-butanediol diglycidyl ether (manufactured by Tokyo Chemical Industry Co., Ltd.), 0.92 g of ethyltriphenylphosphonium bromide (manufactured by HOKKO CHEMICAL INDUSTRY CO., LTD.), and 56.8 g of propylene glycol monomethyl ether. Thereafter, the mixture was heated to 140° C. and was stirred under reflux for about 14.5 hours. After the completion of the reaction, the solution was diluted with propylene glycol monomethyl ether. 37.9 g of an anion exchange resin (trade name: DOWEX [registered trademark] 550A, MUROMACHI CHEMICALS INC.) and 37.9 g of a cation exchange resin (trade name: Amberlite [registered trademark] 15JWET, ORGANO CORPORATION) were added to the diluted solution, and an ion exchange treatment was performed at room temperature for 4 hours. After separation of the ion exchange resin, a compound solution (1-22) was obtained. The weight average molecular weight Mw measured in terms of polystyrene by GPC was 4,800.

Formula (1-22)

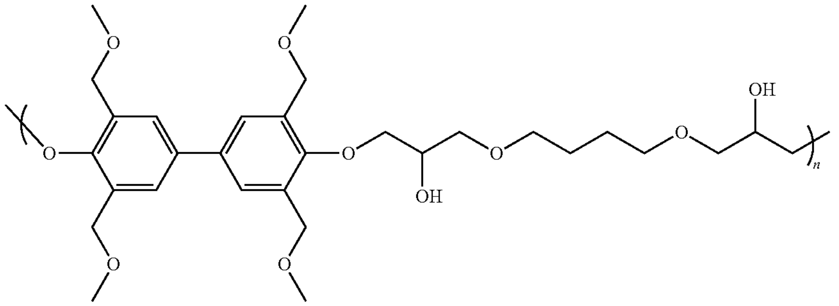

Synthesis Example 23

A 100 mL two-necked flask was charged with 17.45 g of TMOM-BP (manufactured by Honshu Chemical Industry Co., Ltd.), 15.00 g of HP-6000 (manufactured by DIC Corporation), 0.60 g of ethyltriphenylphosphonium bromide (manufactured by HOKKO CHEMICAL INDUSTRY CO., LTD.), and 77.1 g of propylene glycol monomethyl ether. Thereafter, the mixture was heated to 140° C. and was stirred under reflux for about 12 hours. After the completion of the reaction, 33.0 g of an anion exchange resin (trade name: DOWEX [registered trademark] 550A, MUROMACHI CHEMICALS INC.) and 33.0 g of a cation exchange resin (trade name: Amberlite [registered trademark] 15JWET, ORGANO CORPORATION) were added to the solution, and an ion exchange treatment was performed at room temperature for 4 hours. After the ion exchange resin was separated, a compound solution (1-23) was obtained. The weight average molecular weight Mw measured in terms of polystyrene by GPC was 10,500.

Synthesis Example 24

A 100 mL two-necked flask was charged with 22.0 g of TMOM-BP (manufactured by Honshu Chemical Industry Co., Ltd.), 15.00 g of YX-4000 (manufactured by Mitsubishi Chemical Holdings Corporation), 0.75 g of ethyltriphenylphosphonium bromide (manufactured by HOKKO CHEMICAL INDUSTRY CO., LTD.), and 88.1 g of propylene glycol monomethyl ether. Thereafter, the mixture was heated to 140° C. and was stirred under reflux for about 12 hours. After the completion of the reaction, 37.8 g of an anion exchange resin (trade name: DOWEX [registered trademark] 550A, MUROMACHI CHEMICALS INC.) and 37.8 g of a cation exchange resin (trade name: Amberlite [registered trademark] 15JWET, ORGANO CORPORATION) were added to the solution, and an ion exchange treatment was performed at room temperature for 4 hours. After separation of the ion exchange resin, a compound solution (1-24) was obtained. The weight average molecular weight Mw measured in terms of polystyrene by GPC was 4,200.

Formula (1-23)

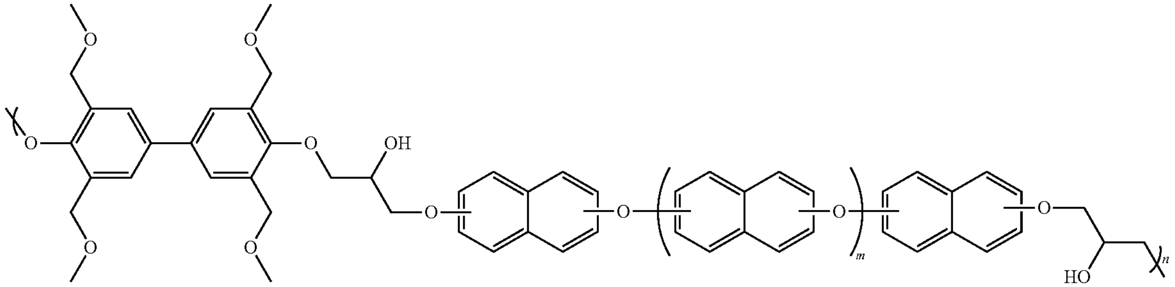

Formula (1-24)

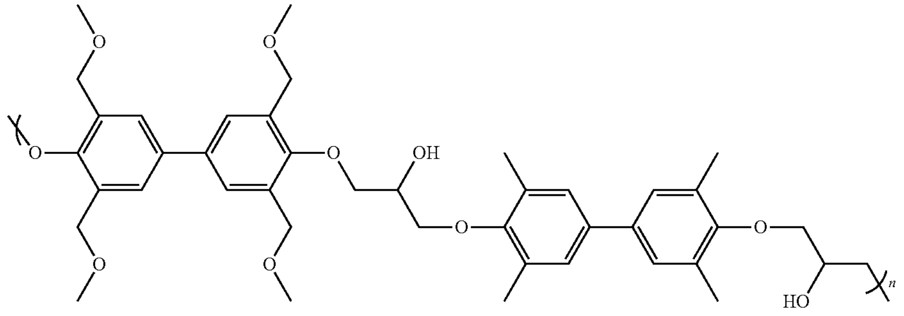

Synthesis Example 25

A 100 mL two-necked flask was charged with 17.5 g of TMOM-BP (manufactured by Honshu Chemical Industry Co., Ltd.), 15.00 g of 9,9-bis(4-glycidyloxyphenyl) fluorene (manufactured by Tokyo Chemical Industry Co., Ltd.), 0.60 g of ethyltriphenylphosphonium bromide (manufactured by HOKKO CHEMICAL INDUSTRY CO., LTD.), and 77.2 g of propylene glycol monomethyl ether. Thereafter, the mixture was heated to 140° C. and was stirred under reflux for about 12 hours. After the completion of the reaction, 33.1 g of an anion exchange resin (trade name: DOWEX [registered trademark] 550A, MUROMACHI CHEMICALS INC.) and 33.1 g of a cation exchange resin (trade name: Amberlite [registered trademark] 15JWET, ORGANO CORPORATION) were added to the solution, and an ion exchange treatment was performed at room temperature for 4 hours. After separation of the ion exchange resin, a compound solution (1-25) was obtained. The weight average molecular weight Mw measured in terms of polystyrene by GPC was 5,200.

Synthesis Example 26

A 100 mL two-necked flask was charged with 25.7 g of TMOM-BP (manufactured by Honshu Chemical Industry Co., Ltd.), 15.00 g of diglycidyl 4-cyclohexene-1,2-dicarboxylate (manufactured by Tokyo Chemical Industry Co., Ltd.), 0.89 g of ethyltriphenylphosphonium bromide (manufactured by HOKKO CHEMICAL INDUSTRY CO., LTD.), and 97.0 g of propylene glycol monomethyl ether. Thereafter, the mixture was heated to 140° C. and was stirred under reflux for about 12 hours. After the completion of the reaction, 41.6 g of an anion exchange resin (trade name: DOWEX [registered trademark] 550A, MUROMACHI CHEMICALS INC.) and 41.6 g of a cation exchange resin (trade name: Amberlite [registered trademark] 15JWET, ORGANO CORPORATION) were added to the solution, and an ion exchange treatment was performed at room temperature for 4 hours. After separation of the ion exchange resin, a compound solution (1-26) was obtained. The weight average molecular weight Mw measured in terms of polystyrene by GPC was 2,900.

Formula (1-25)

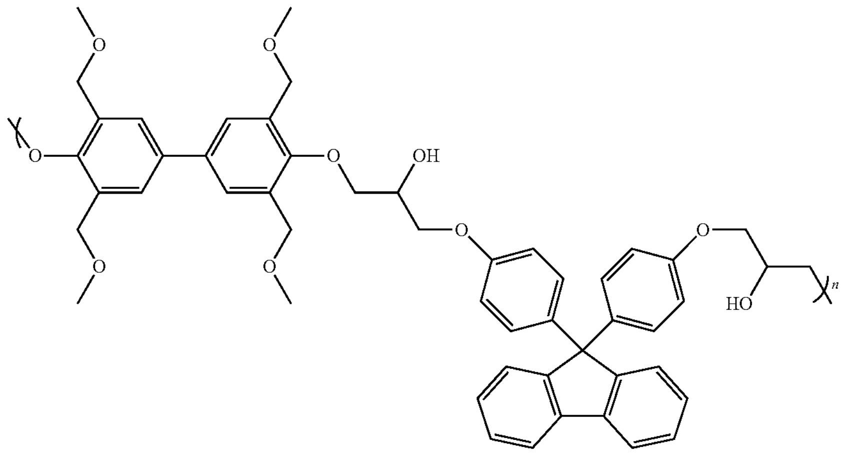

Formula (1-26)

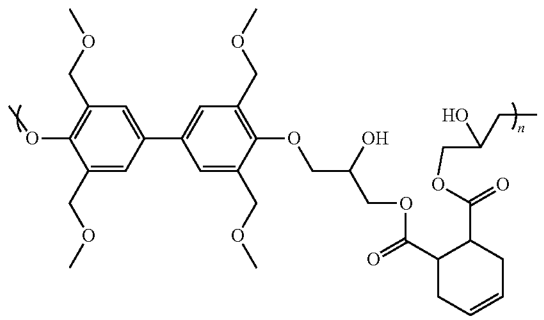

Synthesis Example 27

A polymer was obtained by the method described in Synthesis Example 10 of the description of Japanese Patent No. 6191831. The weight average molecular weight Mw measured in terms of polystyrene by GPC was 2,000. The obtained polymer was dissolved in propylene glycol monomethyl ether acetate. An anion exchange resin (trade name: DOWEX [registered trademark] 550A, MUROMACHI CHEMICALS INC.) and a cation exchange resin (trade name: Amberlite [registered trademark] 15JWET, ORGANO CORPORATION) were added to the solution, and an ion exchange treatment was performed at room temperature for 4 hours, thereby obtaining a compound solution (1-27).

Synthesis Example 28

To 100 mL two-necked flask, 72.46 g of propylene glycol monomethyl ether, 26.00 g of RE810-NM (manufactured by Nippon Kayaku Co., Ltd.), 20.81 g of BPA-CA (manufactured by Konishi Chemical Inc Co., Ltd.), 2.18 g of ethyltriphenylphosphonium bromide, and 0.32 g of hydroquinone were added, and the reaction was allowed to proceed at 140° C. for 24 hours, thereby obtaining a solution containing a reaction product. The solution was diluted to a 20 wt % solution with propylene glycol monomethyl ether. 147.90 g of an anion exchange resin (trade name: DOWEX [registered trademark] 550A, MUROMACHI CHEMICALS INC.) and 147.90 g of a cation exchange resin (trade name: Amberlite [registered trademark] 15JWET, ORGANO CORPORATION) were added to the diluted solution. The resultant mixture was stirred at 60° C. for 4 hours and filtered, and the resin was separated, thereby obtaining a compound solution (1-28). The weight average molecular weight Mw measured in terms of polystyrene by GPC was 18,000.

Formula (1-28)

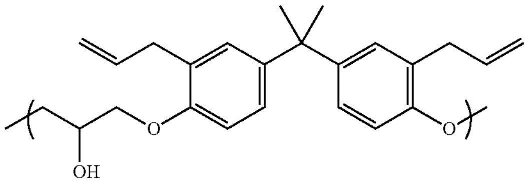

Example 21

To 3.34 g of the compound solution (1-27) (solid content: 29.9% by mass), 0.10 g of propylene glycol monomethyl ether acetate containing 1% by mass of a surfactant (MEGAFACE R-40, manufactured by DIC Corporation), 1.74 g of the compound solution (1-22) (solid content: 28.5% by mass), 7.01 g of propylene glycol monomethyl ether acetate, and 2.80 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 22

To 3.34 g of the compound solution (1-27) (solid content: 29.9% by mass), 0.10 g of propylene glycol monomethyl ether acetate containing 1% by mass of a surfactant (MEGAFACE R-40, manufactured by DIC Corporation), 1.74 g of the compound solution (1-21) (solid content: 28.7% by mass), 7.01 g of propylene glycol monomethyl ether acetate, and 2.81 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 23

To 3.34 g of the compound solution (1-27) (solid content: 29.9% by mass), 0.10 g of propylene glycol monomethyl ether acetate containing 1% by mass of a surfactant (MEGAFACE R-40, manufactured by DIC Corporation), 1.89 g of the compound solution (1-23) (solid content: 26.4% by mass), 7.01 g of propylene glycol monomethyl ether acetate, and 2.66 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 24

To 3.34 g of the compound solution (1-27) (solid content: 29.9% by mass), 0.10 g of propylene glycol monomethyl ether acetate containing a 1% surfactant (MEGAFACE R-40, manufactured by DIC Corporation), 1.99 g of the compound solution (1-24) (solid content: 25.1% by mass), 7.01 g of propylene glycol monomethyl ether acetate, and 2.56 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 25

To 3.34 g of the compound solution (1-27) (solid content: 29.9% by mass), 0.10 g of propylene glycol monomethyl ether acetate containing 1% by mass of a surfactant (MEGAFACE R-40, manufactured by DIC Corporation), 1.84 g of the compound solution (1-25) (solid content: 27.2% by mass), 7.01 g of propylene glycol monomethyl ether acetate, and 2.71 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 26

To 3.34 g of the compound solution (1-27) (solid content: 29.9% by mass), 0.10 g of propylene glycol monomethyl ether acetate containing 1% by mass of a surfactant (MEGAFACE R-40, manufactured by DIC Corporation), 1.84 g of the compound solution (1-26) (solid content: 26.4% by mass), 7.01 g of propylene glycol monomethyl ether acetate, and 2.66 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 27

To 3.49 g of propylene glycol monomethyl ether acetate containing NeoFARIT 7177C (manufactured by Mitsubishi Gas Chemical Company Inc.) (solid content: 28.7% by mass), 0.10 g of propylene glycol monomethyl ether acetate containing 1% by mass of a surfactant (MEGAFACE R-40, manufactured by DIC Corporation), 1.75 g of the compound solution (1-22) (solid content: 28.5% by mass), 6.86 g of propylene glycol monomethyl ether acetate, and 2.80 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 28

To 3.42 g of propylene glycol monomethyl ether acetate containing NeoFARIT 7177C (manufactured by Mitsubishi Gas Chemical Company Inc.) (solid content: 28.7% by mass), 0.10 g of propylene glycol monomethyl ether acetate containing 1% by mass of a surfactant (MEGAFACE R-40, manufactured by DIC Corporation), 1.72 g of the compound solution (1-22) (solid content: 28.5% by mass), 1.47 g of propylene glycol monomethyl ether containing 2% by mass of pyridinium p-hydroxybenzenesulfonate, 6.92 g of propylene glycol monomethyl ether acetate, and 1.38 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 29

To 4.97 g of the compound solution (1-28) (solid content: 20.1% by mass), 0.10 g of propylene glycol monomethyl ether acetate containing 1% by mass of a surfactant (MEGAFACE R-40, manufactured by DIC Corporation), 1.75 g of the compound solution (1-22) (solid content: 28.5% by mass), 3.95 g of propylene glycol monomethyl ether acetate, and 4.23 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 30

To 4.87 g of the compound solution (1-28) (solid content: 20.1% by mass), 0.10 g of propylene glycol monomethyl ether acetate containing 1% by mass of a surfactant (MEGAFACE R-40, manufactured by DIC Corporation), 1.72 g of the compound solution (1-22) (solid content: 28.5% by mass), 1.47 g of propylene glycol monomethyl ether containing 2% by mass of pyridinium p-hydroxybenzenesulfonate, 3.95 g of propylene glycol monomethyl ether acetate, and 2.89 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 31

To 2.78 g of the compound solution (1-21) (solid content: 28.7% by mass), 0.16 g of propylene glycol monomethyl ether acetate containing 1% by mass of a surfactant (MEGAFACE R-40, manufactured by DIC Corporation), 2.60 g of propylene glycol monomethyl ether acetate, and 4.46 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 32

To 2.80 g of the compound solution (1-22) (solid content: 28.5% by mass), 0.16 g of propylene glycol monomethyl ether acetate containing 1% by mass of a surfactant (MEGAFACE R-40, manufactured by DIC Corporation), 2.60 g of propylene glycol monomethyl ether acetate, and 4.44 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 33

To 3.02 g of the compound solution (1-23) (solid content: 26.4% by mass), 0.16 g of propylene glycol monomethyl ether acetate containing 1% by mass of a surfactant (MEGAFACE R-40, manufactured by DIC Corporation), 2.60 g of propylene glycol monomethyl ether acetate, and 4.21 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 34

To 3.18 g of the compound solution (1-24) (solid content: 25.1% by mass), 0.16 g of propylene glycol monomethyl ether acetate containing 1% by mass of a surfactant (MEGAFACE R-40, manufactured by DIC Corporation), 2.60 g of propylene glycol monomethyl ether acetate, and 4.06 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 35

To 2.94 g of the compound solution (1-25) (solid content: 27.2% by mass), 0.16 g of propylene glycol monomethyl ether acetate containing 1% by mass of a surfactant (MEGAFACE R-40, manufactured by DIC Corporation), 2.60 g of propylene glycol monomethyl ether acetate, and 4.30 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 36

To 3.02 g of the compound solution (1-26) (solid content: 26.4% by mass), 0.16 g of propylene glycol monomethyl ether acetate containing 1% by mass of a surfactant (MEGAFACE R-40, manufactured by DIC Corporation), 2.60 g of propylene glycol monomethyl ether acetate, and 4.21 g of propylene glycol monomethyl ether were added and dissolved. The solution was filtered with a polytetrafluoroethylene microfilter having a diameter of 0.1 μm, thereby preparing a solution of a resist underlayer film-forming composition.

Example 37

To 2.72 g of the compound solution (1-22) (solid content: 28.5% by mass), 0.16 g of propylene glycol monomethyl ether acetate containing 1% by mass of a surfactant (MEGAFACE R-40, manufactured by DIC Corporation), 1.16 g of propylene glycol monomethyl ether containing 2% by mass of pyridinium p-hydroxybenzenesulfonate, 2.61 g of propylene glycol monomethyl ether acetate, and 3.36 g of propylene glycol monomethyl ether were added and dissolved. The solution was filtered with a polytetrafluoroethylene microfilter having a diameter of 0.1 μm, thereby preparing a solution of a resist underlayer film-forming composition.

Comparative Example 21

To 2.62 g of the compound solution (1-27) (solid content: 29.9% by mass), 0.08 g of propylene glycol monomethyl ether acetate containing 1% by mass of a surfactant (MEGAFACE R-40, manufactured by DIC Corporation), 0.39 g of TMOM-BP (manufactured by Honshu Chemical Industry Co., Ltd.), 1.18 g of propylene glycol monomethyl ether containing 2% by mass of pyridinium p-hydroxybenzenesulfonate, 7.74 g of propylene glycol monomethyl ether acetate, and 2.99 g of propylene glycol monomethyl ether were added and dissolved. The solution was filtered with a polytetrafluoroethylene microfilter having a diameter of 0.1 μm, thereby preparing a solution of a resist underlayer film-forming composition.

Comparative Example 22

To 2.62 g of the compound solution (1-27) (solid content: 29.9% by mass), 0.08 g of propylene glycol monomethyl ether acetate containing 1% by mass of a surfactant (MEGAFACE R-40, manufactured by DIC Corporation), 0.39 g of PL-LI (manufactured by Midori Kagaku Co., Ltd.), 1.18 g of propylene glycol monomethyl ether containing 2% by mass of pyridinium p-hydroxybenzenesulfonate, 7.74 g of propylene glycol monomethyl ether acetate, and 2.99 g of propylene glycol monomethyl ether were added and dissolved. The solution was filtered with a polytetrafluoroethylene microfilter having a diameter of 0.1 μm, thereby preparing a solution of a resist underlayer film-forming composition.

Comparative Example 23

To 3.42 g of propylene glycol monomethyl ether acetate containing NeoFARIT 7177C (manufactured by Mitsubishi Gas Chemical Company Inc.) (solid content: 28.7% by mass), 0.10 g of propylene glycol monomethyl ether acetate containing 1% by mass of a surfactant (MEGAFACE R-40, manufactured by DIC Corporation), 0.49 g of PL-LI (manufactured by Midori Kagaku Co., Ltd.), 1.47 g of propylene glycol monomethyl ether containing 2% by mass of pyridinium p-hydroxybenzenesulfonate, 6.92 g of propylene glycol monomethyl ether acetate, and 2.61 g of propylene glycol monomethyl ether were added and dissolved. The solution was filtered with a polytetrafluoroethylene microfilter having a diameter of 0.1 μm, thereby preparing a solution of a resist underlayer film-forming composition.

Comparative Example 24

To 4.87 g of the compound solution (1-28) (solid content: 20.1% by mass), 0.10 g of propylene glycol monomethyl ether acetate containing 1% by mass of a surfactant (MEGAFACE R-40, manufactured by DIC Corporation), 0.49 g of PL-LI (manufactured by Midori Kagaku Co., Ltd.), 1.47 g of propylene glycol monomethyl ether containing 2% by mass of pyridinium p-hydroxybenzenesulfonate, 3.95 g of propylene glycol monomethyl ether acetate, and 4.12 g of propylene glycol monomethyl ether were added and dissolved. The solution was filtered with a polytetrafluoroethylene microfilter having a diameter of 0.1 μm, thereby preparing a solution of a resist underlayer film-forming composition.

(Elution Test in Resist Solvent)

The solution of the resist underlayer film-forming composition prepared in each of Comparative Examples 21 to 24 and Examples 21 to 37 was applied onto a silicon wafer using a spin coater, followed by baking on a hot plate at 250° for 60 seconds or at 260° for 60 seconds, thereby forming a resist underlayer film (film thickness: 0.20 μm). The resist underlayer film was immersed in ethyl lactate, propylene glycol monomethyl ether, propylene glycol monomethyl ether acetate, and cyclohexanone, which were solvents used for the resist. The resist underlayer film was insoluble in these solvents.

(Confirmation of Curing End Temperature)

The solution of the resist underlayer film-forming composition prepared in each of Comparative Examples 21 and 22 and Examples 21 to 26 was applied onto a silicon wafer using a spin coater, followed by baking on a hot plate at a predetermined temperature for 60 seconds, thereby forming a resist underlayer film (film thickness: 0.20 μm). The temperature at which the resist underlayer film was not eluted in a solution in which propylene glycol monomethyl ether and propylene glycol monomethyl ether acetate were mixed in a ratio of 7:3 (=curing end temperature) was confirmed. The test was performed in the same procedures as in the elution test in the resist solvent (Table 21).

TABLE 21

| Curing end temperature | |
|---|---|
| | Curing end temperature (° C.) |
| Example 21 | 230 |
| Example 22 | 230 |
| Example 23 | 220 |
| Example 24 | 230 |
| Example 25 | 230 |
| Example 26 | 220 |
| Comparative Example 21 | 160 |
| Comparative Example 22 | 140 |

The curing end temperature in each of Examples 21 to 26 was higher than those of Comparative Examples 21 and 22. It was found that the crosslinking agents used in each of Examples provide a higher fluidity and slower curing rate than the conventional crosslinking agents.

(Measurement of Optical Constant)

The solution of the resist underlayer film-forming composition prepared in each of Comparative Examples 21 to 24 and Examples 21 to 37 was applied onto a silicon wafer using a spin coater, followed by baking on a hot plate at 250° C. for 60 seconds or at 260° for 60 seconds, to form a resist underlayer film (film thickness: 0.05 μm). The refractive index (n value) and optical absorption coefficient (also referred to as a k value or an attenuation coefficient) of the resist underlayer film at a wavelength of 193 nm were measured using a spectroscopic ellipsometer (Table 22).

[Table 22]

TABLE 22

| Refractive index n and optical absorption coefficient k | | |
|---|---|---|
| | | n/k 193 nm |
| Example 21 | 250° C. baked film | 1.45/0.50 |
| Example 22 | 250° C. baked film | 1.45/0.55 |
| Example 23 | 250° C. baked film | 1.45/0.55 |
| Example 24 | 250° C. baked film | 1.44/0.52 |
| Example 25 | 250° C. baked film | 1.44/0.58 |
| Example 26 | 250° C. baked film | 1.47/0.51 |
| Example 27 | 250° C. baked film | 1.44/0.50 |
| Example 28 | 250° C. baked film | 1.42 · 0.52 |
| Example 29 | 250° C. baked film | 1.49/0.49 |
| Example 30 | 250° C. baked film | 1.49 · 0.50 |
| Example 31 | 260° C. baked film | 1.48/0.42 |
| Example 32 | 260° C. baked film | 1.54/0.22 |
| Example 33 | 260° C. baked film | 1.48/0.37 |
| Example 34 | 260° C. baked film | 1.48/0.30 |
| Example 35 | 260° C. baked film | 1.46/0.51 |
| Example 36 | 260° C. baked film | 1.58/0.31 |
| Example 37 | 260° C. baked film | 1.51/0.27 |
| Comparative Example 21 | 250° C. baked film | 1.40/0.56 |
| Comparative Example 22 | 250° C. baked film | 1.49/0.55 |
| Comparative Example 23 | 250° C. baked film | 1.46/0.55 |
| Comparative Example 24 | 250° C. baked film | 1.55/0.51 |

As can be seen from Examples 31 to 37, the optical constant of crosslinking agent can be greatly altered by changing the type of the epoxy compound. When comparing Examples 21 to 26 using the inventive crosslinking agents with Comparative Examples 21 and 22 using the conventional crosslinking agents, the optical constants of materials having the same composition ratio can be altered by changing the type of crosslinking agent. This tendency is the same in each of Comparative Example 23 and Examples 27 and 28 and Comparative Example 24 and Examples 30 and 31, and the reflectance can be suppressed by selecting an appropriate crosslinking agent.

[Measurement of Dry Etching Rate]

The following etcher and etching gas were used to measure a dry etching rate.

RIE-10NR (manufactured by SAMCO Inc.): $CF_4$

The solution of the resist underlayer film-forming composition prepared in each of Comparative Examples 21 to 24 and Examples 21 to 37 was applied onto a silicon wafer using a spin coater, followed by baking on a hot plate at 250° C. for 60 seconds or at 260° for 60 seconds, to form a resist underlayer film (film thickness: 0.20 μm). The dry etching rate was measured using $CF_4$ gas as the etching gas and a dry etching rate ratio in each of Comparative Examples 21 to 24 and Examples 21 to 37 was determined. The dry etching rate ratio is a dry etching rate ratio of (resist underlayer film)/(KrF photoresist) (Table 23).

TABLE 23

| Dry etching rate ratio | | |
|---|---|---|
| | | Etching rate |
| Example 21 | 250° C. baked film | 0.93 |
| Example 22 | 250° C. baked film | 0.90 |
| Example 23 | 250° C. baked film | 0.89 |
| Example 24 | 250° C. baked film | 0.91 |
| Example 25 | 250° C. baked film | 0.88 |
| Example 26 | 250° C. baked film | 0.94 |
| Example 27 | 250° C. baked film | 0.99 |
| Example 28 | 250° C. baked film | 0.95 |
| Example 29 | 250° C. baked film | 1.10 |
| Example 30 | 250° C. baked film | 1.06 |
| Example 31 | 260° C. baked film | 1.13 |
| Example 32 | 260° C. baked film | 1.28 |
| Example 33 | 260° C. baked film | 1.10 |
| Example 34 | 260° C. baked film | 1.16 |
| Example 35 | 260° C. baked film | 1.07 |
| Example 36 | 260° C. baked film | 1.19 |
| Example 37 | 260° C. baked film | 1.23 |
| Comparative Example 21 | 250° C. baked film | 0.87 |
| Comparative Example 22 | 250° C. baked film | 0.99 |
| Comparative Example 23 | 250° C. baked film | 1.05 |
| Comparative Example 24 | 250° C. baked film | 1.11 |

As can be seen from Examples 31 to 37, the etching rate of the crosslinking agent can be greatly altered by changing the type of epoxy compound. When comparing Examples 21 to 26 using the inventive crosslinking agents with Comparative Examples 21 and 22 using the conventional crosslinking agents, the etching rate of materials having the same composition ratio can be altered by changing the type of crosslinking agent. This tendency is the same in each of Comparative Example 23 and Examples 27 and 28 and Comparative Example 24 and Examples 30 and 31, and the processability can be improved by adjusting an appropriate etching rate.

(Evaluation of Embeddability)

Embeddability of a 200 nm-thick $SiO_2$ substrate in a dense pattern area having a trench width of 50 nm and a pitch of 100 nm was observed. The resist underlayer film-forming composition prepared in each of Comparative Examples 21 to 24 and Examples 21 to 37 was applied onto the substrate, and the composition was baked at 250° for 60 seconds or at 260° C. for 60 seconds, thereby forming a resist underlayer film having a thickness of about 200 nm. The planarity of the substrate was observed using a scanning electron microscope (S-4800) manufactured by Hitachi High-Technologies Corporation to confirm the presence or absence of filling of the resist underlayer film-forming composition in the pattern (Table 24). When the resist underlayer film was formed inside the pattern without a gap, embeddability was indicated by good "○", and when the inside of the pattern was not filled or a hole or gap was present inside the pattern, embeddability was indicated by poor "x".

TABLE 24

| Evaluation of embeddability | | |
|---|---|---|
| | | Embeddability |
| Example 21 | 250° C. baked film | ○ |
| Example 22 | 250° C. baked film | ○ |
| Example 23 | 250° C. baked film | ○ |
| Example 24 | 250° C. baked film | ○ |
| Example 25 | 250° C. baked film | ○ |
| Example 26 | 250° C. baked film | ○ |
| Example 27 | 250° C. baked film | ○ |
| Example 28 | 250° C. baked film | ○ |
| Example 29 | 250° C. baked film | ○ |
| Example 30 | 250° C. baked film | ○ |
| Example 31 | 260° C. baked film | ○ |
| Example 32 | 260° C. baked film | ○ |
| Example 33 | 260° C. baked film | ○ |
| Example 34 | 260° C. baked film | ○ |
| Example 35 | 260° C. baked film | ○ |
| Example 36 | 260° C. baked film | ○ |
| Example 37 | 260° C. baked film | ○ |
| Comparative Example 21 | 250° C. baked film | ○ |
| Comparative Example 22 | 250° C. baked film | ○ |
| Comparative Example 23 | 250° C. baked film | ○ |
| Comparative Example 24 | 250° C. baked film | ○ |

Examples 21 to 37 exhibit an embeddability equivalent to that of Comparative Examples 21 to 24 using the conventional crosslinking agents.

(Test for Coating to Stepped Substrate)

As a test for coating to a stepped substrate, with a 200 nm-thick $SiO_2$ substrate, the coating thickness in the 800 nm trench area (TRENCH) was compared with the coating thickness in the open area (OPEN), in which the pattern was not formed. The resist underlayer film-forming composition prepared in each of Comparative Examples 21 to 24 and Examples 21 to 37 was applied onto the substrate, and the composition was baked at 250° for 60 seconds or at 260° C. for 60 seconds, thereby forming a resist underlayer film having a thickness of about 200 nm. The planarity of the substrate was evaluated by measuring, by the observation, using a scanning electron microscope (S-4800) manufactured by Hitachi High-Technologies Corporation, of the difference (called as a bias which was an application step between the trench area and the open area) in thickness between the trench area (pattern portion) and the open area (no pattern portion) of the stepped substrate. Here, the planarity means that the difference (Iso-TRENCH bias) in thickness of the coated product existing on the portion where a pattern exists (TRENCH (patterned portion)) and the portion where no pattern exists (open area (unpatterned portion)) is small (Table 25). The examples in which the improvement of 15 nm or more relative to Comparative Example 21 was observed were evaluated as o, the examples in which the improvement of 30 nm or more relative to Comparative Example 21 was observed were evaluated as O, and the comparative examples in which the improvement was not observed were evaluated as x.

TABLE 25

| Evaluation of planarity | | |
|---|---|---|
| | | Planarity |
| Example 21 | 250° C. baked film | ◎ |
| Example 22 | 250° C. baked film | ◎ |
| Example 23 | 250° C. baked film | ◎ |
| Example 24 | 250° C. baked film | ◎ |
| Example 25 | 250° C. baked film | ◎ |
| Example 26 | 250° C. baked film | ◎ |
| Example 27 | 250° C. baked film | ◎ |
| Example 28 | 250° C. baked film | ○ |
| Example 29 | 250° C. baked film | ◎ |
| Example 30 | 250° C. baked film | ○ |
| Example 31 | 260° C. baked film | ◎ |
| Example 32 | 260° C. baked film | ◎ |
| Example 33 | 260° C. baked film | ◎ |
| Example 34 | 260° C. baked film | ◎ |
| Example 35 | 260° C. baked film | ◎ |
| Example 36 | 260° C. baked film | ◎ |
| Example 37 | 260° C. baked film | ◎ |
| Comparative Example 21 | 250° C. baked film | Δ (Control) |
| Comparative Example 22 | 250° C. baked film | X |
| Comparative Example 23 | 250° C. baked film | X |
| Comparative Example 24 | 250° C. baked film | X |

When comparing Comparative Example 22 with Examples 21 to 26, Comparative Example 23 with Examples 27 and 28, and Comparative Example 24 with Examples 29 and 30, significant improvement in planarity was observed in the Examples. In addition, when the composition of each of Examples 31 to 37, in which the resist underlayer film was formed with either the crosslinking agent or the crosslinking agent and the acid catalyst, was compared with such an ordinary composition of Comparative Example 22, significant improvement in planarity was observed. These results were attributable to the higher curing end temperature of the crosslinking agent used in each of Examples than the conventional crosslinking agents would permit keeping the flow time of the resin longer.

(Photocurability Test)

The resist underlayer film-forming composition prepared in each of Comparative Examples 21 to 24 and Examples 22, 26, 31, and 36 was applied onto a silicon wafer using a spin coater. The composition was heated on a hot plate for 60 seconds at a temperature at which the composition was not completely cured, to form a resist underlayer film. The resist underlayer film was irradiated with ultraviolet rays at 500 $mJ/cm^2$ by an ultraviolet irradiation apparatus using a UV irradiation unit (wavelength: 172 nm) manufactured by Ushio, Inc., to confirm its solvent peelability with light irradiation (ultraviolet irradiation). The measurement of the solvent peelability was carried out by immersing the coating film undergone the irradiation with ultraviolet rays in a solvent, in which propylene glycol monomethyl ether and propylene glycol monomethyl ether acetate were mixed in a ratio of 7:3, for 1 minute; spin-drying the solvent; baking the resultant film at 100° C. for 1 minute; and measuring the film thickness (Table 26). The films having a film thickness reduction amount of 1% or less were indicated by o, and the films having a film thickness reduction amount of 1% or more were indicated by x.

TABLE 26

| Evaluation of planarity | | | |
|---|---|---|---|
| | | Before light irradiation Solvent resistance | After light irradiation Solvent resistance |
| Example 22 | 200° C. baked film | X | ○ |
| Example 26 | 230° C. baked film | X | ○ |
| Example 31 | 240° C. baked film | X | ○ |
| Example 36 | 240° C. baked film | X | ○ |
| Comparative Example 21 | 250° C. baked film | X | X |
| Comparative Example 22 | 250° C. baked film | X | X |
| Comparative Example 23 | 250° C. baked film | X | X |
| Comparative Example 24 | 250° C. baked film | X | X |

It was confirmed that not only thermal curing characteristics but also photocuring characteristics were obtained by containing a crosslinking agent having a non-aromatic unsaturated bond in the molecule.

(Test for Coating to Stepped Substrate after Light Irradiation)

As a test for coating to a stepped substrate, with a 200 nm-thick $SiO_2$ substrate, the coating thickness in the 800 nm trench area (TRENCH) was compared with the coating thickness in the open area (OPEN), in which the pattern was not formed. The resist underlayer film-forming composition prepared in each of Examples 22, 26, and 31 was applied onto the substrate, and the composition was baked at the temperature as shown in the table, thereby forming a resist underlayer film having a thickness of about 200 nm. The resist underlayer film was irradiated with ultraviolet rays at 500 mJ/cm$^2$ by an ultraviolet irradiation apparatus using a UV irradiation unit (wavelength: 172 nm) manufactured by Ushio, Inc., to conduct the evaluation of the planarity of the substrate by the same procedures as in "Test for coating to stepped substrate" described above, using a scanning electron microscope (S-4800) manufactured by Hitachi High-Technologies Corporation (Table 27). It was confirmed that performing the thermal curing treatment only as in each of Examples 22, 26, and 31 gave a good (o) planarity; however, performing the thermal curing treatment at a relatively low temperature followed by the photocuring treatment to complete the curing gave a further improved (O) planarity.

[Table 27]

TABLE 27

| Evaluation of planarity | | |
|---|---|---|
| | | Planarity |
| Example 22 | 200° C. baking + 500 mJ/cm$^2$ | ◎ |
| Example 26 | 230° C. baking + 500 mJ/cm$^2$ | ◎ |
| Example 31 | 240° C. baking + 500 mJ/cm$^2$ | ◎ |
| Example 22 | 250° C. baking | ○ |
| Example 26 | 250° C. baking | ○ |
| Example 31 | 260° C. baking | ○ |

Even when completely the same composition is used, appropriately combining the thermal curing and photocuring therefor could improve the planarity.

INDUSTRIAL APPLICABILITY

According to the present invention, it is possible to provide a resist underlayer film-forming composition excellent in embeddability and planarity in a stepped substrate; a resist underlayer film that is formed by applying and baking the composition, is insoluble in a resist solvent, and has an excellent optical constant and a high etching rate; a method of manufacturing a patterned substrate using the same; and a method of manufacturing a semiconductor device.

The invention claimed is:

1. A resist underlayer film, which is a cured product of a coating film formed of a resist underlayer film-forming composition, wherein the resist underlayer film has a thickness of from 0.001 μm to 10 μm, and wherein the resist underlayer film-forming composition comprises a crosslinkable compound (A) represented by the following formula (3), a film material (B) capable of crosslinking reaction with the crosslinkable compound (A), an acid catalyst (C), and a solvent (D), $$T\text{-}V_i \qquad \text{Formula (3)}$$

wherein,

V is represented by (i)

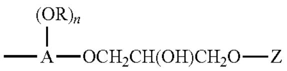 or (ii)

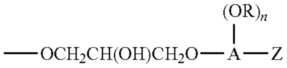

i is an integer of 2 to 6, each of i quantity of R is independently a hydrogen atom; or an alkyl group which may be interrupted by an oxygen atom, a nitrogen atom, or a carbonyl group;

each of i quantity of n is independently an integer of 1 to 8, each of i quantity of A is independently a $C_6$-$C_{18}$ aryl group which may be interrupted by an alkylene group, each of i quantity of Z is independently an alkyl group interrupted by an oxygen atom, a nitrogen atom, or a carbonyl group; or an aryl group which may be interrupted by an oxygen atom, a nitrogen atom, or a carbonyl group and may be substituted with a hydroxy group, a halogen atom, a carboxyl group, a nitro group, a cyano group, a methylenedioxy group, an acetoxy group, a methylthio group, an amino group, a $C_1$-$C_9$ alkoxy group, an alkyl group, an alkenyl group, or an alkynyl group; and T is a single bond; an i-valent saturated hydrocarbon group which may be interrupted by an aromatic ring; or an i-valent aromatic group which may be interrupted by an oxygen atom or an alkylene group and may be substituted with an alkyl group or an alkenyl group;

wherein the film material (B) is at least one member selected from the group consisting of the following polymers:

(a) a novolac resin represented by one or two or more repeating structural units represented by (1a), (1b), and (1c):

(1a)

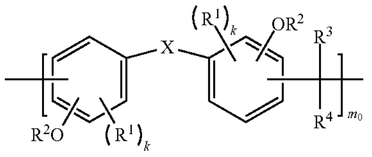

(1b)

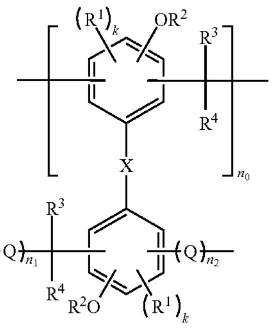

(1c)

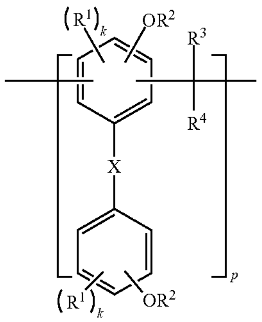

wherein two $R^1$s each independently represent an alkyl group having 1 to 10 carbon atoms, an alkenyl group having 2 to 6 carbon atoms, an aromatic hydrocarbon group, a halogen atom, a nitro group, or an amino group;

two $R^2$s each independently represent a hydrogen atom, an alkyl group having 1 to 10 carbon atoms, an alkenyl group having 2 to 6 carbon atoms, an acetal group, an acyl group, or a glycidyl group;

$R^3$ represents an aromatic hydrocarbon group which may have a substituent;

$R^4$ represents a hydrogen atom, a phenyl group, or a naphthyl group;

when $R^3$ and $R^4$ bonded to the same carbon atom each represent a phenyl group, $R^3$ and $R^4$ may be bonded to each other to form a fluorene ring; and in formula (1b), groups represented by two $R^3$s and atoms or groups represented by two $R^4$s may be different from each other;

two ks each independently represent 0 or 1;

$m_0$ represents an integer of 3 to 500;

each of $n_0$, $n_1$, and $n_2$ represents an integer of 2 to 500;

p represents an integer of 3 to 500;

X represents a single bond or a heteroatom; and two Qs each independently represent a structural unit represented by the following formula (2):

(2)

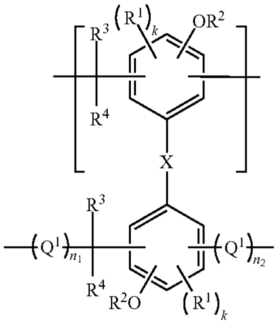

wherein two $R^1$s, two $R^2$s, two $R^3$s, two $R^4$s, two ks, $n_1$, $n_2$, and X are as defined in formula (1b); and two $Q^1$s each independently represent a structural unit represented by formula (2);

(b) a polymer having a unit structure represented by formula A:

Formula A

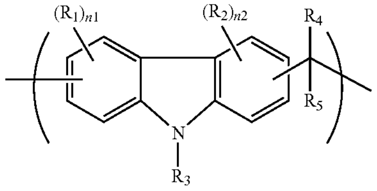

wherein each of $R_1$ and $R_2$ is selected from the group consisting of a hydrogen atom, a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_3$ is selected from the group consisting of a hydrogen atom, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_4$ represents an aryl group having 6 to 40 carbon atoms or a heterocyclic group which may be substituted with a halogen group, a nitro group, an amino group, or a hydroxy group, $R_5$ represents a hydrogen atom, or an alkyl group having 1 to 10 carbon atoms, an aryl group having 6 to 40 carbon atoms, or a heterocyclic group which may be substituted with a halogen group, a nitro group, an amino group, or a hydroxy group, $R_4$ and $R_5$ may be combined to form a ring together with a carbon atom to which they bond, and each of n1 and n2 is an integer of 1 to 3;

(c) a polymer having a unit structure composed of a reaction product of a fused heterocyclic compound and a bicyclic compound;

(d) a polymer having a unit structure represented by formula B:

Formula B

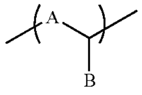

wherein A is a hydroxy group-substituted phenylene group derived from polyhydroxybenzene, and B is a monovalent fused aromatic hydrocarbon ring group in which 2 to 4 benzene rings are fused;

(e) a polymer having a unit structure represented by formula C:

Formula C

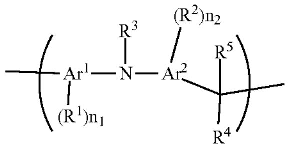

wherein each of $Ar^1$ and $Ar^2$ represents a benzene ring or a naphthalene ring; each of $R^1$ and $R^2$ is a substituent of a hydrogen atom on the benzene ring or the naphthalene ring and is selected from the group consisting of a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, in which each of the alkyl group, the alkenyl group, and the aryl group represents an organic group which may have an ether bond, a ketone bond, or an ester bond, $R^3$ is selected from the group consisting of a hydrogen atom, an alkyl group having 1 to 10 carbon atoms, an alkenyl group having 2 to 10 carbon atoms, an aryl group having 6 to 40 carbon atoms, and a combination thereof, in which each of the alkyl group, the alkenyl group, and the aryl group represents an organic group which may have an ether bond, a ketone bond, or an ester bond, $R^4$ is selected from the group consisting of an aryl group having 6 to 40 carbon atoms and a heterocyclic group, in which each of the aryl group and the heterocyclic group represents an organic group which may be substituted with a halogen group, a nitro group, an amino group, an alkyl group having 1 to 10 carbon atoms, an alkoxy group having 1 to 10 carbon atoms, an aryl group having 6 to 40 carbon atoms, a formyl group, a carboxyl group, or a hydroxyl group, $R^5$ is selected from the group consisting of a hydrogen atom, an alkyl group having 1 to 10 carbon atoms, an aryl group having 6 to 40 carbon atoms, and a heterocyclic group, in which each of the alkyl group, the aryl group, and the heterocyclic group represents an organic group which may be substituted with a halogen group, a nitro group, an amino group, or a hydroxyl group, $R^4$ and $R^5$ may be combined to form a ring together with a carbon atom to which they bond, and each of n1 and n2 is an integer of 0 to 3;

(f) a polymer having a unit structure represented by formula D:

Formula D

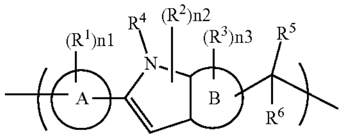

wherein $R^1$, $R^2$, and $R^3$ are substituents of hydrogen atoms of rings and are each independently a halogen group, a nitro group, an amino group, a hydroxyl group, an alkyl group having 1 to 10 carbon atoms, an alkenyl group having 2 to 10 carbon atoms, an aryl group having 6 to 40 carbon atoms, or a combination thereof which may have an ether bond, a ketone bond, or an ester bond;

$R^4$ is a hydrogen atom, an alkyl group having 1 to 10 carbon atoms, an alkenyl group having 2 to 10 carbon atoms, an aryl group having 6 to 40 carbon atoms, or a combination thereof which may have an ether bond, a ketone bond, or an ester bond;

$R^5$ is a hydrogen atom, or an aryl group having 6 to 40 carbon atoms or a heterocyclic group which may be substituted with a halogen group, a nitro group, an amino group, a formyl group, a carboxyl group, a carboxylic acid alkyl ester group, a phenyl group, an alkoxy group having 1 to 10 carbon atoms, or a hydroxyl group;

$R^6$ is a hydrogen atom, or an alkyl group having 1 to 10 carbon atoms, an aryl group having 6 to 40 carbon atoms, or a heterocyclic group which may be substituted with a halogen group, a nitro group, an amino group, a formyl group, a carboxyl group, a carboxylic acid alkyl ester group, or a hydroxyl group; and $R^5$ and $R^6$ may be combined to form a ring together with a carbon atom to which they bond;

each of the ring A and the ring B represents a benzene ring, a naphthalene ring, or an anthracene ring; and each of n1, n2, and n3 is an integer of 0 or more and up to a maximum number of substituents capable of being substituted for the ring;

(g) a polymer having a unit structure represented by formula E:

Formula E

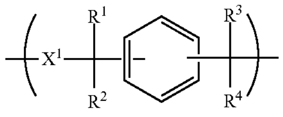

wherein $R^1$ to $R^4$ each independently represent a hydrogen atom or a methyl group; and $X^1$ represents a divalent organic group having at least one arylene group which may be substituted with an alkyl group, an amino group, or a hydroxyl group;

(h) a novolac resin having a unit structure represented by formula:

Formula F

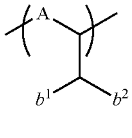

wherein A represents a divalent group derived from aniline, diphenylamine, phenylnaphthylamine, hydroxydiphenylamine, carbazole, phenol, N,N'-diphenylethylenediamine, N,N'-diphenyl-1,4-phenylenediamine, or a polynuclear phenol selected from the group consisting of dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 2,2'-biphenol, and 1,1,2,2-tetrakis(4-hydroxyphenyl) ethane;

$b^1$ represents an alkyl group having 1 to 16 carbon; and $b^2$ represents a hydrogen atom or an alkyl group having 1 to 9 carbon atoms; and (i) a polymer having a repeating structural unit represented by formulas G and/or H:

Formula G

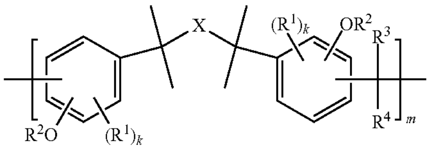

Formula H

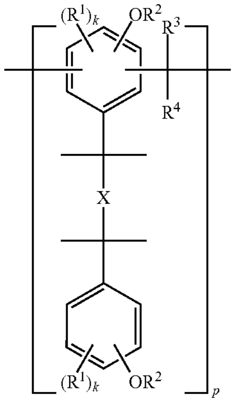

wherein two $R^1$s each independently represent an alkyl group having 1 to 10 carbon atoms, an alkenyl group having 2 to 6 carbon atoms, an aromatic hydrocarbon group, a halogen atom, a nitro group, or an amino group;

two $R^2$s each independently represent a hydrogen atom, an alkyl group having 1 to 10 carbon atoms, an alkenyl group having 2 to 6 carbon atoms, an acetal group, an acyl group, or a glycidyl group;

$R^3$ represents an aromatic hydrocarbon group or a heterocyclic group which may have a substituent;

when $R^3$ and $R^4$ bonded to the same carbon atom each represent a phenyl group, $R^3$ and $R^4$ may be bonded to each other to form a fluorene ring;

two ks each independently represent 0 or 1;

m represents an integer of 3 to 500;

p represents an integer of 3 to 500;

X represents a benzene ring; and two —$C(CH_3)_2$-groups bonded to the benzene ring have a meta-position or para-position relationship.

2. The resist underlayer film-forming composition according to claim 1, wherein each of A is independently a $C_6$ aryl group which may be interrupted by an alkylene group.

3. The resist underlayer film-forming composition according to claim 1, wherein Zs are each independently an aryl group which may be interrupted by an alkyl group, an oxygen atom, a nitrogen atom, or a carbonyl group and may be substituted with a hydroxy group, a halogen atom, a carboxyl group, a nitro group, a cyano group, a methylenedioxy group, an acetoxy group, a methylthio group, an amino group, a $C_1$-$C_9$ alkoxy group, an alkyl group, an alkenyl group, or an alkynyl group.

4. A method of manufacturing a patterned substrate, comprising:

applying and curing a resist underlayer film-forming composition on a semiconductor substrate to form a resist underlayer film, wherein the resist underlayer film has a thickness of from 0.001 μm to 10 μm;

applying and baking a resist on the resist underlayer film to form a resist film;

exposing the resist underlayer film and the semiconductor substrate coated with the resist; and developing the exposed resist film to perform patterning, wherein the resist underlayer film-forming composition comprises a crosslinkable compound (A) represented by the following formula (3), a film material (B) capable of crosslinking reaction with the crosslinkable compound (A), an acid catalyst (C), and a solvent (D), $$T\text{-}V_i \qquad \text{Formula (3)}$$

wherein,

V is represented by (i)

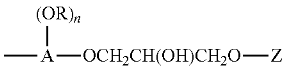

or (ii)

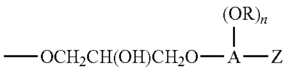

i is an integer of 2 to 6, each of i quantity of R is independently a hydrogen atom; or an alkyl group which may be interrupted by an oxygen atom, a nitrogen atom, or a carbonyl group;

each of i quantity of n is independently an integer of 1 to 8, each of i quantity of A is independently a $C_6$-$C_{18}$ aryl group which may be interrupted by an alkylene group, each of i quantity of Z is independently an alkyl group interrupted by an oxygen atom, a nitrogen atom, or a carbonyl group; or an aryl group which may be interrupted by an oxygen atom, a nitrogen atom, or a carbonyl group and may be substituted with a hydroxy group, a halogen atom, a carboxyl group, a nitro group, a cyano group, a methylenedioxy group, an acetoxy group, a methylthio group, an amino group, a $C_1$-$C_9$ alkoxy group, an alkyl group, an alkenyl group, or an alkynyl group; and T is a single bond; an i-valent saturated hydrocarbon group which may be interrupted by an aromatic ring; or an i-valent aromatic group which may be interrupted by an oxygen atom or an alkylene group and may be substituted with an alkyl group or an alkenyl group;

wherein the film material (B) is at least one member selected from the group consisting of the following polymers:

(a) a novolac resin represented by one or two or more repeating structural units represented by (1a), (1b), and (1c):

(1a)

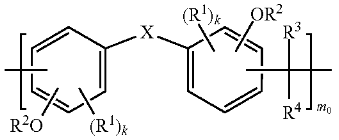

(1b)

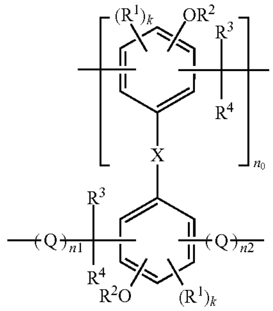

(1c)

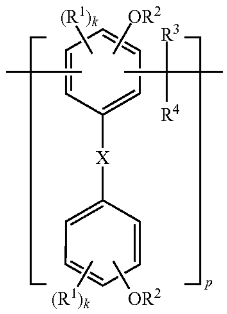

wherein two $R^1$s each independently represent an alkyl group having 1 to 10 carbon atoms, an alkenyl group having 2 to 6 carbon atoms, an aromatic hydrocarbon group, a halogen atom, a nitro group, or an amino group;

two $R^2$s each independently represent a hydrogen atom, an alkyl group having 1 to 10 carbon atoms, an alkenyl group having 2 to 6 carbon atoms, an acetal group, an acyl group, or a glycidyl group;

$R^3$ represents an aromatic hydrocarbon group which may have a substituent;

$R^4$ represents a hydrogen atom, a phenyl group, or a naphthyl group;

when $R^3$ and $R^4$ bonded to the same carbon atom each represent a phenyl group, $R^3$ and $R^4$ may be bonded to each other to form a fluorene ring; and in formula (1b), groups represented by two $R^3$s and atoms or groups represented by two $R^4$s may be different from each other;

two ks each independently represent 0 or 1;

$m_0$ represents an integer of 3 to 500;

each of $n_0$, $n_1$, and $n_2$ represents an integer of 2 to 500;

p represents an integer of 3 to 500;

X represents a single bond or a heteroatom; and two Qs each independently represent a structural unit represented by the following formula (2):

(2)

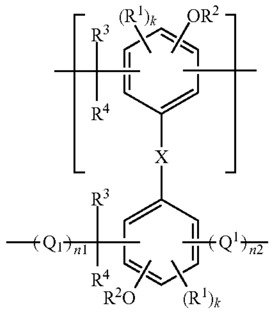

wherein two $R^1$s, two $R^2$s, two $R^3$s, two $R^4$s, two ks, $n_1$, $n_2$, and X are as defined in formula (1b); and two $Q^1$s each independently represent a structural unit represented by formula (2);

(b) a polymer having a unit structure represented by formula A:

Formula A

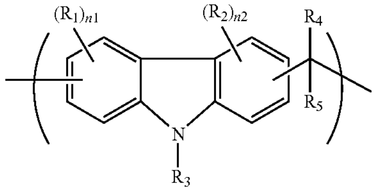

wherein each of $R_1$ and $R_2$ is selected from the group consisting of a hydrogen atom, a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_3$ is selected from the group consisting of a hydrogen atom, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_4$ represents an aryl group having 6 to 40 carbon atoms or a heterocyclic group which may be substituted with a halogen group, a nitro group, an amino group, or a hydroxy group, $R_5$ represents a hydrogen atom, or an alkyl group having 1 to 10 carbon atoms, an aryl group having 6 to 40 carbon atoms, or a heterocyclic group which may be substituted with a halogen group, a nitro group, an amino group, or a hydroxy group, $R_4$ and $R_5$ may be combined to form a ring together with a carbon atom to which they bond, and each of n1 and n2 is an integer of 1 to 3;

(c) a polymer having a unit structure composed of a reaction product of a fused heterocyclic compound and a bicyclic compound;

(d) a polymer having a unit structure represented by formula B:

Formula B

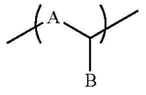

wherein A is a hydroxy group-substituted phenylene group derived from polyhydroxybenzene, and B is a monovalent fused aromatic hydrocarbon ring group in which 2 to 4 benzene rings are fused;

(e) a polymer having a unit structure represented by formula C:

Formula C

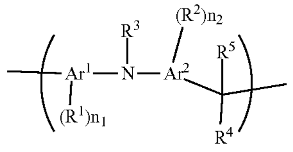

wherein each of $Ar^1$ and $Ar^2$ represents a benzene ring or a naphthalene ring; each of $R^1$ and $R^2$ is a substituent of a hydrogen atom on the benzene ring or the naphthalene ring and is selected from the group consisting of a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, in which each of the alkyl group, the alkenyl group, and the aryl group represents an organic group which may have an ether bond, a ketone bond, or an ester bond, $R^3$ is selected from the group consisting of a hydrogen atom, an alkyl group having 1 to 10 carbon atoms, an alkenyl group having 2 to 10 carbon atoms, an aryl group having 6 to 40 carbon atoms, and a combination thereof, in which each of the alkyl group, the alkenyl group, and the aryl group represents an organic group which may have an ether bond, a ketone bond, or an ester bond, $R^4$ is selected from the group consisting of an aryl group having 6 to 40 carbon atoms and a heterocyclic group, in which each of the aryl group and the heterocyclic group represents an organic group which may be substituted with a halogen group, a nitro group, an amino group, an alkyl group having 1 to 10 carbon atoms, an alkoxy group having 1 to 10 carbon atoms, an aryl group having 6 to 40 carbon atoms, a formyl group, a carboxyl group, or a hydroxyl group, $R^5$ is selected from the group consisting of a hydrogen atom, an alkyl group having 1 to 10 carbon atoms, an aryl group having 6 to 40 carbon atoms, and a heterocyclic group, in which each of the alkyl group, the aryl group, and the heterocyclic group represents an organic group which may be substituted with a halogen group, a nitro group, an amino group, or a hydroxyl group, $R^4$ and $R^5$ may be combined to form a ring together with a carbon atom to which they bond, and each of n1 and n2 is an integer of 0 to 3;

(f) a polymer having a unit structure represented by formula D:

Formula D

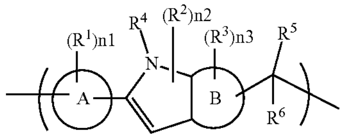

wherein $R^1$, $R^2$, and $R^3$ are substituents of hydrogen atoms of rings and are each independently a halogen group, a nitro group, an amino group, a hydroxyl group, an alkyl group having 1 to 10 carbon atoms, an alkenyl group having 2 to 10 carbon atoms, an aryl group having 6 to 40 carbon atoms, or a combination thereof which may have an ether bond, a ketone bond, or an ester bond;

$R^4$ is a hydrogen atom, an alkyl group having 1 to 10 carbon atoms, an alkenyl group having 2 to 10 carbon atoms, an aryl group having 6 to 40 carbon atoms, or a combination thereof which may have an ether bond, a ketone bond, or an ester bond;

$R^5$ is a hydrogen atom, or an aryl group having 6 to 40 carbon atoms or a heterocyclic group which may be substituted with a halogen group, a nitro group, an amino group, a formyl group, a carboxyl group, a carboxylic acid alkyl ester group, a phenyl group, an alkoxy group having 1 to 10 carbon atoms, or a hydroxyl group;

$R^6$ is a hydrogen atom, or an alkyl group having 1 to 10 carbon atoms, an aryl group having 6 to 40 carbon atoms, or a heterocyclic group which may be substituted with a halogen group, a nitro group, an amino group, a formyl group, a carboxyl group, a carboxylic acid alkyl ester group, or a hydroxyl group; and $R^5$ and $R^6$ may be combined to form a ring together with a carbon atom to which they bond;

each of the ring A and the ring B represents a benzene ring, a naphthalene ring, or an anthracene ring; and each of n1, n2, and n3 is an integer of 0 or more and up to a maximum number of substituents capable of being substituted for the ring;

(g) a polymer having a unit structure represented by formula E:

Formula E

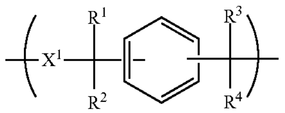

wherein $R^1$ to $R^4$ each independently represent a hydrogen atom or a methyl group; and $X^1$ represents a divalent organic group having at least one arylene group which may be substituted with an alkyl group, an amino group, or a hydroxyl group;

(h) a novolac resin having a unit structure represented by formula:

Formula F

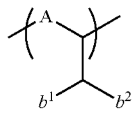

wherein A represents a divalent group derived from aniline, diphenylamine, phenylnaphthylamine, hydroxydiphenylamine, carbazole, phenol, N,N'-diphenylethylenediamine, N,N'-diphenyl-1,4-phenylenediamine, or a polynuclear phenol selected from the group consisting of dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 2,2'-biphenol, and 1,1,2,2-tetrakis(4-hydroxyphenyl) ethane;

$b^1$ represents an alkyl group having 1 to 16 carbon; and $b^2$ represents a hydrogen atom or an alkyl group having 1 to 9 carbon atoms; and (i) a polymer having a repeating structural unit represented by formulas G and/or H:

Formula G

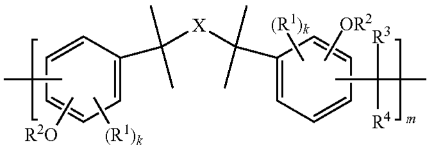

Formula H

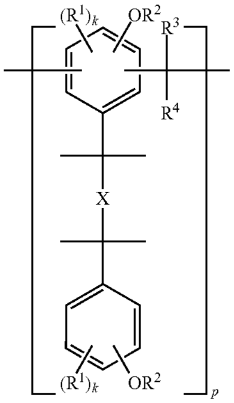

wherein two $R^1$s each independently represent an alkyl group having 1 to 10 carbon atoms, an alkenyl group having 2 to 6 carbon atoms, an aromatic hydrocarbon group, a halogen atom, a nitro group, or an amino group;

two $R^2$s each independently represent a hydrogen atom, an alkyl group having 1 to 10 carbon atoms, an alkenyl group having 2 to 6 carbon atoms, an acetal group, an acyl group, or a glycidyl group;

$R^3$ represents an aromatic hydrocarbon group or a heterocyclic group which may have a substituent;

$R^4$ represents a hydrogen atom, a phenyl group, or a naphthyl group;

when $R^3$ and $R^4$ bonded to the same carbon atom each represent a phenyl group, $R^3$ and $R^4$ may be bonded to each other to form a fluorene ring;

two ks each independently represent 0 or 1;

m represents an integer of 3 to 500;

p represents an integer of 3 to 500;

X represents a benzene ring; and two —$C(CH_3)_2$-groups bonded to the benzene ring have a meta-position or para-position relationship.

5. The method of manufacturing a patterned substrate according to claim 4, wherein the curing is performed by baking.

6. The method of manufacturing a patterned substrate according to claim 4, wherein the curing is performed by baking followed by irradiation with ultraviolet rays.

7. A method of manufacturing a semiconductor device, comprising:

forming a resist underlayer film using a resist underlayer film-forming composition on a semiconductor substrate, wherein the resist underlayer film has a thickness of from 0.001 μm to 10 μm;

forming a resist film on the resist underlayer film;

forming a resist pattern by irradiation with light or an electron beam and development;

etching the underlayer film through the resist pattern; and processing the semiconductor substrate using the patterned underlayer film, wherein the resist underlayer film-forming composition comprises a crosslinkable compound (A) represented by the following formula (3), a film material (B) capable of crosslinking reaction with the crosslinkable compound (A), an acid catalyst (C), and a solvent (D), $T\text{-}V_i$ Formula (3)

wherein,

V is represented by (i)

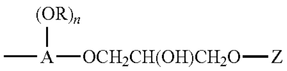

or (ii)

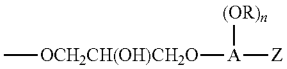

i is an integer of 2 to 6, each of i quantity of R is independently a hydrogen atom; or an alkyl group which may be interrupted by an oxygen atom, a nitrogen atom, or a carbonyl group;

each of i quantity of n is independently an integer of 1 to 8, each of i quantity of A is independently a $C_6$-$C_{18}$ aryl group which may be interrupted by an alkylene group, each of i quantity of Z is independently an alkyl group interrupted by an oxygen atom, a nitrogen atom, or a carbonyl group; or an aryl group which may be interrupted by an oxygen atom, a nitrogen atom, or a carbonyl group and may be substituted with a hydroxy group, a halogen atom, a carboxyl group, a nitro group, a cyano group, a methylenedioxy group, an acetoxy group, a methylthio group, an amino group, a $C_1$-$C_9$ alkoxy group, an alkyl group, an alkenyl group, or an alkynyl group; and T is a single bond; an i-valent saturated hydrocarbon group which may be interrupted by an aromatic ring; or an i-valent aromatic group which may be interrupted by an oxygen atom or an alkylene group and may be substituted with an alkyl group or an alkenyl group;

wherein the film material (B) is at least one member selected from the group consisting of the following polymers:

(a) a novolac resin represented by one or two or more repeating structural units represented by (1a), (1b), and (1c);

(1a)

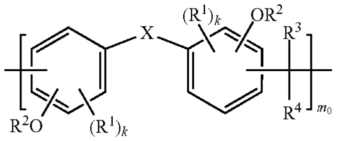

(1b)

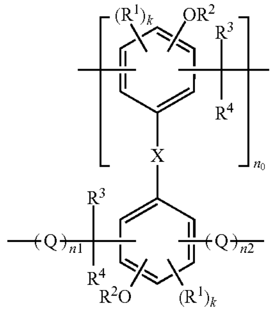

(1c)

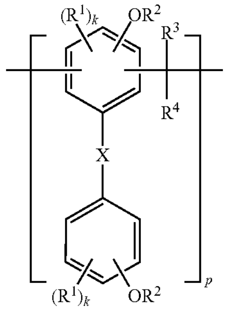

wherein two $R^1$s each independently represent an alkyl group having 1 to 10 carbon atoms, an alkenyl group having 2 to 6 carbon atoms, an aromatic hydrocarbon group, a halogen atom, a nitro group, or an amino group;

two $R^2$s each independently represent a hydrogen atom, an alkyl group having 1 to 10 carbon atoms, an alkenyl group having 2 to 6 carbon atoms, an acetal group, an acyl group, or a glycidyl group;

$R^3$ represents an aromatic hydrocarbon group which may have a substituent;

$R^4$ represents a hydrogen atom, a phenyl group, or a naphthyl group;

when $R^3$ and $R^4$ bonded to the same carbon atom each represent a phenyl group, $R^3$ and $R^4$ may be bonded to each other to form a fluorene ring; and in formula (1b), groups represented by two $R^3$s and atoms or groups represented by two $R^4$s may be different from each other;

two ks each independently represent 0 or 1;

$m_0$ represents an integer of 3 to 500;

each of $n_0$, $n_1$, and $n_2$ represents an integer of 2 to 500;

p represents an integer of 3 to 500;

X represents a single bond or a heteroatom; and two Qs each independently represent a structural unit represented by the following formula (2):

(2)

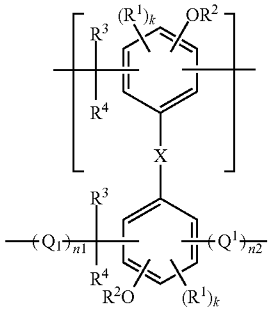

wherein two $R^1$s, two $R^2$s, two $R^3$s, two $R^4$s, two ks, $n_1$, $n_2$, and X are as defined in formula (1b); and two $Q^1$s each independently represent a structural unit represented by formula (2);

(b) a polymer having a unit structure represented by formula A:

Formula A

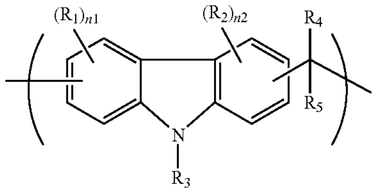

wherein each of $R_1$ and $R_2$ is selected from the group consisting of a hydrogen atom, a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_3$ is selected from the group consisting of a hydrogen atom, an alkyl group having 1 to 10 carbon atoms, an alkenyl group having 2 to 10 carbon atoms, an aryl group having 6 to 40 carbon atoms, and a combination thereof, in which the alkyl group, the alkenyl group, or the aryl group represents a group which may have an ether bond, a ketone bond, or an ester bond, $R_4$ represents an aryl group having 6 to 40 carbon atoms or a heterocyclic group which may be substituted with a halogen group, a nitro group, an amino group, or a hydroxy group, $R_5$ represents a hydrogen atom, or an alkyl group having 1 to 10 carbon atoms, an aryl group having 6 to 40 carbon atoms, or a heterocyclic group which may be substituted with a halogen group, a nitro group, an amino group, or a hydroxy group, $R_4$ and $R_5$ may be combined to form a ring together with a carbon atom to which they bond, and each of n1 and n2 is an integer of 1 to 3;

(c) a polymer having a unit structure composed of a reaction product of a fused heterocyclic compound and a bicyclic compound;

(d) a polymer having a unit structure represented by formula B:

Formula B

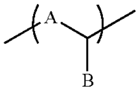

wherein A is a hydroxy group-substituted phenylene group derived from polyhydroxybenzene, and B is a monovalent fused aromatic hydrocarbon ring group in which 2 to 4 benzene rings are fused;

(e) a polymer having a unit structure represented by formula C:

Formula C

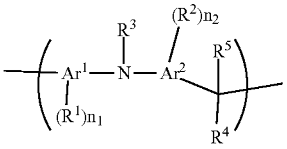

wherein each of $Ar^1$ and $Ar^2$ represents a benzene ring or a naphthalene ring; each of $R^1$ and $R^2$ is a substituent of a hydrogen atom on the benzene ring or the naphthalene ring and is selected from the group consisting of a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, in which each of the alkyl group, the alkenyl group, and the aryl group represents an organic group which may have an ether bond, a ketone bond, or an ester bond, $R^3$ is selected from the group consisting of a hydrogen atom, an alkyl group having 1 to 10 carbon atoms, an alkenyl group having 2 to 10 carbon atoms, an aryl group having 6 to 40 carbon atoms, and a combination thereof, in which each of the alkyl group, the alkenyl group, and the aryl group represents an organic group which may have an ether bond, a ketone bond, or an ester bond, $R^4$ is selected from the group consisting of an aryl group having 6 to 40 carbon atoms and a heterocyclic group, in which each of the aryl group and the heterocyclic group represents an organic group which may be substituted with a halogen group, a nitro group, an amino group, an alkyl group having 1 to 10 carbon atoms, an alkoxy group having 1 to 10 carbon atoms, an aryl group having 6 to 40 carbon atoms, a formyl group, a carboxyl group, or a hydroxyl group, $R^5$ is selected from the group consisting of a hydrogen atom, an alkyl group having 1 to 10 carbon atoms, an aryl group having 6 to 40 carbon atoms, and a heterocyclic group, in which each of the alkyl group, the aryl group, and the heterocyclic group represents an organic group which may be substituted with a halogen group, a nitro group, an amino group, or a hydroxyl group, $R^4$ and $R^5$ may be combined to form a ring together with a carbon atom to which they bond, and each of n1 and n2 is an integer of 0 to 3;

(f) a polymer having a unit structure represented by formula D:

Formula D

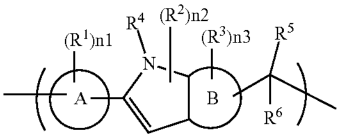

wherein $R^1$, $R^2$, and $R^3$ are substituents of hydrogen atoms of rings and are each independently a halogen group, a nitro group, an amino group, a hydroxyl group, an alkyl group having 1 to 10 carbon atoms, an alkenyl group having 2 to 10 carbon atoms, an aryl group having 6 to 40 carbon atoms, or a combination thereof which may have an ether bond, a ketone bond, or an ester bond;

$R^4$ is a hydrogen atom, an alkyl group having 1 to 10 carbon atoms, an alkenyl group having 2 to 10 carbon atoms, an aryl group having 6 to 40 carbon atoms, or a combination thereof which may have an ether bond, a ketone bond, or an ester bond;

$R^5$ is a hydrogen atom, or an aryl group having 6 to 40 carbon atoms or a heterocyclic group which may be substituted with a halogen group, a nitro group, an amino group, a formyl group, a carboxyl group, a carboxylic acid alkyl ester group, a phenyl group, an alkoxy group having 1 to 10 carbon atoms, or a hydroxyl group;

$R^6$ is a hydrogen atom, or an alkyl group having 1 to 10 carbon atoms, an aryl group having 6 to 40 carbon atoms, or a heterocyclic group which may be substituted with a halogen group, a nitro group, an amino group, a formyl group, a carboxyl group, a carboxylic acid alkyl ester group, or a hydroxyl group; and $R^5$ and $R^6$ may be combined to form a ring together with a carbon atom to which they bond;

each of the ring A and the ring B represents a benzene ring, a naphthalene ring, or an anthracene ring; and each of n1, n2, and n3 is an integer of 0 or more and up to a maximum number of substituents capable of being substituted for the ring;

(g) a polymer having a unit structure represented by formula E:

Formula E

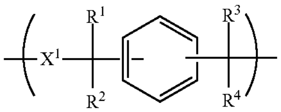

wherein $R^1$ to $R^4$ each independently represent a hydrogen atom or a methyl group; and $X^1$ represents a divalent organic group having at least one arylene group which may be substituted with an alkyl group, an amino group, or a hydroxyl group;

(h) a novolac resin having a unit structure represented by formula:

Formula F

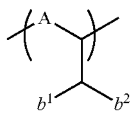

wherein A represents a divalent group derived from aniline, diphenylamine, phenylnaphthylamine, hydroxydiphenylamine, carbazole, phenol, N,N'-diphenylethylenediamine, N,N'-diphenyl-1,4-phenylenediamine, or a polynuclear phenol selected from the group consisting of dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 2,2'-biphenol, and 1,1,2,2-tetrakis(4-hydroxyphenyl) ethane;

$b^1$ represents an alkyl group having 1 to 16 carbon; and $b^2$ represents a hydrogen atom or an alkyl group having 1 to 9 carbon atoms; and (i) a polymer having a repeating structural unit represented by formulas G and/or H:

Formula G

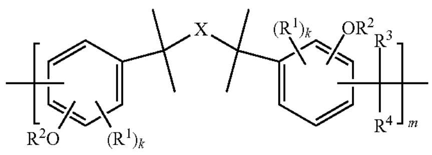

-continued

Formula H

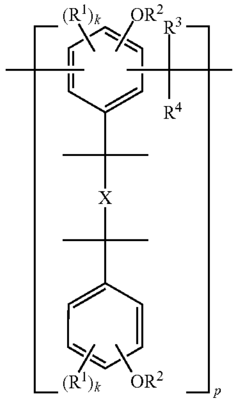

wherein two $R^1$s each independently represent an alkyl group having 1 to 10 carbon atoms, an alkenyl group having 2 to 6 carbon atoms, an aromatic hydrocarbon group, a halogen atom, a nitro group, or an amino group;

two $R^2$s each independently represent a hydrogen atom, an alkyl group having 1 to 10 carbon atoms, an alkenyl group having 2 to 6 carbon atoms, an acetal group, an acyl group, or a glycidyl group;

$R^3$ represents an aromatic hydrocarbon group or a heterocyclic group which may have a substituent;

$R^4$ represents a hydrogen atom, a phenyl group, or a naphthyl group;

when $R^3$ and $R^4$ bonded to the same carbon atom each represent a phenyl group, $R^3$ and $R^4$ may be bonded to each other to form a fluorene ring;

two ks each independently represent 0 or 1;

m represents an integer of 3 to 500;

p represents an integer of 3 to 500;

X represents a benzene ring; and two $-C(CH_3)_2$-groups bonded to the benzene ring have a meta-position or para-position relationship.

8. A compound selected from the group consisting of the following formulas (1-21) to (1-25):

Formula (1-21)

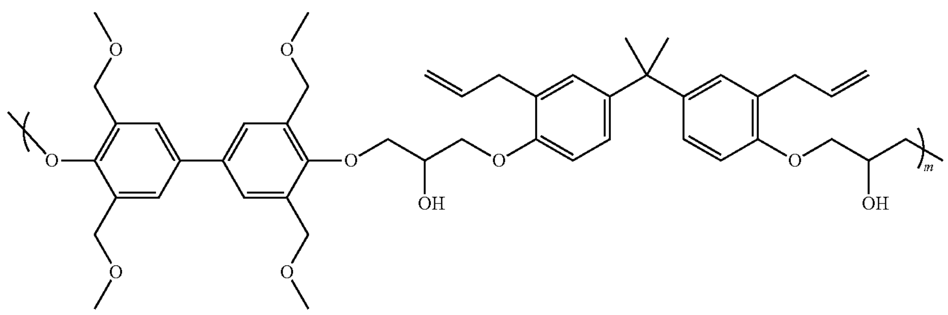

-continued
Formula (1-22)
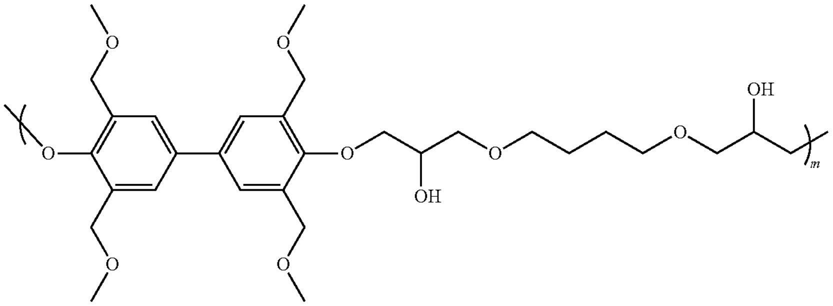
Formula (1-23)
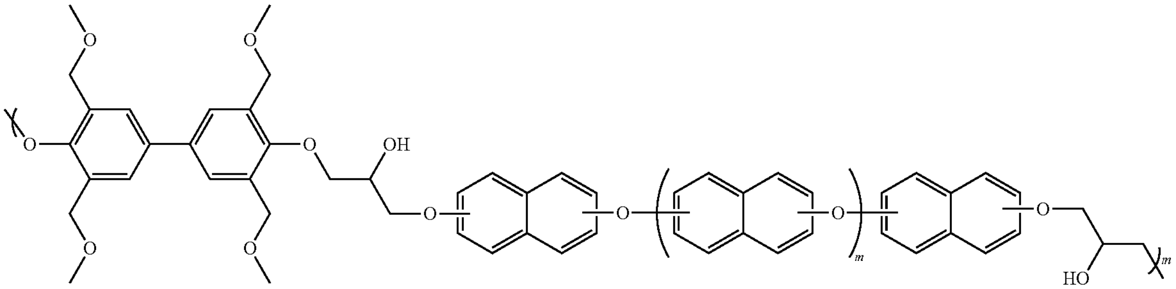
Formula (1-24)
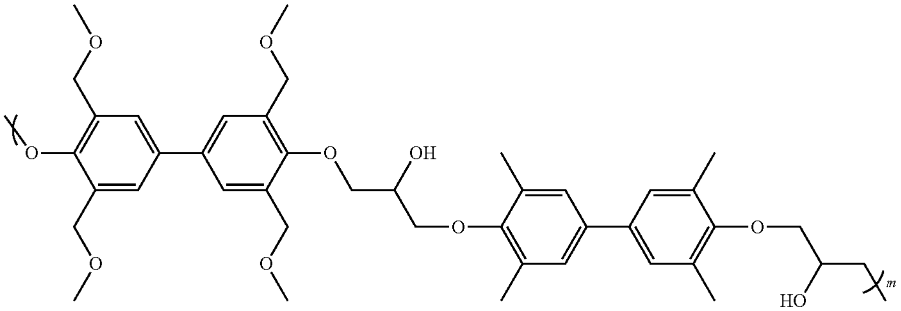
and
Formula (1-25)
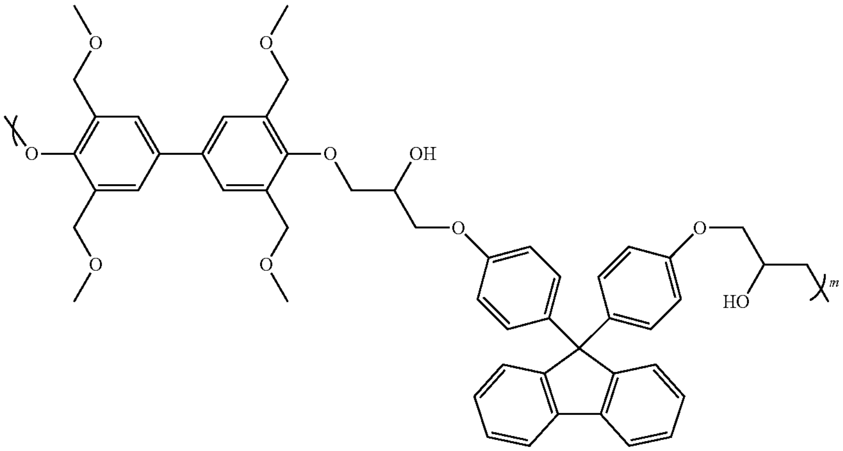

wherein each of m is independently an integer of 1 to 20, and each of r is independently an integer of 0 to 5.
9. A compound selected from the group consisting of the following formulas (1-1)-(1-7):
Formula (1-1)
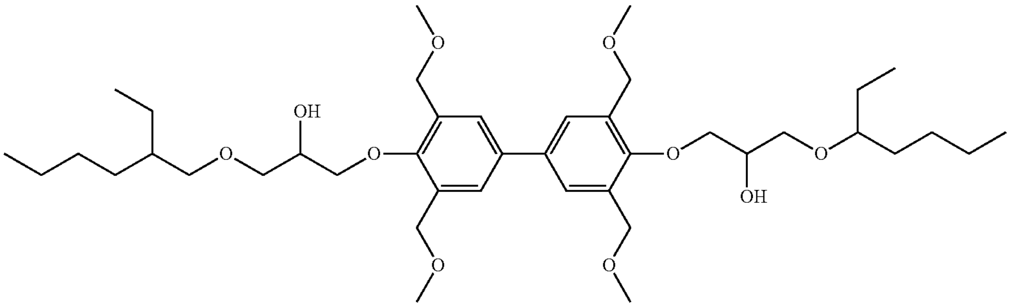
Formula (1-2)
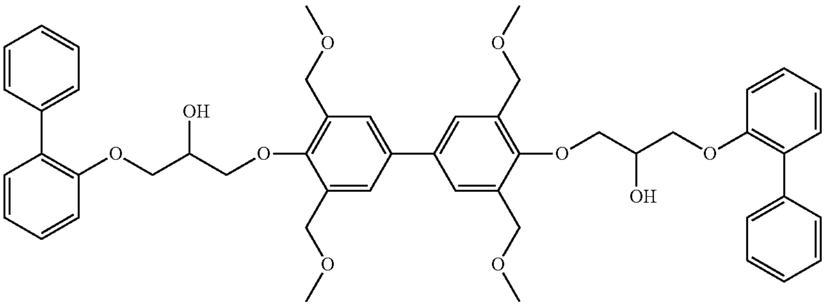
Formula (1-3)
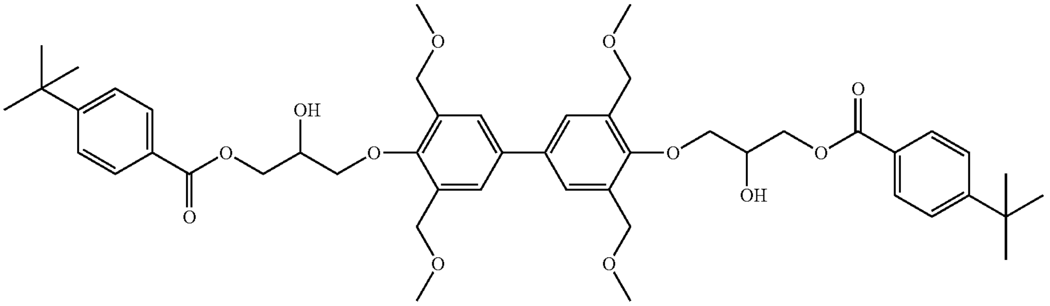
Formula (1-4)
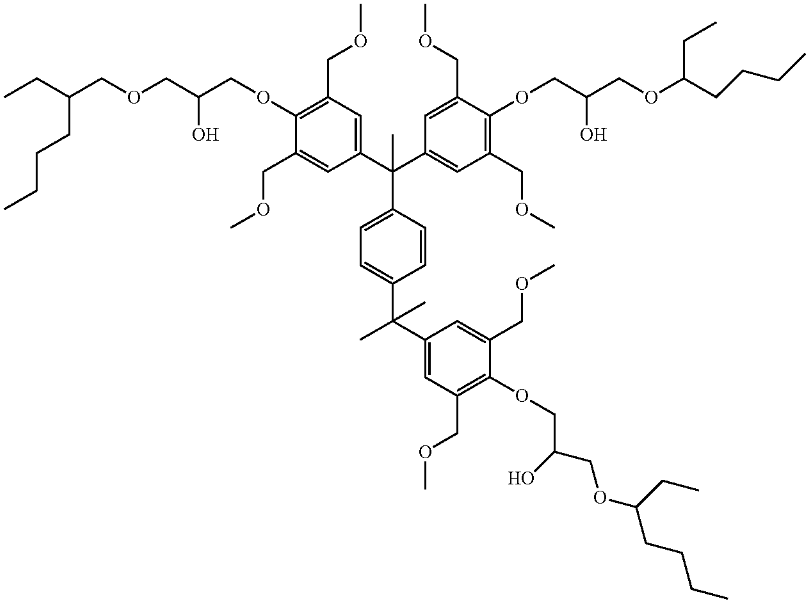

-continued
Formula (1-5)
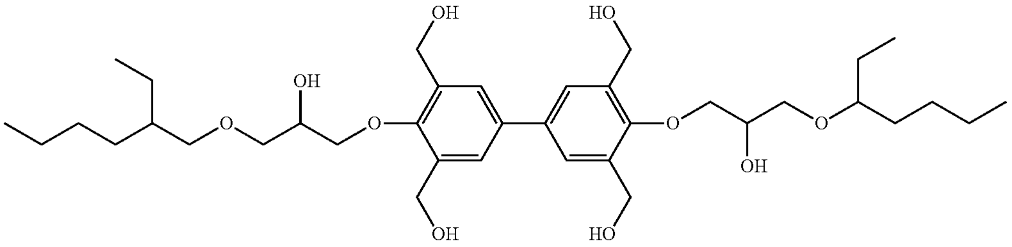
Formula (1-6)
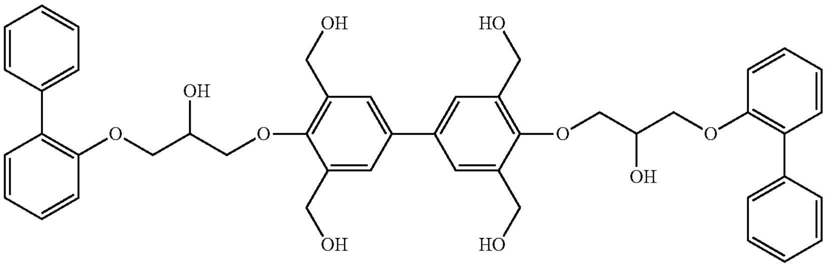
and
Formula (1-7)
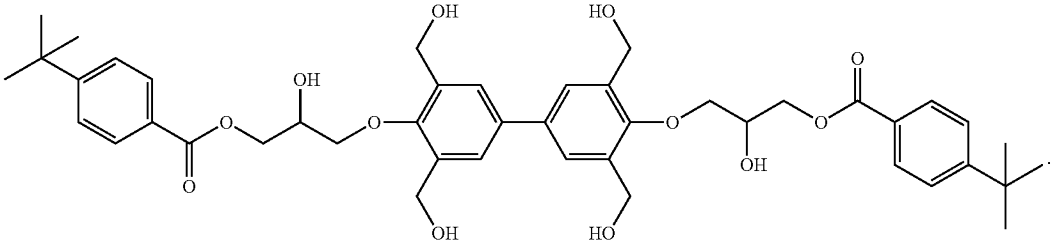
.
10. A compound selected from the group consisting of the following formulas (1-8)-(1-11) and (1-13):
Formula (1-8)
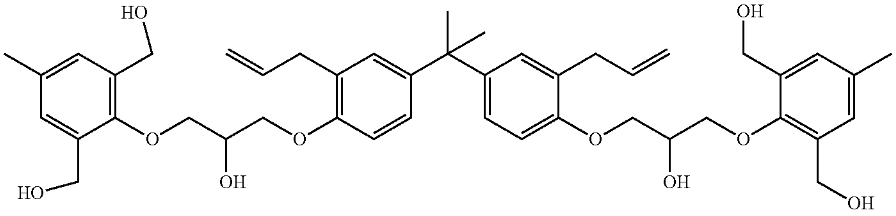
Formula (1-9)
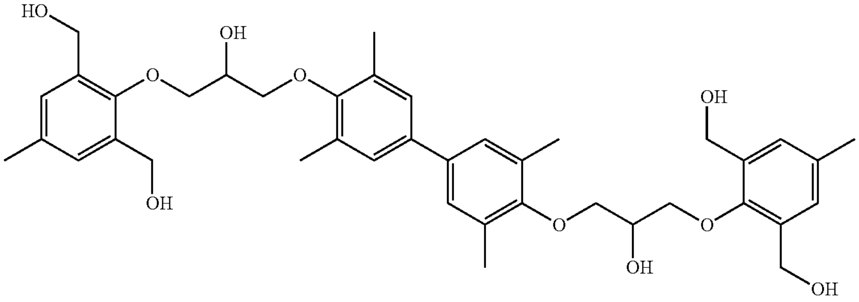

-continued
Formula (1-10)
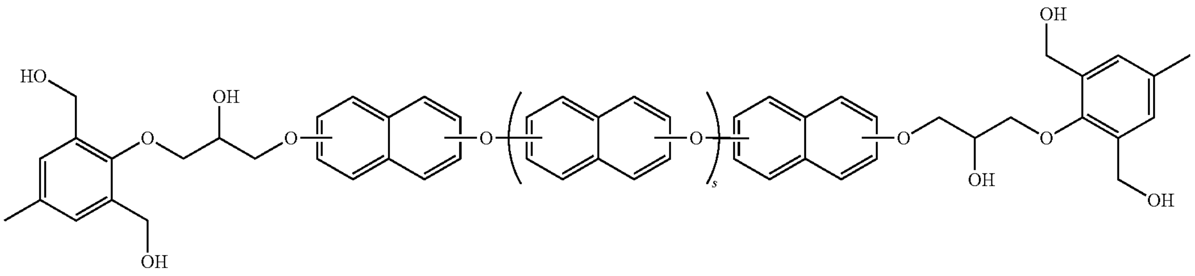
wherein, s represents an integer of 0 to 3,
Formula (1-11)
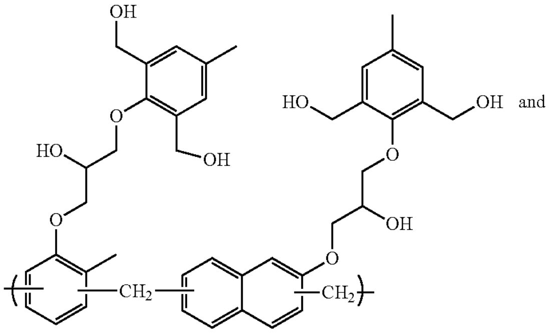
and
-continued
Formula (1-13)
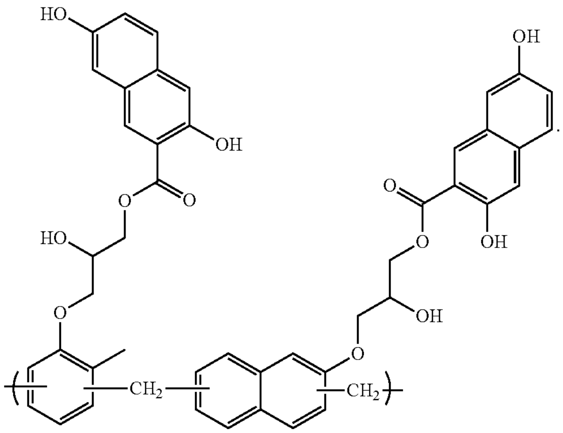
.
* * * * *